United States Patent
Masuoka et al.

(10) Patent No.: US 9,589,973 B2
(45) Date of Patent: Mar. 7, 2017

(54) PILLAR-SHAPED SEMICONDUCTOR MEMORY DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/221,215

(22) Filed: Jul. 27, 2016

(65) Prior Publication Data

US 2016/0336330 A1    Nov. 17, 2016

Related U.S. Application Data

(63) Continuation of application No. PCT/JP2014/065358, filed on Jun. 10, 2014.

(51) Int. Cl.
*H01L 27/115* (2006.01)
*H01L 27/112* (2006.01)
(Continued)

(52) U.S. Cl.
CPC ............ *H01L 27/115* (2013.01); *G11C 16/14* (2013.01); *H01L 23/535* (2013.01);
(Continued)

(58) Field of Classification Search
CPC ...................... H01L 27/11524; H01L 27/1157
(Continued)

(56) References Cited

U.S. PATENT DOCUMENTS 8,189,371 B2    5/2012  Katsumata et al.
9,450,023 B1*   9/2016  Konevecki .......... H01L 27/2454
(Continued)

FOREIGN PATENT DOCUMENTS

JP    02-188966 A    7/1990
JP    04-79369 A     3/1992
(Continued)

OTHER PUBLICATIONS

Stewart, A. et al., "Microtopography of Surface Eroded by Ion-Bombardment", *Journal of Material Science*, vol. 4, 1969, pp. 56-69.

(Continued)

*Primary Examiner* — George Fourson, III
(74) *Attorney, Agent, or Firm* — Brinks Gilson & Lione

(57) ABSTRACT

A pillar-shaped semiconductor memory device includes a silicon pillar, and a tunnel insulating layer, a data charge storage insulating layer, a first interlayer insulating layer, and a first conductor layer, which surround an outer periphery of the silicon pillar in that order, and a second interlayer insulating layer that is in contact with an upper surface or a lower surface of the first conductor layer. A side surface of the second interlayer insulating layer facing a side surface of the first interlayer insulating layer is separated from the side surface of the first interlayer insulating layer with a distance therebetween, the distance being larger than a distance from the side surface of the first interlayer insulating layer to a side surface of the first conductor layer facing the side surface of the first interlayer insulating layer.

18 Claims, 30 Drawing Sheets

(51) Int. Cl.
*H01L 23/535* (2006.01)
*G11C 16/14* (2006.01)

(52) U.S. Cl.
CPC ..... *H01L 27/11293* (2013.01); *H01L 27/1157* (2013.01); *H01L 27/11524* (2013.01)

(58) Field of Classification Search
USPC .......................................... 257/321; 438/264
See application file for complete search history.

(56) References Cited

U.S. PATENT DOCUMENTS

| | | |
|---|---|---|
| 2007/0252201 A1 | 11/2007 | Kito et al. |
| 2008/0099819 A1 | 5/2008 | Kito et al. |
| 2009/0230450 A1 | 9/2009 | Shiino et al. |
| 2011/0018051 A1 | 1/2011 | Kim et al. |
| 2011/0287612 A1* | 11/2011 | Lee ................... H01L 27/11578 438/478 |
| 2012/0068242 A1* | 3/2012 | Shin .................. H01L 27/11582 257/315 |
| 2012/0156848 A1* | 6/2012 | Yang ................. H01L 27/11529 438/287 |
| 2012/0211820 A1 | 8/2012 | Komori et al. |
| 2012/0267702 A1* | 10/2012 | Jee .................... H01L 27/11582 257/324 |
| 2014/0063938 A1* | 3/2014 | Oh .................... H01L 27/11524 365/185.02 |
| 2014/0203344 A1* | 7/2014 | Hopkins ........... H01L 29/42324 257/316 |
| 2014/0367762 A1* | 12/2014 | Tian .................. H01L 29/66825 257/321 |
| 2015/0054058 A1* | 2/2015 | Seol ................. H01L 29/42332 257/324 |
| 2015/0155297 A1* | 6/2015 | Eom ................. H01L 27/11582 438/268 |
| 2015/0214239 A1* | 7/2015 | Rhie ................. H01L 27/11556 257/321 |
| 2015/0294724 A1* | 10/2015 | Nam ...................... G11C 16/10 365/185.11 |
| 2016/0099250 A1* | 4/2016 | Rabkin ............. H01L 27/11582 257/66 |
| 2016/0133638 A1* | 5/2016 | Simsek-Ege ...... H01L 27/11524 257/314 |
| 2016/0163725 A1* | 6/2016 | Kamiya ............. H01L 21/0206 257/321 |
| 2016/0204117 A1* | 7/2016 | Liu ................... H01L 29/66825 257/324 |
| 2016/0204122 A1* | 7/2016 | Shoji ................ H01L 27/11582 257/324 |
| 2016/0268270 A1* | 9/2016 | Masuoka ............. H01L 29/792 |

FOREIGN PATENT DOCUMENTS

| | | |
|---|---|---|
| JP | 2008-103429 A | 5/2008 |
| JP | 2009-224574 A | 10/2009 |
| JP | 2011-29586 A | 2/2011 |
| JP | 2011-165815 A | 8/2011 |
| JP | 2011-249803 A | 12/2011 |
| JP | 2012-174887 A | 9/2012 |

OTHER PUBLICATIONS

Ting, C. et al., "Study of Planarized Sputter-Deposited SiO2", *J. Vac. Sci. Technol.*, vol. 15, No. 3, May/Jun. 1978, pp. 1105-1112.
International Search Report in corresponding International Application No. PCT/JP2014/065358, dated Aug. 12, 2014, 5 pages.
International Preliminary Report on Patentability in corresponding International Application No. PCT/JP2014/065358 dated Dec. 15, 2016, 6 pages.

* cited by examiner

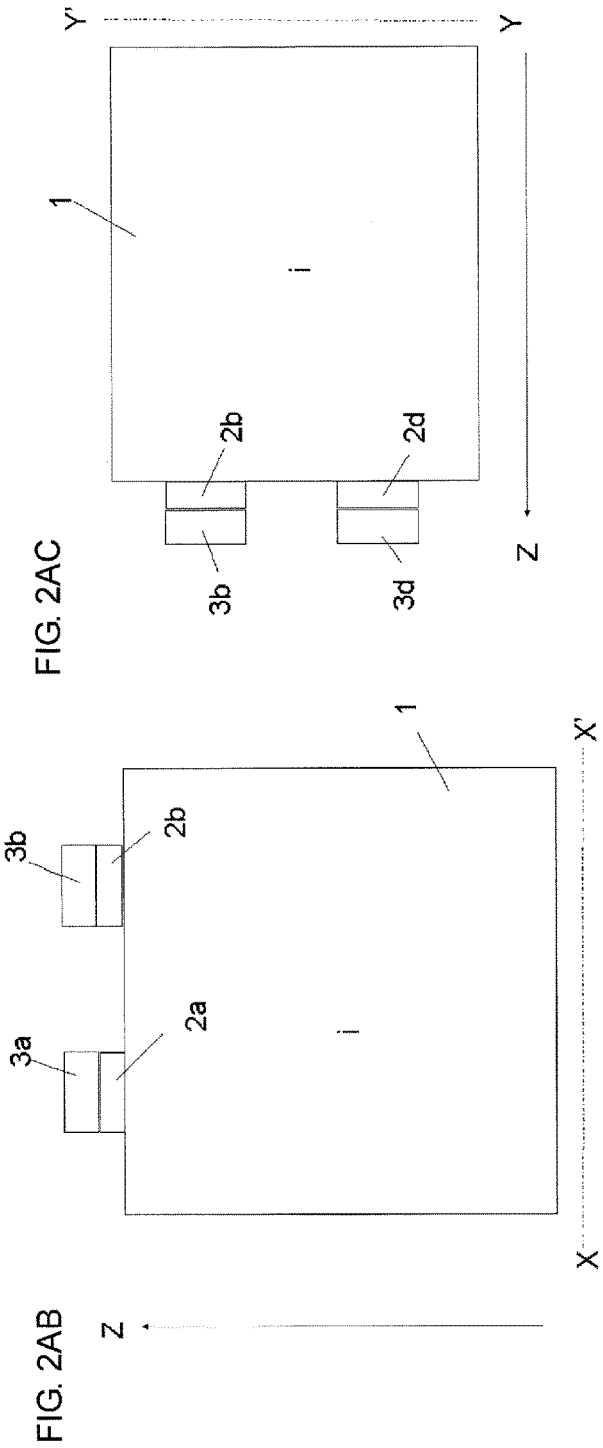
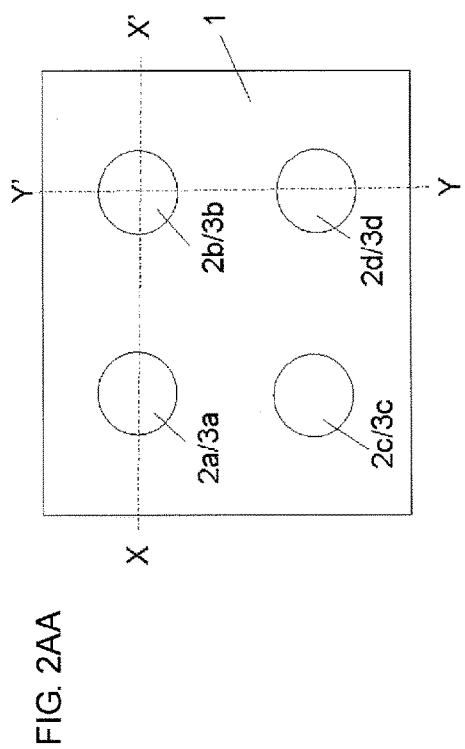
FIG. 2AA  FIG. 2AB  FIG. 2AC

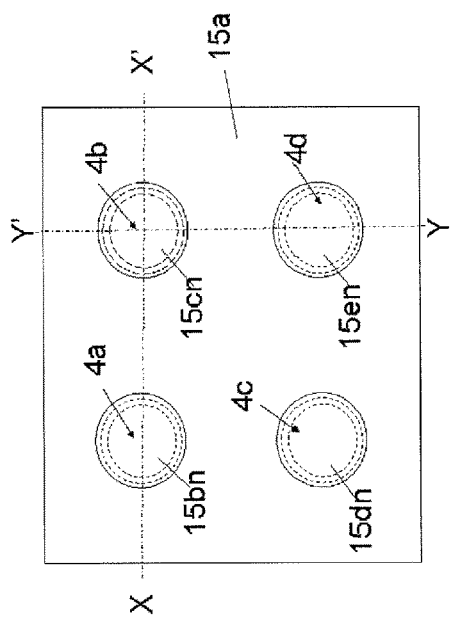
FIG. 2FA
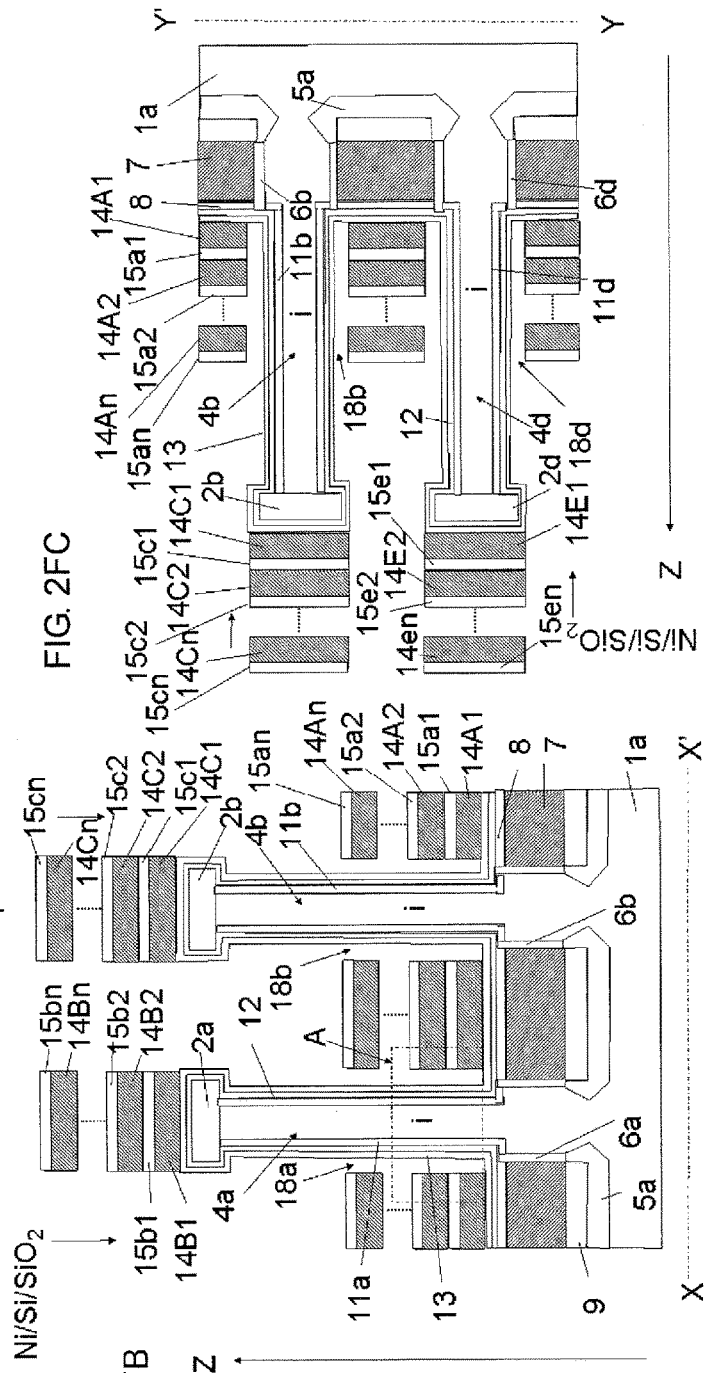
FIG. 2FB
FIG. 2FC

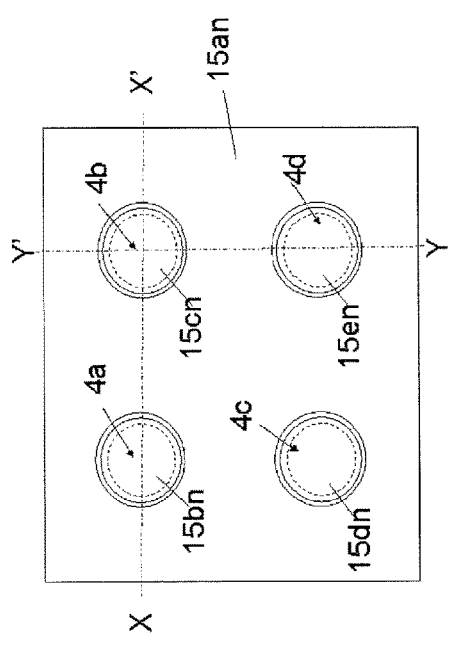
FIG. 2GA
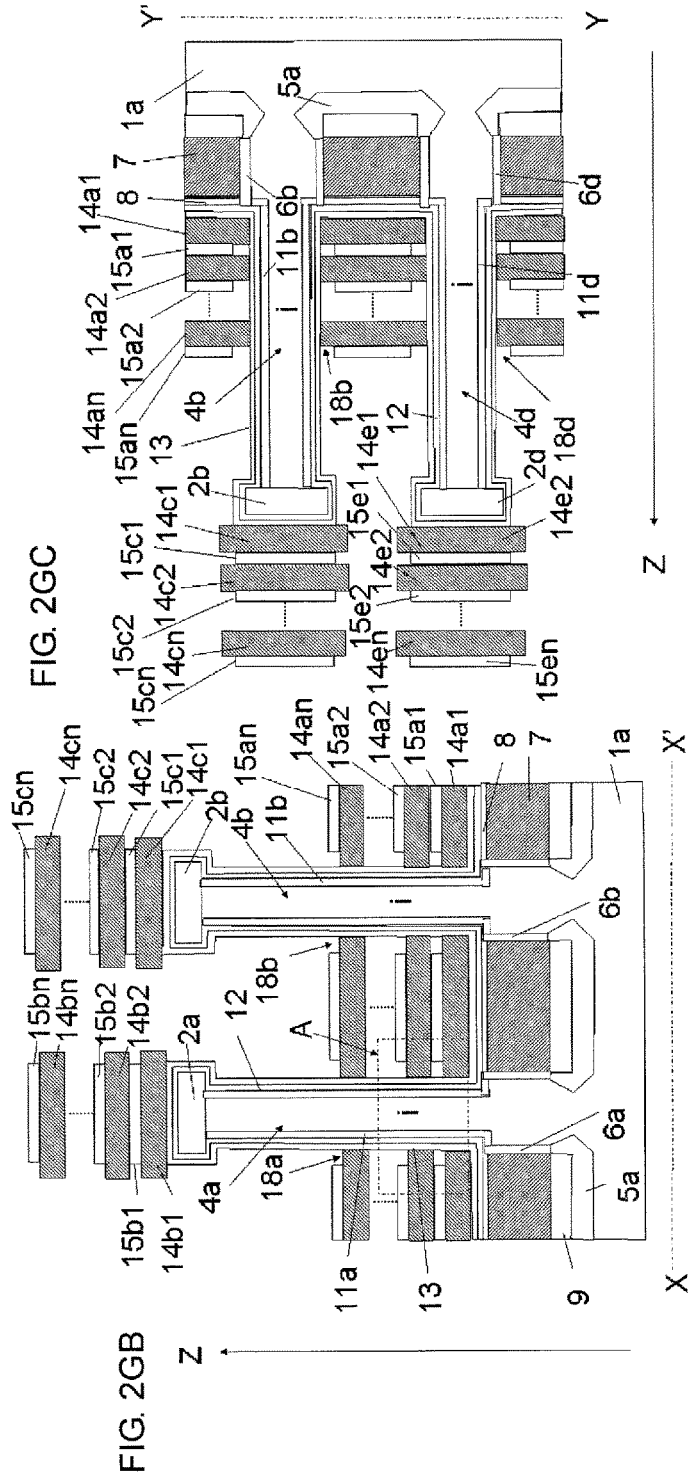
FIG. 2GC
FIG. 2GB

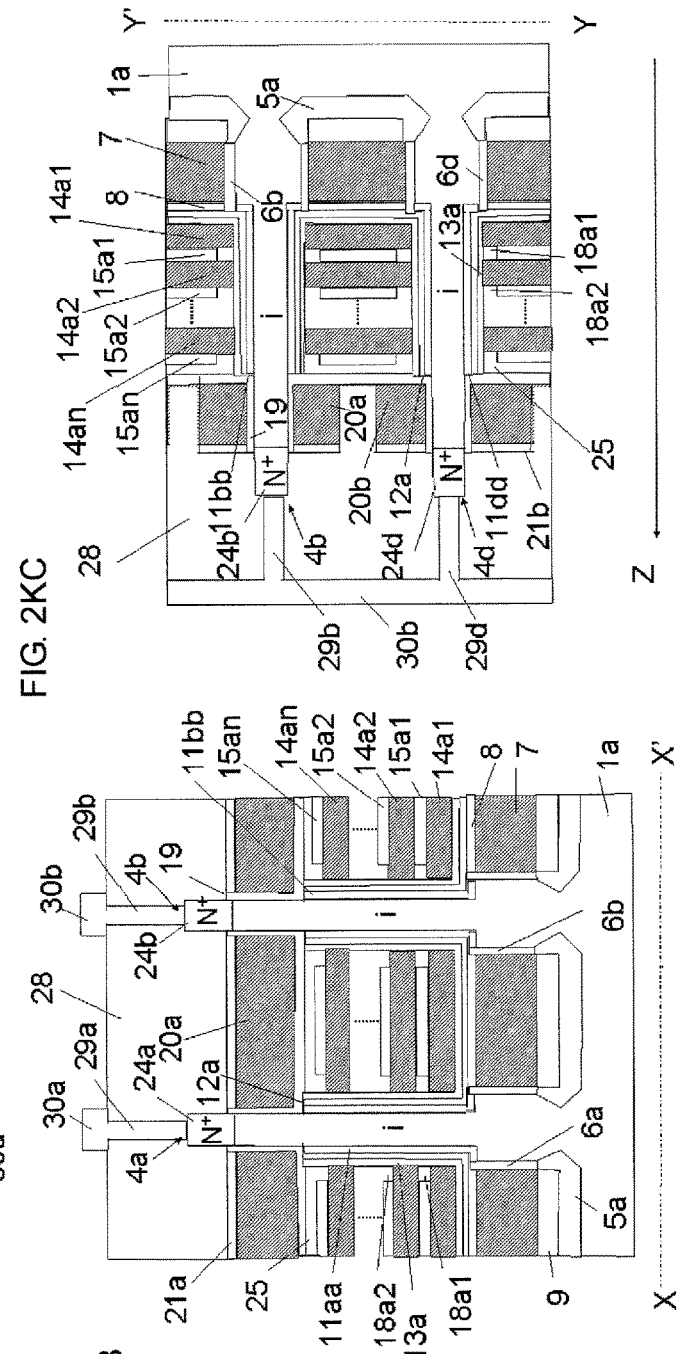

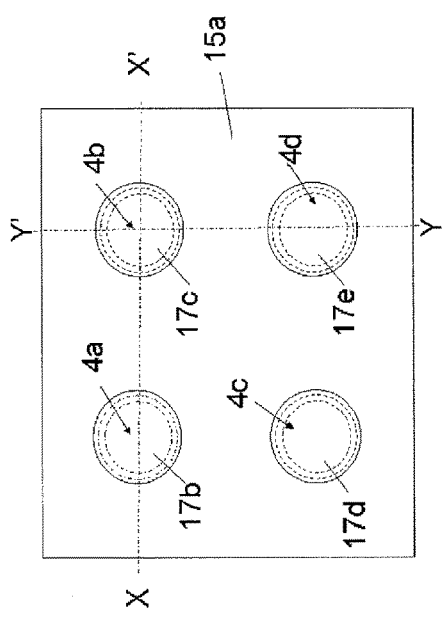
FIG. 5A
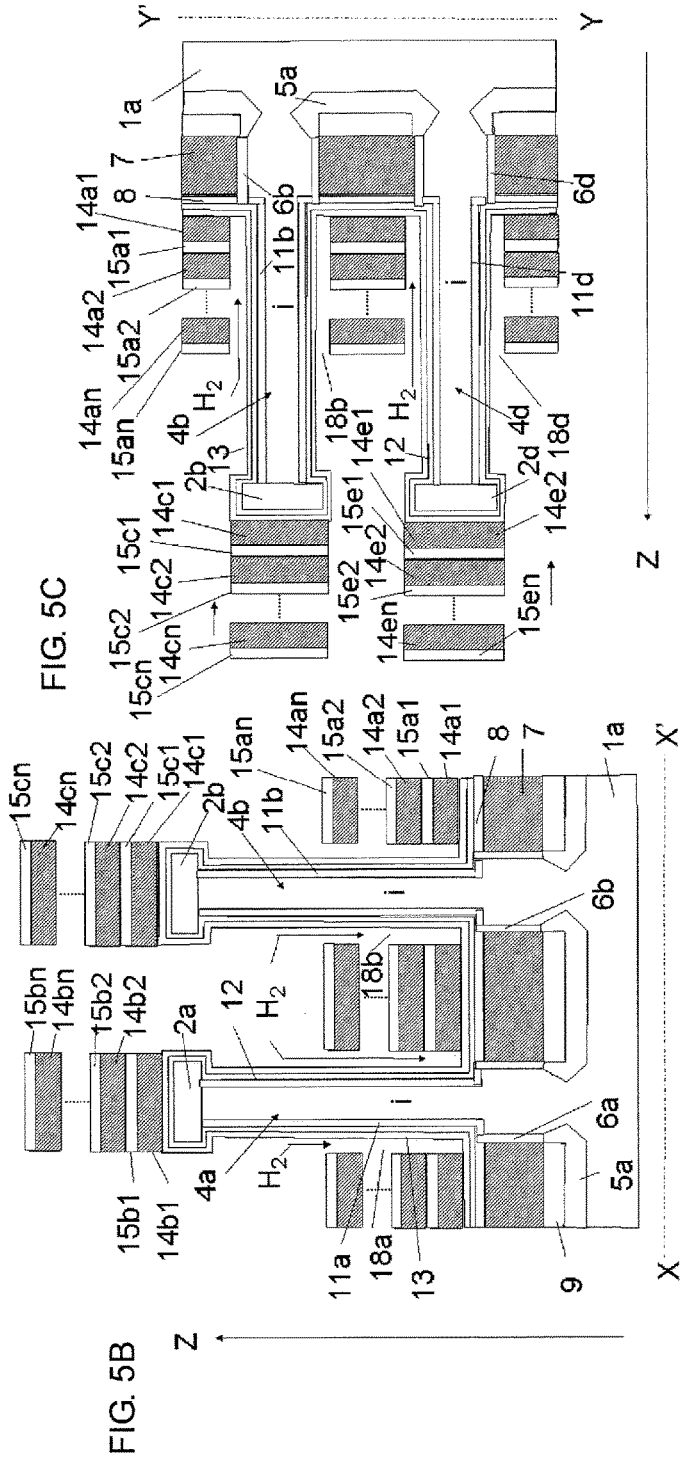
FIG. 5B
FIG. 5C

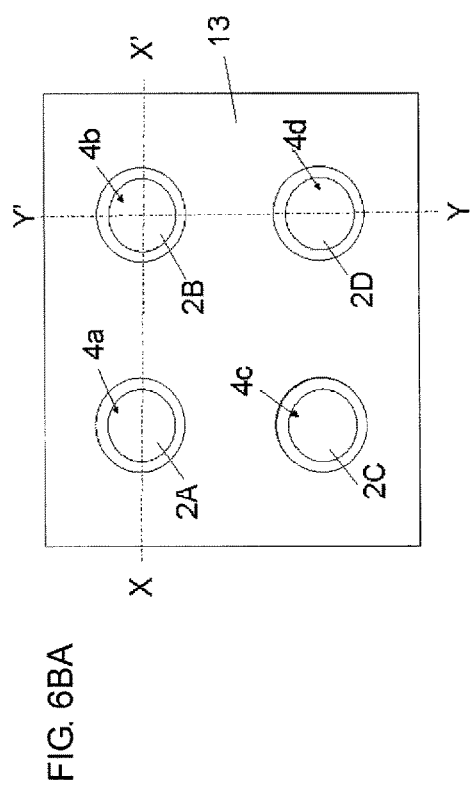
FIG. 6BA
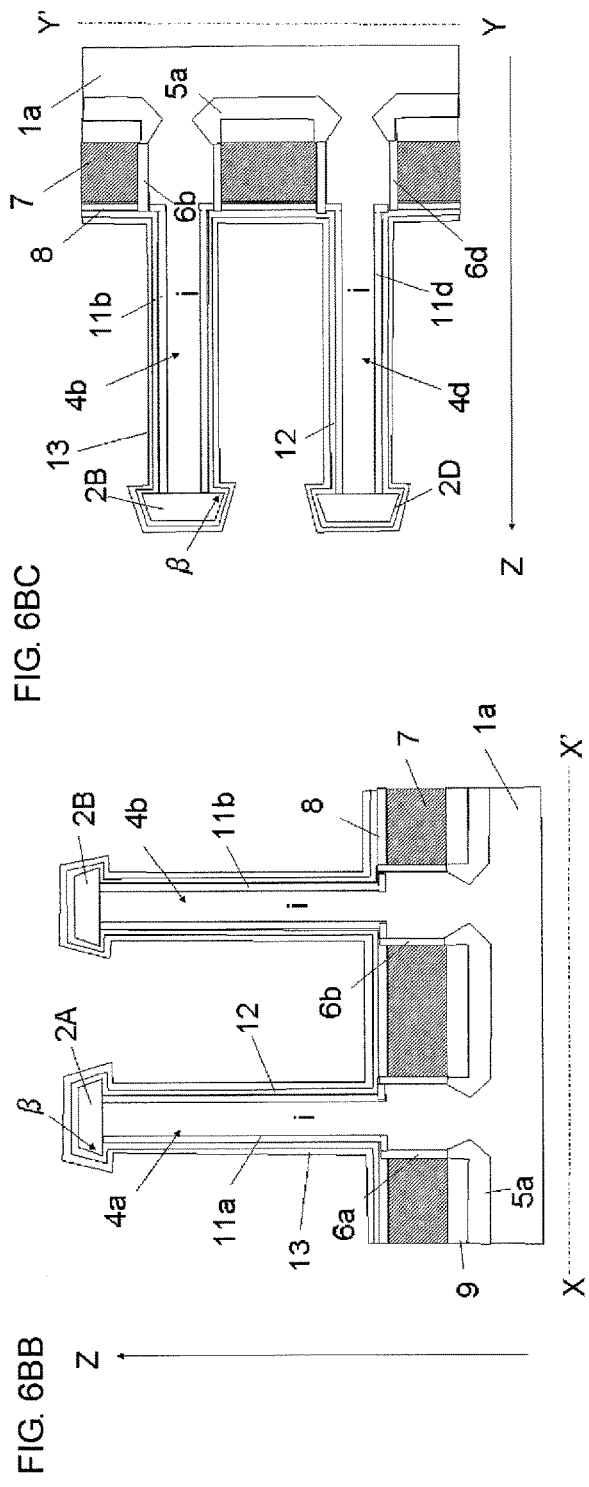
FIG. 6BC
FIG. 6BB

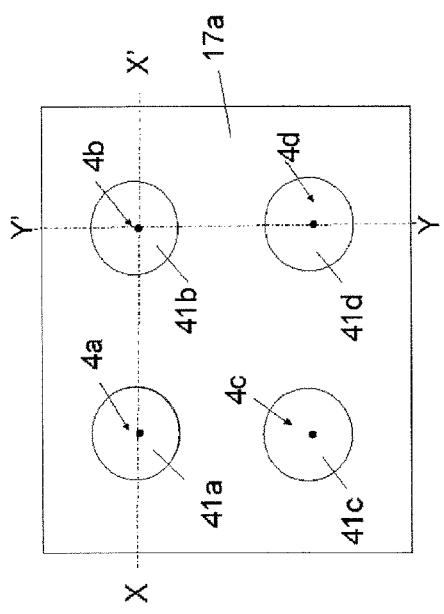
FIG. 6CA
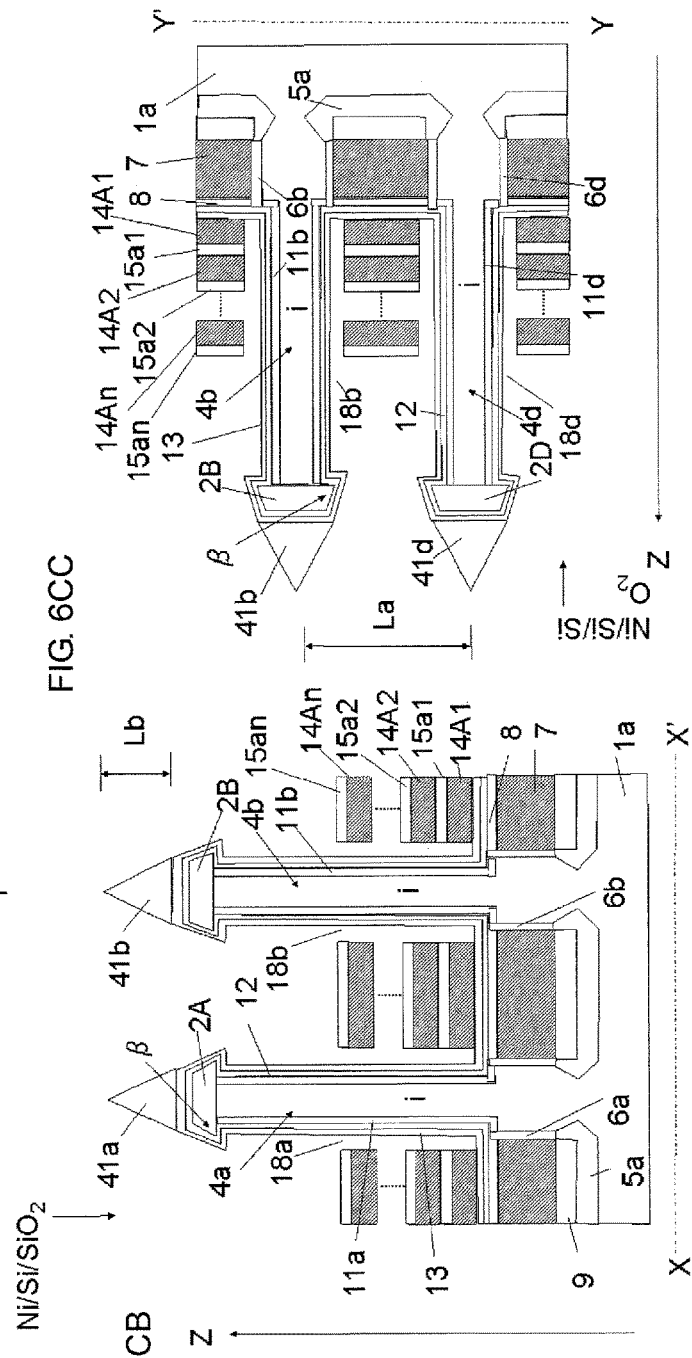
FIG. 6CB
FIG. 6CC

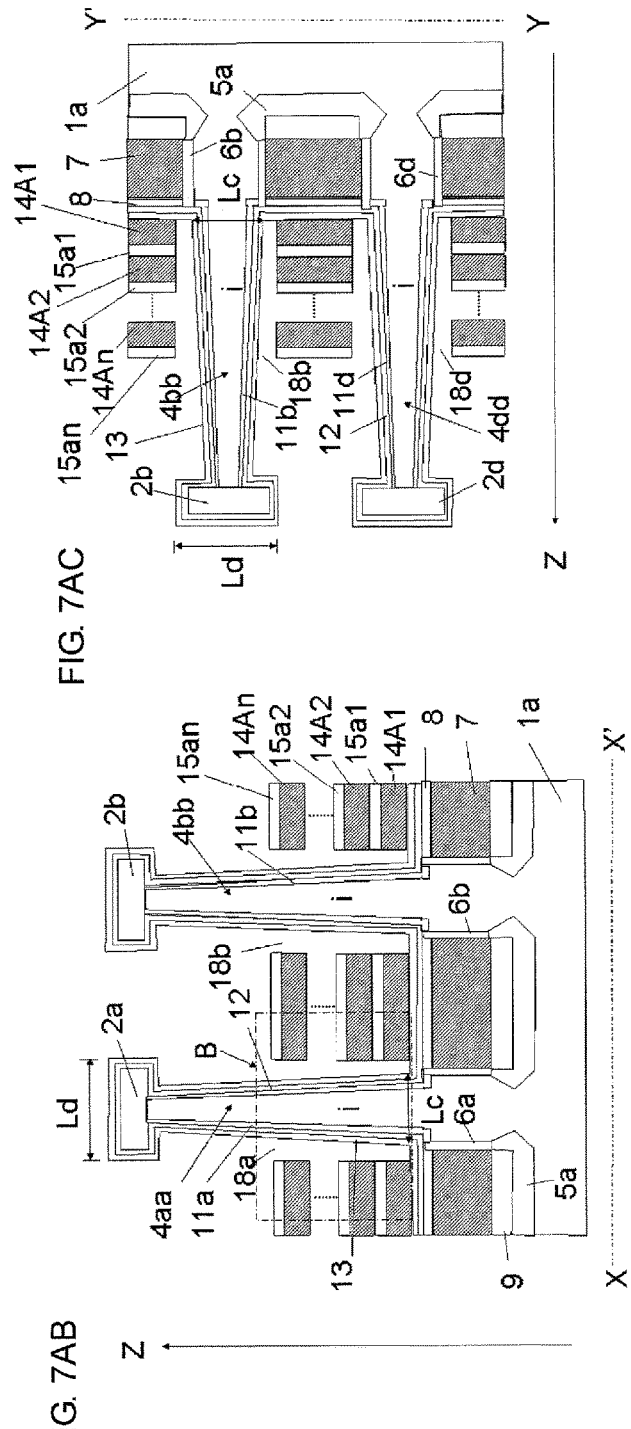

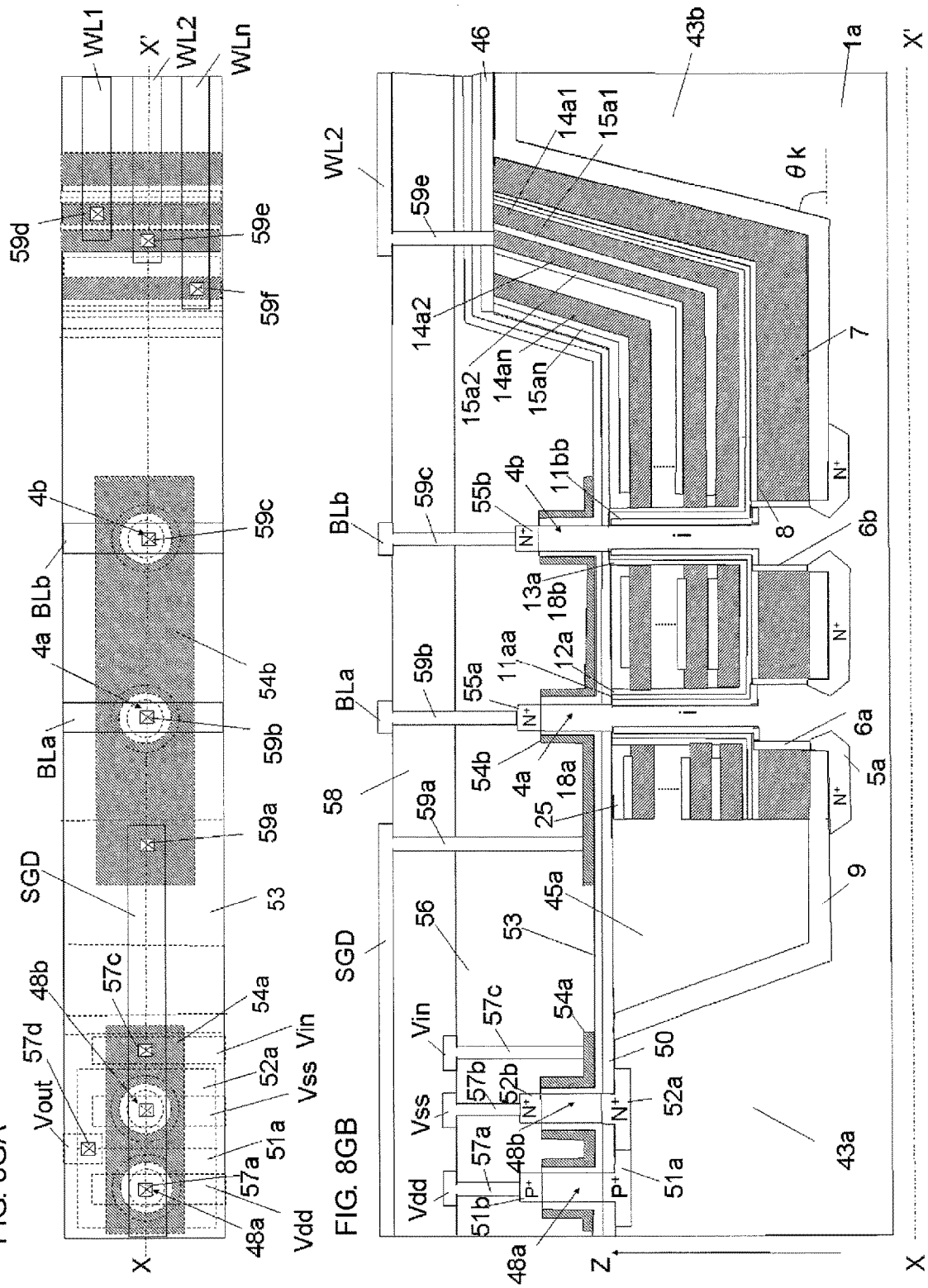

PILLAR-SHAPED SEMICONDUCTOR MEMORY DEVICE AND METHOD FOR PRODUCING THE SAME

RELATED APPLICATIONS

The present application is a continuation of International Application PCT/JP2014/065358, with an international filing date of Jun. 10, 2014, the entire contents of which are incorporated herein by reference.

BACKGROUND OF THE INVENTION

1. Field of the Invention

The present invention relates to a pillar-shaped semiconductor memory device which is a memory device formed in a pillar-shaped semiconductor, and a method for producing the device.

2. Description of the Related Art

In recent years, electronic devices using a memory device typified by a flash memory have been used in various fields, and the market size and application fields of the devices have been further expanding. With these circumstances, the realization of highly integrated memory devices and a reduction in the cost of the memory devices have been desired.

NAND-type flash memory (refer to, for example, C. Y. Ting, V. J. Vivalda, and H. G. Schaefer: "Study of planarized sputter-deposited $SiO_2$", J. Vac. Sci. Technol. 15(3), p.p. 1105-1112, May/June (1978)) is advantageous in the realization of highly integrated devices and a reduction in the cost of the devices. Vertical NAND-type flash memory in which a plurality of memory cell-transistors are stacked around a semiconductor silicon pillar (hereinafter, a semiconductor silicon pillar is referred to as "Si pillar") may realize more highly integrated devices (refer to, for example, Japanese Unexamined Patent Application Publication No. 4-79369).

FIG. 9 illustrates a sectional structure of an example of a vertical NAND-type flash memory device in the related art (refer to, for example, Japanese Unexamined Patent Application Publication No. 4-79369). Silicon (Si) pillars 101a and 101b are formed on an intrinsic semiconductor silicon substrate 100 (hereinafter, an intrinsic semiconductor silicon substrate is referred to as "i-layer substrate"). Silicon dioxide ($SiO_2$) layers 102a and 102b which are tunnel insulating layers are formed so as to surround outer peripheral portions of the Si pillars 101a and 101b, respectively. Floating electrodes 103a and 103b that electrically float are formed so as to surround outer peripheral portions of the $SiO_2$ layers 102a and 102b, respectively. Source-side selection gate electrodes 104a and 104b are formed around lower portions of the Si pillars 101a and 101b, respectively. Drain-side selection gate electrodes 105a and 105b are formed around upper portions of the Si pillars 101a and 101b, respectively. Interlayer $SiO_2$ layers 107a and 107b are formed so as to surround outer peripheries of the floating electrodes 103a and 103b, respectively. Word-line electrodes 108a and 108b are formed so as to surround outer peripheries of the interlayer $SiO_2$ layers 107a and 107b, respectively. A common source $N^+$ layer 109 (hereinafter, a semiconductor layer containing a donor impurity in a large amount is referred to as "$N^+$ layer") is formed in a surface layer of the i-layer substrate 100, the surface layer extending to bottom portions of the Si pillars 101a and 101b. Drain $N^+$ layers 110a and 110b are formed in top portions of the Si pillars 101a and 101b, respectively. A $SiO_2$ layer 111 is further formed by chemical vapor deposition (CVD) so as to cover the whole surface. Bit-line wiring metal layers 113a and 113b are respectively formed through contact holes 112a and 112b formed on the drain $N^+$ layers 110a and 110b, respectively. Furthermore, $P^-$ layers 114a and 114b (hereinafter, a semiconductor layer containing an acceptor impurity in a small amount is referred to as "$P^-$ layer") are respectively formed in the Si pillars 101a and 101b on the i-layer substrate 100. Memory cell-transistors Qc1 includes the $SiO_2$ layers 102a and 102b, the floating electrodes 103a and 103b, the interlayer $SiO_2$ layers 107a and 107b, and the word-line electrodes 108a and 108b, all of which are formed so as to surround outer peripheral portions of the $P^-$ layers 114a and 114b formed in the Si pillars 101a and 101b, respectively. Memory cell-transistors Qc2 and Qc3 that have the same structures as the memory cell-transistors Qc1 and that are electrically isolated from each other are formed on the memory cell-transistors Qc1. Furthermore, source-side selection transistors Qs1 having the source-side selection gate electrodes 104a and 104b are formed below the memory cell-transistors Qc1, Qc2, and Qc3. Drain-side selection transistors Qs2 having the drain-side selection gate electrodes 105a and 105b are formed above the memory cell-transistors Qc1, Qc2, and Qc3. With this structure, a vertical NAND-type flash memory device having a high density is provided.

In the vertical NAND-type flash memory element illustrated in FIG. 9, it is desirable to easily form the $SiO_2$ layers 102a and 102b which are tunnel insulating layers, the interlayer $SiO_2$ layers 107a and 107b, the source-side selection gate electrodes 104a and 104b, the drain-side selection gate electrodes 105a and 105b, the floating electrodes 103a and 103b, and the word-line electrodes 108a and 108b, all of which have less defects and high reliability, so as to surround outer peripheral portions of the Si pillars 101a and 101b, respectively.

A known vertical NAND-type flash memory is produced by repeatedly stacking word-line electrode material layers and insulation films in a vertical direction, subsequently forming a through-hole passing through the stacked word-line electrode material layers and the insulation films, subsequently forming an interlayer insulation film, a $Si_3N_4$ layer (silicon nitride layer) that stores data charges, and a tunnel $SiO_2$ layer on a surface layer of a side surface of the through-hole, and further filling the through-hole with a poly-Si layer (hereinafter, a polycrystalline Si layer is referred to as "poly-Si layer") functioning as a channel (refer to, for example, the specification of U. S. Patent Application Publication No. 2007/0252201). Also in this vertical NAND-type flash memory, it is desirable to easily form the interlayer insulation film, the $Si_3N_4$ layer, the tunnel $SiO_2$ layer, and the word-line electrodes, all of which have less defects and high reliability.

In the vertical NAND-type flash memory illustrated in FIG. 9, it is desirable to easily form, at a high density, the $SiO_2$ layers 102a and 102b, the interlayer $SiO_2$ layers 107a and 107b, the source-side selection gate electrodes 104a and 104b, the drain-side selection gate electrodes 105a and 105b, the floating electrodes 103a and 103b, and the word-line electrodes 108a and 108b, all of which have less defects and high reliability, so as to surround outer peripheral portions of the Si pillars 101a and 101b.

SUMMARY OF THE INVENTION

A pillar-shaped semiconductor memory device according to a first aspect of the present invention includes a substrate, a first semiconductor pillar disposed on the substrate and extending in a direction perpendicular to a surface of the substrate, a tunnel insulating layer surrounding an outer periphery of the first semiconductor pillar, a data charge storage insulating layer surrounding an outer periphery of the tunnel insulating layer, a first interlayer insulating layer surrounding an outer periphery of the data charge storage insulating layer, a first conductor layer surrounding an outer periphery of the first interlayer insulating layer, and a second interlayer insulating layer that is in contact with an upper surface or a lower surface of the first conductor layer, in which a side surface of the second interlayer insulating layer facing a side surface of the first interlayer insulating layer is separated from the side surface of the first interlayer insulating layer with a distance therebetween, the distance being larger than a distance from the side surface of the first interlayer insulating layer to a side surface of the first conductor layer facing the side surface of the first interlayer insulating layer. In the pillar-shaped semiconductor memory device, the side surface of the first conductor layer is in contact with or separated from the side surface of the first interlayer insulating layer. At least one stacked material layer including the first conductor layer and the second interlayer insulating layer as one set is formed in a direction perpendicular to an upper surface of the substrate. Data writing and erasing due to a data charge transfer between the first semiconductor pillar and the data charge storage insulating layer through the tunnel insulating layer or a data charge retention by the data charge storage insulating layer is performed by application of a voltage to the first conductor layer. A space is formed between the side surface of the first interlayer insulating layer and the side surface of the second interlayer insulating layer.

The pillar-shaped semiconductor memory device preferably further includes a third interlayer insulating layer formed between the side surface of the first interlayer insulating layer and the side surface of the second interlayer insulating layer. The third interlayer insulating layer is preferably further disposed between the side surface of the first interlayer insulating layer and the side surface of the first conductor layer.

The at least one stacked material layer preferably includes a plurality of stacked material layers. The side surface of a first conductor layer disposed in an uppermost portion of the stacked material layers is preferably in contact with the side surface of the first interlayer insulating layer. The side surface of a first conductor layer disposed lower than the first conductor layer disposed in the uppermost portion of the stacked material layers is preferably separated from the side surface of the first interlayer insulating layer.

A side surface of the first semiconductor pillar preferably includes an inclined surface or an inclined curved surface. The at least one stacked material layer preferably includes a plurality of stacked material layers. The first conductor layer of each of the stacked material layers preferably has a protruding portion protruding from the side surface of the second interlayer insulating layer to the side surface of the first interlayer insulating layer. A length of the protruding portion of a first conductor layer located at a position at which a width of the space between the side surface of the first interlayer insulating layer and the side surface of the second interlayer insulating layer is small is preferably smaller than a length of the protruding portion of a first conductor layer located at a position at which a width of the space between the side surface of the first interlayer insulating layer and the side surface of the second interlayer insulating layer is large.

The at least one stacked material layer preferably includes a plurality of stacked material layers. The pillar-shaped semiconductor memory device preferably includes a first gate insulating layer formed above the stacked material layers and surrounding an outer periphery of the first semiconductor pillar, a second conductor layer surrounding an outer periphery of the first gate insulating layer, and a first impurity region formed in a top portion of the first semiconductor pillar and containing a donor or acceptor impurity. Preferably, the first conductor layer of each of the stacked material layers is connected to a word-line wiring metal layer, the second conductor layer is connected to a source-side selection gate wiring metal layer or a drain-side selection gate wiring metal layer, the first impurity region is connected to a common source line metal layer or a bit-line wiring metal layer, and a NAND-type flash memory device is formed in the first semiconductor pillar.

The at least one stacked material layer preferably includes a plurality of stacked material layers. The pillar-shaped semiconductor memory device preferably includes a second gate insulating layer formed below the stacked material layers and surrounding an outer periphery of the first semiconductor pillar, a third conductor layer surrounding an outer periphery of the second gate insulating layer, and a second impurity region formed below the stacked material layers and in a bottom portion of the first semiconductor pillar and having the same conductivity type as the first impurity region. The NAND-type flash memory device is preferably formed in the first semiconductor pillar in which the first conductor layer of each of the stacked material layers is connected to the word-line wiring metal layer, the third conductor layer is connected to the source-side selection gate wiring metal layer, the second impurity region is connected to the common source line metal layer, the second conductor layer is connected to the drain-side selection gate wiring metal layer, and the first impurity region is connected to the bit-line wiring metal layer.

The pillar-shaped semiconductor memory device preferably further includes a first outer peripheral semiconductor region formed in an outer periphery of a memory element region in which the first semiconductor pillar is formed so that a height of an upper surface of the first outer peripheral semiconductor region is substantially equal to a height of a top portion of the first semiconductor pillar; a second semiconductor pillar which is formed in a second outer peripheral semiconductor region included in the first outer peripheral semiconductor region, whose top portion has a height substantially equal to that of the top portion of the first semiconductor pillar, and whose bottom surface has a height substantially equal to that of a bottom surface of the second conductor layer; a third gate insulating layer surrounding an outer peripheral portion of the second semiconductor pillar; a fourth conductor layer which is formed so as to surround an outer periphery of the third gate insulating layer, and whose upper and lower ends have heights substantially equal to those of upper and lower ends of the second conductor layer; a third impurity region formed above the fourth conductor layer and in a top portion of the second semiconductor pillar and containing a donor or acceptor impurity; and a fourth impurity region formed below the fourth conductor layer and in a bottom portion of the second semiconductor pillar and having the same conductivity type as the third impurity region. A surrounding gate MOS transistor (SGT) is preferably formed in which when one of the third impurity region and the fourth impurity region functions as a source, the other functions as a drain, the second semiconductor pillar disposed between the third impurity region and the fourth impurity region functions as a channel, and the fourth conductor layer functions as a gate.

The pillar-shaped semiconductor memory device preferably further includes a fourth interlayer insulating layer that is formed on the substrate so as to surround the outer periphery of the first semiconductor pillar, and that extends to a side surface and an upper surface of the first outer peripheral semiconductor region; and a contact hole connected to an upper surface of the first conductor layer of one of the stacked material layers that have an upper surface on an upper end of a side surface of the first outer peripheral semiconductor region. The stacked material layers are preferably formed on the fourth interlayer insulating layer. The upper surface of the stacked material layers preferably has a height substantially equal to that of an upper surface of the fourth interlayer insulating layer located on the first outer peripheral semiconductor region. The first conductor layer and the word-line wiring metal layer are preferably connected to each other through the contact hole.

A method for producing a pillar-shaped semiconductor memory device according to a second aspect of the present invention includes a mask insulating layer-forming step of forming, on a substrate, a mask insulating layer having a circular shape in plan view; a first semiconductor pillar-forming step of etching the substrate using the mask insulating layer as a mask to form a semiconductor pillar on the substrate, and retracting a side surface of the semiconductor pillar inward in a radial direction of the semiconductor pillar to form a first semiconductor pillar; a tunnel insulating layer-forming step of forming a tunnel insulating layer so as to surround an outer periphery of the first semiconductor pillar; a data charge storage insulating layer-forming step of forming a data charge storage insulating layer so as to surround an outer periphery of the tunnel insulating layer; a first interlayer insulating layer-forming step of forming a first interlayer insulating layer so as to surround an outer periphery of the data charge storage insulating layer; a first conductor layer-forming step of forming a first conductor layer on an outer periphery of the first semiconductor pillar and above the substrate by allowing a material atom to be incident in a direction perpendicular to an upper surface of the mask insulating layer; a second interlayer insulating layer-forming step of forming a second interlayer insulating layer on the outer periphery of the first semiconductor pillar and above the substrate by allowing a material atom to be incident on the first conductor layer in a direction perpendicular to the upper surface of the mask insulating layer; a stacked material layer-forming step of forming at least one stacked material layer in a direction perpendicular to an upper surface of the substrate, the stacked material layer including the first conductor layer and the second interlayer insulating layer as one set; a space-forming step of, at the same time as the stacked material layer-forming step, forming a space between a side surface of the first interlayer insulating layer and side surfaces of the first conductor layer and the second interlayer insulating layer; and a first conductor layer-protruding step of protruding the side surface of the first conductor layer toward the side surface of the first interlayer insulating layer by performing heat treatment. In the method, data writing and erasing due to a data charge transfer between the first semiconductor pillar and the data charge storage insulating layer through the tunnel insulating layer or data charge retention by the data charge storage insulating layer is performed by application of a voltage to the first conductor layer.

Before the heat treatment is performed, the first conductor layer is preferably formed from a metal layer and a silicon layer, and the first conductor layer is preferably subjected to silicidation by the heat treatment to carry out the first conductor layer-protruding step.

Before the heat treatment is performed, the first conductor layer is preferably formed from a metal layer, and the first conductor layer is preferably plastically deformed by the heat treatment to carry out the first conductor layer-protruding step.

After the stacked material layer-forming step, the heat treatment is preferably performed in an atmosphere containing hydrogen.

The at least one stacked material layer preferably includes a plurality of stacked material layers. In the first conductor layer-protruding step, the side surface of a first conductor layer disposed in an uppermost portion of the stacked material layers is preferably brought into contact with the side surface of the first interlayer insulating layer, and the side surface of a first conductor layer disposed lower than the first conductor layer disposed in the uppermost portion of the stacked material layers is preferably formed to be separated from the side surface of the first interlayer insulating layer.

The method preferably includes a truncated cone-shaped mask insulating layer-forming step of forming, instead of the mask insulating layer, a truncated cone-shaped mask insulating layer on the first semiconductor pillar; and a cone-shaped stacked material layer-forming step of depositing a material atom by allowing the material atom to be incident in a direction perpendicular to the upper surface of the substrate under a condition in which a deposition rate of the material atom on a side surface of the truncated cone-shaped mask insulating layer is lower than a removal rate of the material atom to form the at least one stacked material layer above the substrate and to form, on the truncated cone-shaped mask insulating layer, a cone-shaped stacked material layer formed of the same material as the at least one stacked material layer.

The method preferably further includes a first gate insulating layer-forming step of forming a first gate insulating layer above the at least one stacked material layer so as to surround the outer periphery of the first semiconductor pillar; a second conductor layer-forming step of forming a second conductor layer so as to surround an outer periphery of the first gate insulating layer; a first impurity region-forming step of forming a first impurity region in a top portion of the first semiconductor pillar, the first impurity region containing a donor or acceptor impurity; a step of connecting the first conductor layer of the at least one stacked material layer to a word-line wiring metal layer; a step of connecting the second conductor layer to a source-side selection gate wiring metal layer or a drain-side selection gate wiring metal layer; and a step of connecting the first impurity region to a common source line metal layer or a bit-line wiring metal layer.

The method preferably further includes a second gate insulating layer-forming step of forming a second gate insulating layer below the at least one stacked material layer so as to surround the outer periphery of the first semiconductor pillar, a third conductor layer-forming step of forming a third conductor layer so as to surround an outer periphery of the second gate insulating layer, and a second impurity region-forming step of forming a second impurity region below the third conductor layer and in a bottom portion of the first semiconductor pillar, the second impurity region having the same conductivity type as the first impurity region. In the method, preferably, the first conductor layer of the at least one stacked material layer is connected to the word-line wiring metal layer, the third conductor layer is connected to the source-side selection gate wiring metal layer, the second impurity region is connected to the common source line metal layer, the second conductor layer is connected to the drain-side selection gate wiring metal layer, and the first impurity region is connected to the bit-line wiring metal layer to form a NAND-type flash memory device in the first semiconductor pillar.

The method preferably further includes a first outer peripheral semiconductor region-forming step of forming, in an outer periphery of a memory element region in which the first semiconductor pillar is formed, a first outer peripheral semiconductor region whose upper surface has a height substantially equal to a height of a top portion of the first semiconductor pillar; a second semiconductor pillar-forming step of forming, in a second outer peripheral semiconductor region included in the first outer peripheral semiconductor region, a second semiconductor pillar whose top portion has a height substantially equal to that of the top portion of the first semiconductor pillar, and whose bottom surface has a height substantially equal to that of a bottom surface of the second conductor layer; a third gate insulating layer-forming step of forming a third gate insulating layer so as to surround an outer periphery of the second semiconductor pillar; a fourth conductor layer-forming step of forming a fourth conductor layer whose upper and lower ends have heights substantially equal to those of upper and lower ends of the second conductor layer in a direction perpendicular to the substrate so as to surround an outer periphery of the third gate insulating layer; a third impurity region-forming step of forming a third impurity region above the fourth conductor layer and in a top portion of the second semiconductor pillar, the third impurity region containing a donor or acceptor impurity; and a fourth impurity region-forming step of forming a fourth impurity region below the fourth conductor layer and in a bottom portion of the second semiconductor pillar, the fourth impurity region having the same conductivity type as the third impurity region. In the method, a surrounding gate MOS transistor (SGT) is preferably formed in which when one of the third impurity region and the fourth impurity region functions as a source, the other functions as a drain, the second semiconductor pillar disposed between the third impurity region and the fourth impurity region functions as a channel, and the fourth conductor layer function as a gate.

The method preferably further includes a fourth interlayer insulating layer-forming step of forming a fourth interlayer insulating layer on the first outer peripheral semiconductor region, on a side surface of the first outer peripheral semiconductor region, and on the substrate in the outer periphery of the first semiconductor pillar disposed in the memory element region; and a contact hole-forming step of forming a contact hole connected to an upper surface of the first conductor layer. In the method, the at least one stacked material layer is preferably formed on the fourth interlayer insulating layer so as to surround the outer periphery of the first semiconductor pillar and to extend to the side surface of the first outer peripheral semiconductor region. The at least one stacked material layer is preferably formed such that the upper surface of the at least one stacked material layer has a height substantially equal to that of an upper surface of the fourth interlayer insulating layer located on the first outer peripheral semiconductor region. The first conductor layer and the word-line wiring metal layer are preferably connected to each other through the contact hole.

According to the aspects of the present invention, a pillar-shaped semiconductor memory device having high reliability and a high density can be provided at a low cost.

BRIEF DESCRIPTION OF THE DRAWINGS

FIG. 2AA and FIGS. 2AB and 2AC are respectively a plan view and sectional structural views illustrating a vertical NAND-type flash memory device according to the first embodiment and a method for producing the device.

FIG. 2FD is an enlarged sectional structural view of a vertical NAND-type flash memory device according to the first embodiment.

FIG. 2GD is an enlarged sectional structural view of a vertical NAND-type flash memory device according to the first embodiment.

FIG. 2IA and FIGS. 2IB and 2IC are respectively a plan view and sectional structural views illustrating a vertical NAND-type flash memory device according to the first embodiment and a method for producing the device.

FIG. 2KA and FIGS. 2KB and 2KC are respectively a plan view and sectional structural views illustrating a vertical NAND-type flash memory device according to the first embodiment and a method for producing the device.

FIG. 5A and FIGS. 5B and 5C are respectively a plan view and sectional structural views illustrating a vertical NAND-type flash memory device according to a fourth embodiment of the present invention and a method for producing the device.

FIG. 6BA and FIGS. 6BB and 6BC are respectively a plan view and sectional structural views illustrating a vertical NAND-type flash memory device according to the fifth embodiment and a method for producing the device.

FIG. 6CA and FIGS. 6CB and 6CC are respectively a plan view and sectional structural views illustrating a vertical NAND-type flash memory device according to the fifth embodiment and a method for producing the device.

FIG. 7AA and FIGS. 7AB and 7AC are respectively a plan view and sectional structural views illustrating a vertical NAND-type flash memory device according to a sixth embodiment of the present invention and a method for producing the device.

FIGS. 8GA and 8GB are respectively a plan view and a sectional structural view illustrating a vertical NAND-type flash memory device according to the seventh embodiment and a method for producing the device.

DETAILED DESCRIPTION OF THE PREFERRED EMBODIMENTS

Vertical NAND-type flash memory devices which are pillar-shaped semiconductor memory devices according to embodiments of the present invention and methods for producing the devices will now be described with reference to the drawings.

First Embodiment

A method for producing a vertical NAND-type flash memory device according to a first embodiment of the present invention will now be described with reference to FIG. 1 and FIGS. 2AA to 2KC.

Figure 1:
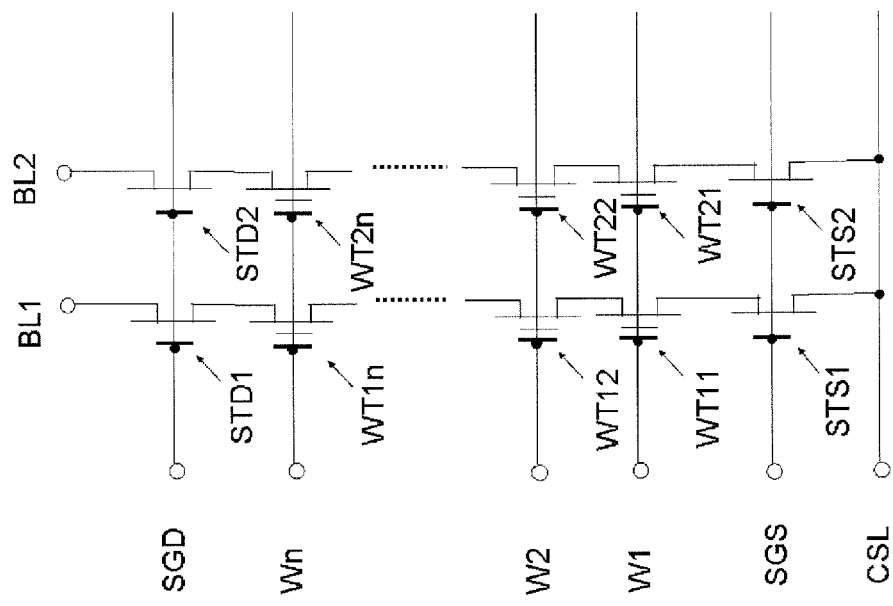
FIG. 1 is a circuit diagram of a vertical NAND-type flash memory device according to a first embodiment of the present invention.

FIG. 1 illustrates a NAND-type flash memory circuit according to a first embodiment. Gate electrodes of memory cell-transistors WT11, WT12, and WT1n, the number of which is n, and which are connected in series are respectively connected to word lines W1, W2, and Wn, the number of which is n. A source-side selection transistor STS1 and a drain-side selection transistor STD1 are respectively connected to the lower side and the upper side of the memory cell-transistors WT11, WT12, and WT1n, the number of which is n. A gate electrode of the source-side selection transistor STS1 is connected to a source-side selection gate wiring metal layer SGS. A gate electrode of the drain-side selection transistor STD1 is connected to a drain-side selection gate wiring metal layer SGD. A source of the source-side selection transistor STS1 is connected to a common source line metal layer CSL. A drain of the drain-side selection transistor STD1 is connected to a bit line BL1. Memory cell-transistors WT21, WT22, and WT2n, the number of which is n, and which are connected in series are formed in parallel with the memory cell-transistors WT11, WT12, and WT1n, the number of which is n, and which are connected in series. Gate electrodes of the memory cell-transistors WT21, WT22, and WT2n, the number of which is n, are respectively connected to the word lines W1, W2, and Wn. A source-side selection transistor STS2 and a drain-side selection transistor STD2 are respectively connected to the lower side and the upper side of the memory cell-transistors WT21, WT22, and WT2n. A gate electrode of the source-side selection transistor STS2 is connected to the source-side selection gate wiring metal layer SGS. A gate electrode of the drain-side selection transistor STD2 is connected to the drain-side selection gate wiring metal layer SGD. A source of the source-side selection transistor STS2 is connected to the common source line metal layer CSL. A drain of the drain-side selection transistor STD2 is connected to a bit line BL2. The configuration including this circuit is repeatedly formed in a block memory element region.

A method for producing a pillar-shaped semiconductor memory device according to the first embodiment will now be described with reference to FIGS. 2AA to 2KC. In FIGS. 2AA to 2KC, the drawings whose last reference character is A are plan views, the drawings whose last reference character is B are sectional views taken along line X-X' in the drawings whose last reference character is A, and the drawings whose last reference character is C are sectional views taken along line Y-Y' in the drawings whose last reference character is A. FIGS. 2FD and 2GD are enlarged sectional views of the area A surrounded by the dashed dotted line in FIGS. 2FB and 2GB, respectively.

As illustrated in FIGS. 2AA to 2AC, a $Si_3N_4$ film (not illustrated) is formed on an i-layer substrate 1, a resist film (not illustrated) is applied onto the $Si_3N_4$ film, and resist layers 3a, 3b, 3c, and 3d each having a circular shape in plan view are formed by lithography. Next, the $Si_3N_4$ film is etched by, for example, reactive ion etching (R1E) using the resist layers 3a, 3b, 3c, and 3d as a mask to form $Si_3N_4$ layers 2a, 2b, 2c, and 2d, respectively.

Figure 2B:
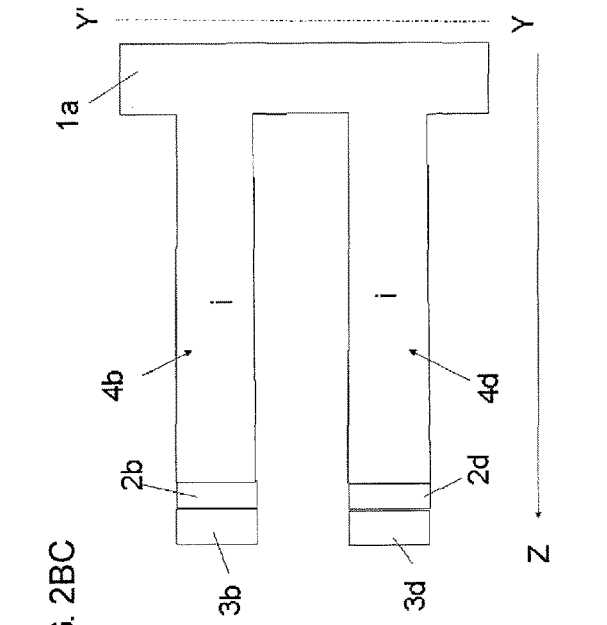
FIG. 2BA and FIGS. 2BB and 2BC are respectively a plan view and sectional structural views illustrating a vertical NAND-type flash memory device according to the first embodiment and a method for producing the device.
Figure 2B:
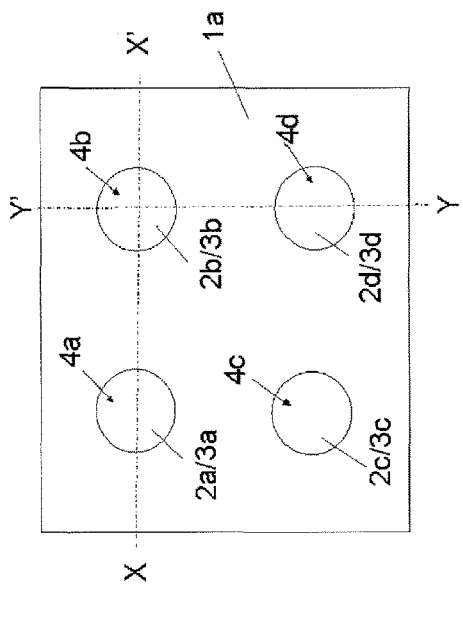
Figure 2B:
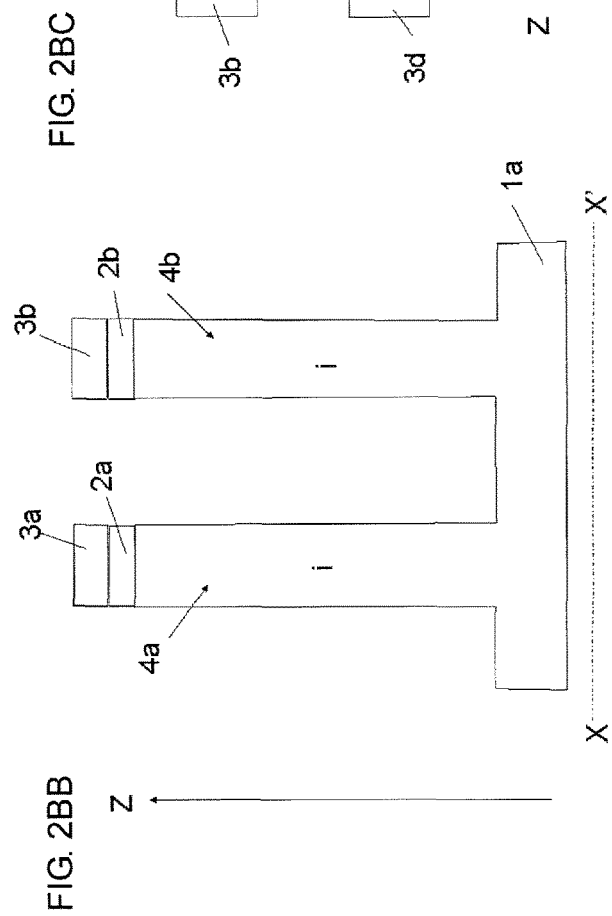

Next, as illustrated in FIGS. 2BA to 2BC, the i-layer substrate 1 is etched by, for example, RIE using the resist layers 3a, 3b, 3c, and 3d and the $Si_3N_4$ layers 2a, 2b, 2c, and 2d as a mask to respectively form Si pillars 4a, 4b, 4c, and 4d on an i-layer substrate 1a. The resist layers 3a, 3b, 3c, and 3d are then removed.

Figure 2C:
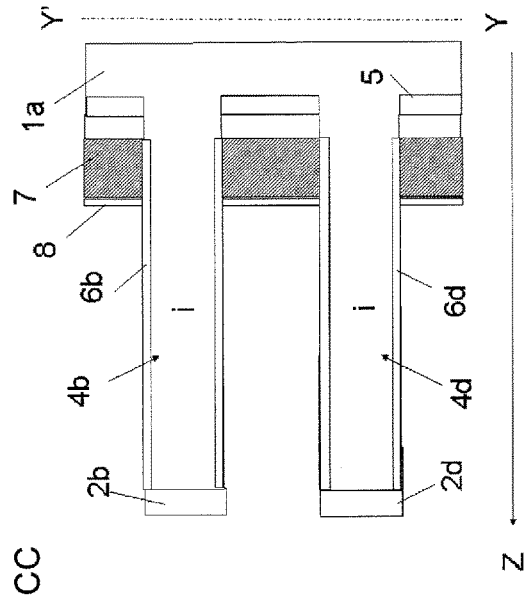
FIG. 2CA and FIGS. 2CB and 2CC are respectively a plan view and sectional structural views illustrating a vertical NAND-type flash memory device according to the first embodiment and a method for producing the device.
Figure 2C:
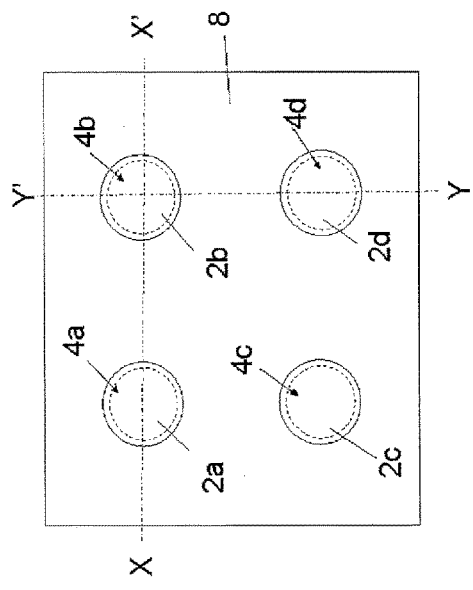
Figure 2C:
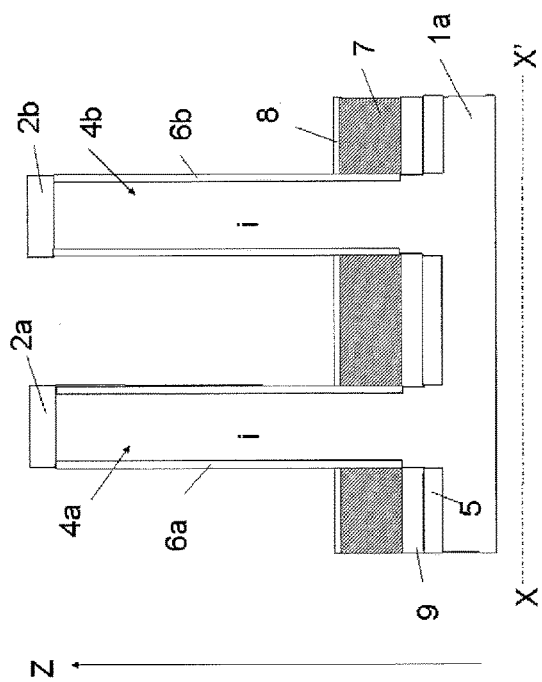

Next, as illustrated in FIGS. 2CA to 2CC, for example, an arsenic (As) ion is implanted into a surface layer of the i-layer substrate 1a disposed on outer peripheries of the Si pillars 4a, 4b, 4c, and 4d to form an $N^+$ layer 5. A $SiO_2$ layer 9 is formed on the i-layer substrate 1a disposed on the outer peripheries of the Si pillars 4a, 4b, 4c, and 4d. Furthermore, $SiO_2$ layers 6a, 6b, 6c, and 6d (the $SiO_2$ layer 6c is not illustrated in the figures) are respectively formed by, for example, a thermal oxidation method in surface layers of side surfaces of the Si pillars 4a, 4b, 4c, and 4d. Subsequently, a doped Si layer 7 (hereinafter, a poly-Si layer containing an acceptor or donor impurity is referred to as "doped Si layer") is formed on the $SiO_2$ layer 9 disposed on the outer peripheries of the Si pillars 4a, 4b, 4c, and 4d. Subsequently, a $Si_3N_4$ layer 8 is formed on the doped Si layer 7.

Figure 2D:
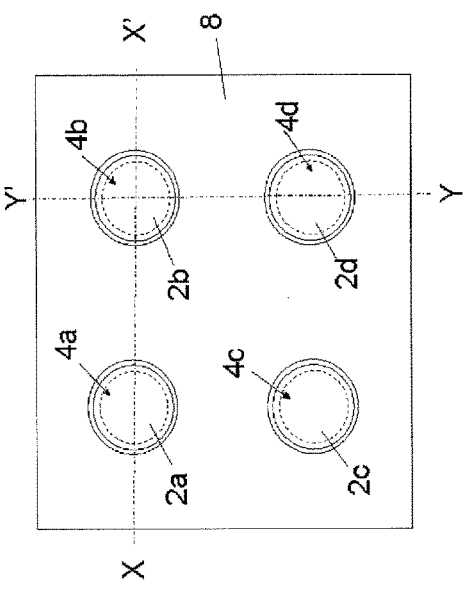
FIG. 2DA and FIGS. 2DB and 2DC are respectively a plan view and sectional structural views illustrating a vertical NAND-type flash memory device according to the first embodiment and a method for producing the device.
Figure 2D:
Figure 2D:
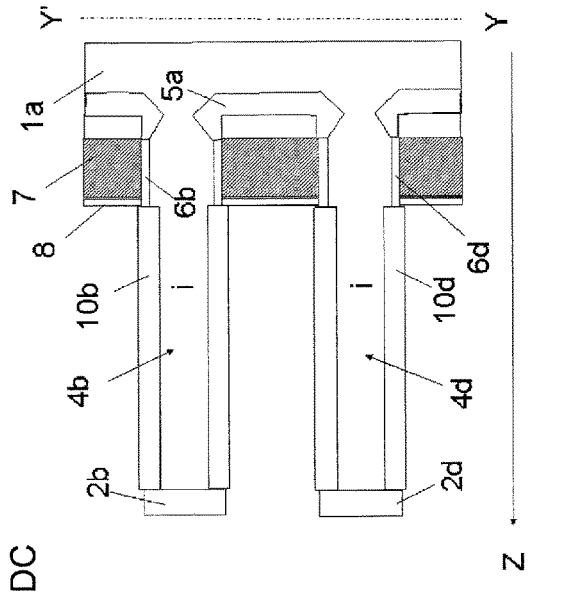

Next, as illustrated in FIGS. 2DA to 2DC, $SiO_2$ layers 10a, 10b, 10c, and 10d (the $SiO_2$ layer 10c is not illustrated in the figures) are formed by a thermal oxidation method so as to have a large thickness in surface layers of the side surfaces of the Si pillars 4a, 4b, 4c, and 4d using the $Si_3N_4$ layers 2a, 2b, 2c, and 2d and the $Si_3N_4$ layer 8 as a mask. Subsequently, the $SiO_2$ layers 10a, 10b, 10c, and 10d are removed. The $Si_3N_4$ layers 2a, 2b, 2c, and 2d and the $Si_3N_4$ layer 8 are not oxidized by the thermal oxidation method. Therefore, as a result of the removal of the $SiO_2$ layers 10a, 10b, 10c, and 10d, the side surfaces of the Si pillars 4a, 4b, 4c, and 4d are retracted inward in the radial direction. Consequently, the diameters of cross sections of the Si pillars 4a, 4b, 4c, and 4d become smaller than the diameters of cross sections of the $Si_3N_4$ layers 2a, 2b, 2c, and 2d, respectively. Furthermore, the $N^+$ layer 5 is diffused by thermal diffusion during the thermal oxidation and becomes an $N^+$ layer 5a.

Figure 2E:
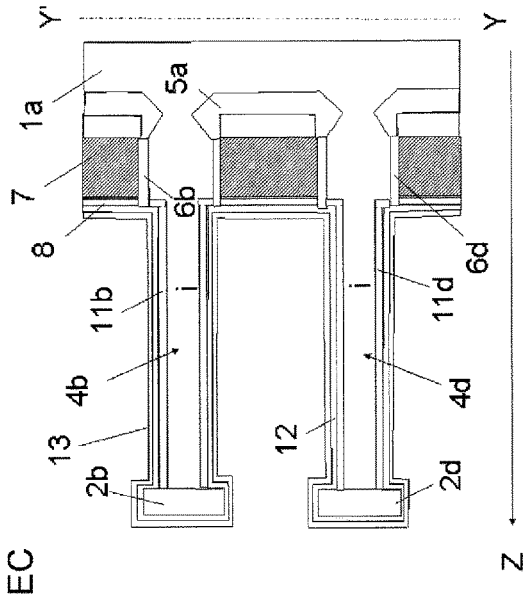
FIG. 2EA and FIGS. 2EB and 2EC are respectively a plan view and sectional structural views illustrating a vertical NAND-type flash memory device according to the first embodiment and a method for producing the device.
Figure 2E:
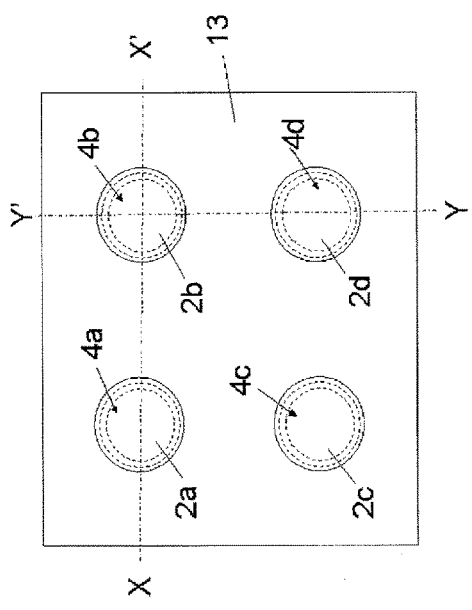
Figure 2E:
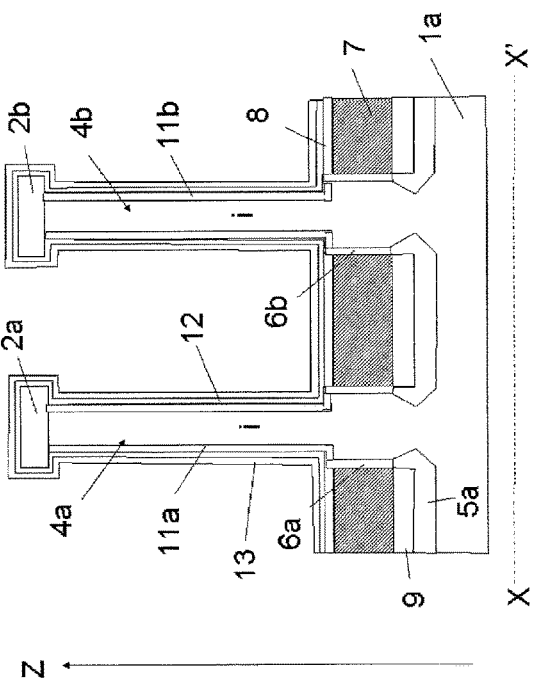
Figure 2F:
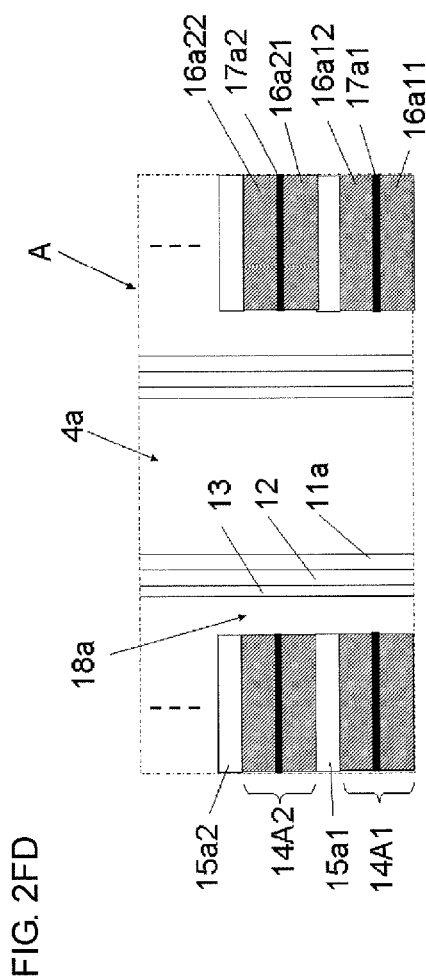
FIG. 2FA and FIGS. 2FB and 2FC are respectively a plan view and sectional structural views illustrating a vertical NAND-type flash memory device according to the first embodiment and a method for producing the device.

Next, as illustrated in FIGS. 2EA to 2EC, $SiO_2$ layers 11a, 11b, 11c, and 11d (the $SiO_2$ layer 11c is not illustrated in the figures) which are to become tunnel insulating layers are respectively formed by, for example, a thermal oxidation method in surface layers of the side surfaces of the Si pillars 4a, 4b, 4c, and 4d. Subsequently, a $Si_3N_4$ layer 12 which is to become a data charge storage insulating layer and a $SiO_2$ layer 13 which is to become an interlayer insulating layer are formed by, for example, atomic layer deposition (ALD) so as to cover the whole surface.

Next, as illustrated in FIGS. 2FA to 2FD, conductor material atoms and $SiO_2$ material atoms are allowed to be incident in a direction perpendicular to a surface of the i-layer substrate 1a by, for example, a bias sputtering method to form conductor layers 14A1, 14A2, and 14An and $SiO_2$ layers 15a1, 15a2, and 15an on outer peripheries of the Si pillars 4a, 4b, 4c, and 4d. In this step, conductor layers 14B1, 14B2, 14Bn, 14C1, 14C2, 14Cn, 14D1, 14D2, 14Dn, 14E1, 14E2, and 14En (the conductor layers 14D1, 14D2, and 14Dn are not illustrated in the figures) and $SiO_2$ layers 15b1, 15b2, 15bn, 15c1, 15c2, 15cn, 15d1, 15d2, 15dn, 15e1, 15e2, and 15en (the $SiO_2$ layers 15d1, 15d2, and 15dn are not illustrated in the figure) are stacked on the Si pillars 4a, 4b, 4c, and 4d. As described above, the conductor material atoms and the $SiO_2$ material atoms are incident in a direction perpendicular to a surface of the i-layer substrate 1 a. Therefore, the $Si_3N_4$ layers 2a, 2b, 2c, and 2d function as a mask, and spaces 18a, 18b, 18c, and 18d (the space 18c is not illustrated in the figures) are formed between the side surface of the $SiO_2$ layer 13 formed on the side surfaces of the Si pillars 4a, 4b, 4c, and 4d and the side surfaces of the conductor layers 14A1, 14A2, and 14An and the $SiO_2$ layers 15a1, 15a2, and 15an. Because of the presence of the spaces 18a, 18b, 18c, and 18d, the side surfaces of the conductor layers 14A1, 14A2, and 14An and the side surfaces of the $SiO_2$ layers 15a1, 15a2, and 15an do not come in contact with the side surface of the $SiO_2$ layer 13.

FIG. 2FD is an enlarged sectional views of the area A surrounded by the dashed dotted line in FIG. 2FB. The conductor layer 14A1 has a structure including a nickel (Ni) metal layer 17a1 and doped Si layers 16a12 and 16a11 containing an acceptor or donor impurity and disposed on and under the Ni layer 17a1. The conductor layer 14A2 has a structure including a Ni layer 17a2 and doped Si layers 16a22 and 16a21 containing an acceptor or donor impurity and disposed on and under the Ni layer 17a2. The doped Si layers 16a11, 16a12, 16a21, and 16a22 and the Ni layers 17a1 and 17a2 are formed by allowing atoms of materials to be incident in a direction perpendicular to a surface of the i-layer substrate 1a. This also applies to the conductor layers 14An, 14B1, 14B2, 14Bn, 14C1, 14C2, 14Cn, 14D1, 14D2, 14Dn, 14E1, 14E2, and 14En.

Figure 2G:
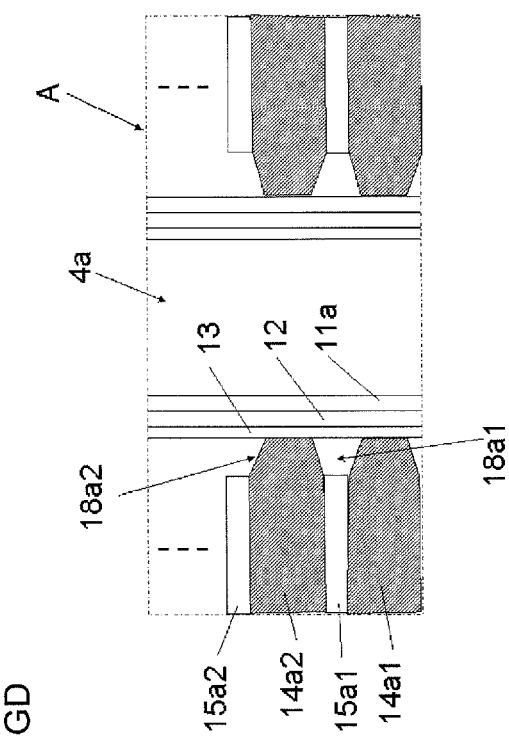
FIG. 2GA and FIGS. 2GB and 2GC are respectively a plan view and sectional structural views illustrating a vertical NAND-type flash memory device according to the first embodiment and a method for producing the device.
Figure 2H:
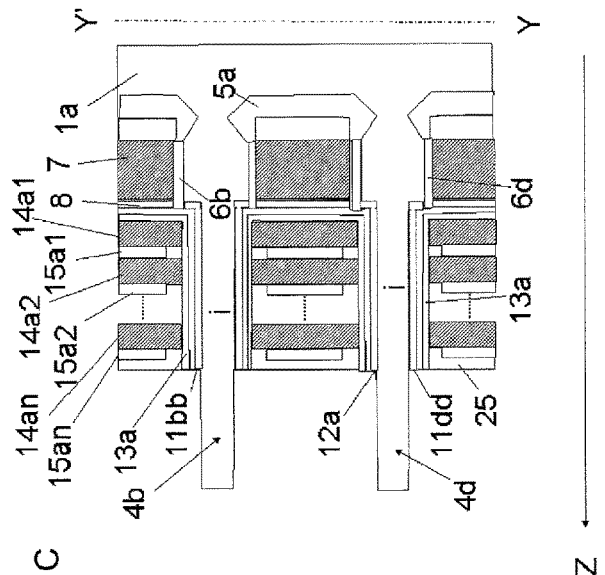
FIG. 2HA and FIGS. 2HB and 2HC are respectively a plan view and sectional structural views illustrating a vertical NAND-type flash memory device according to the first embodiment and a method for producing the device.
Figure 2H:
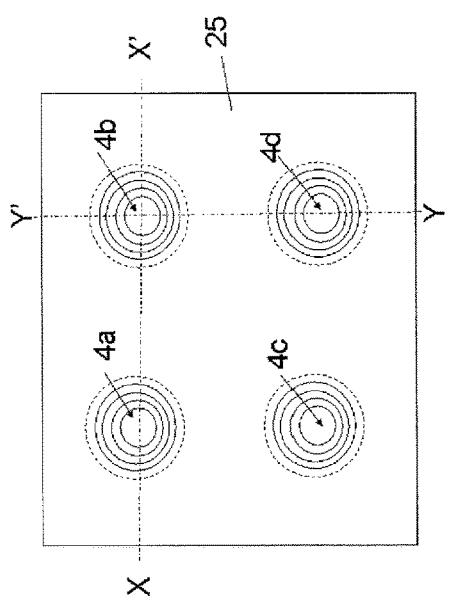
Figure 2H:
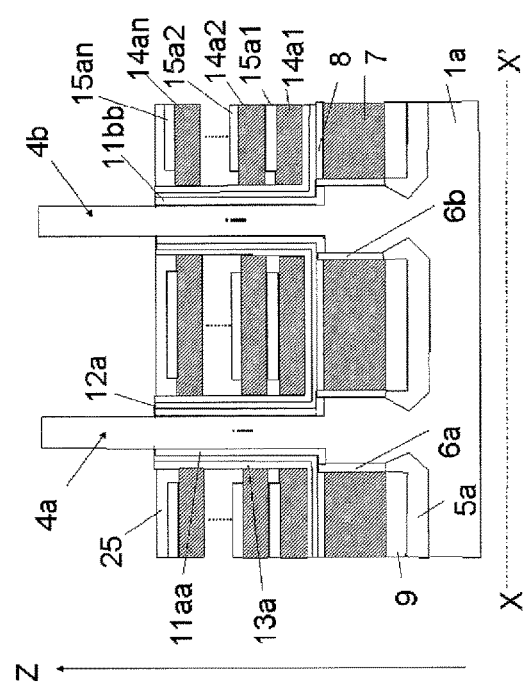
Figure 21A:
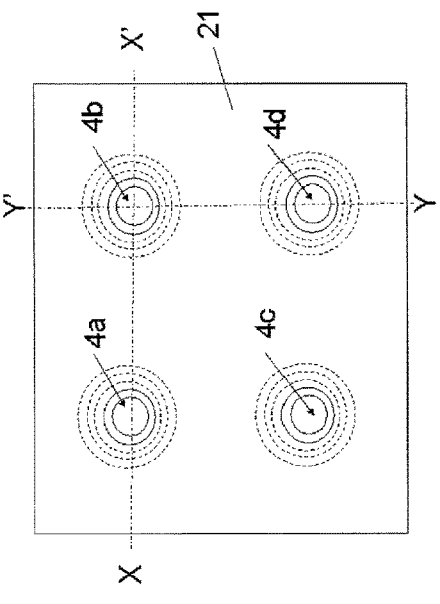
Figure 21B:
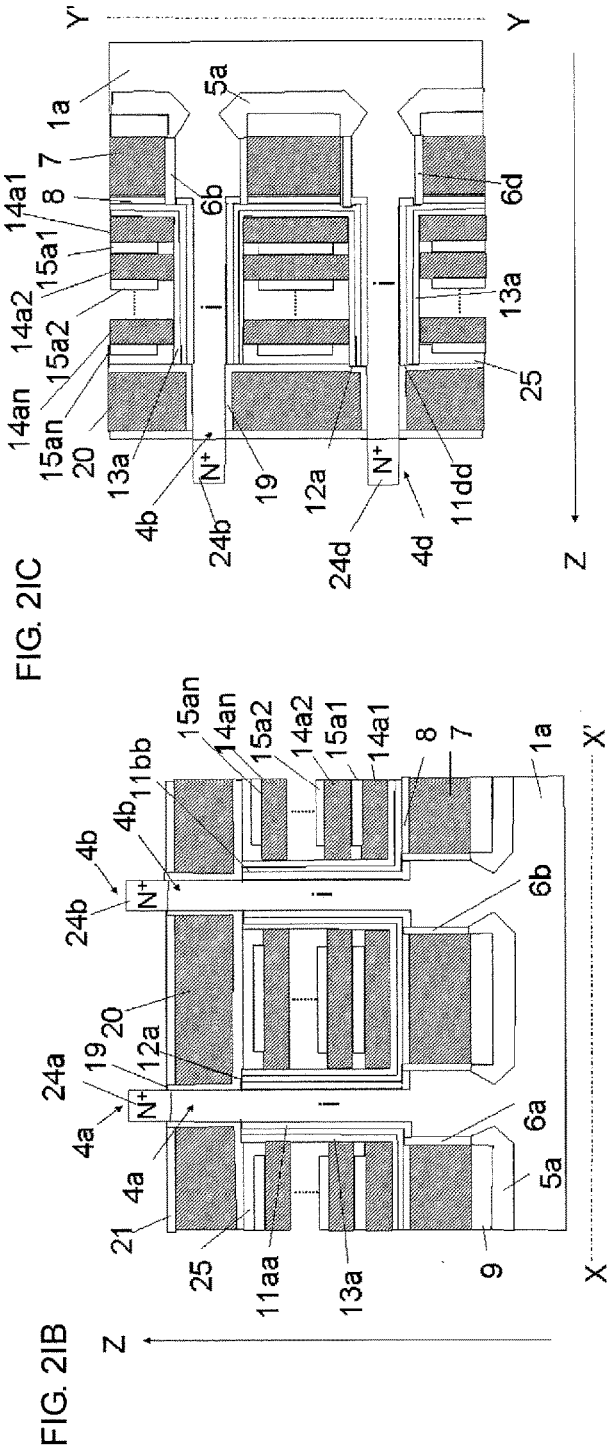
Figure 21C:
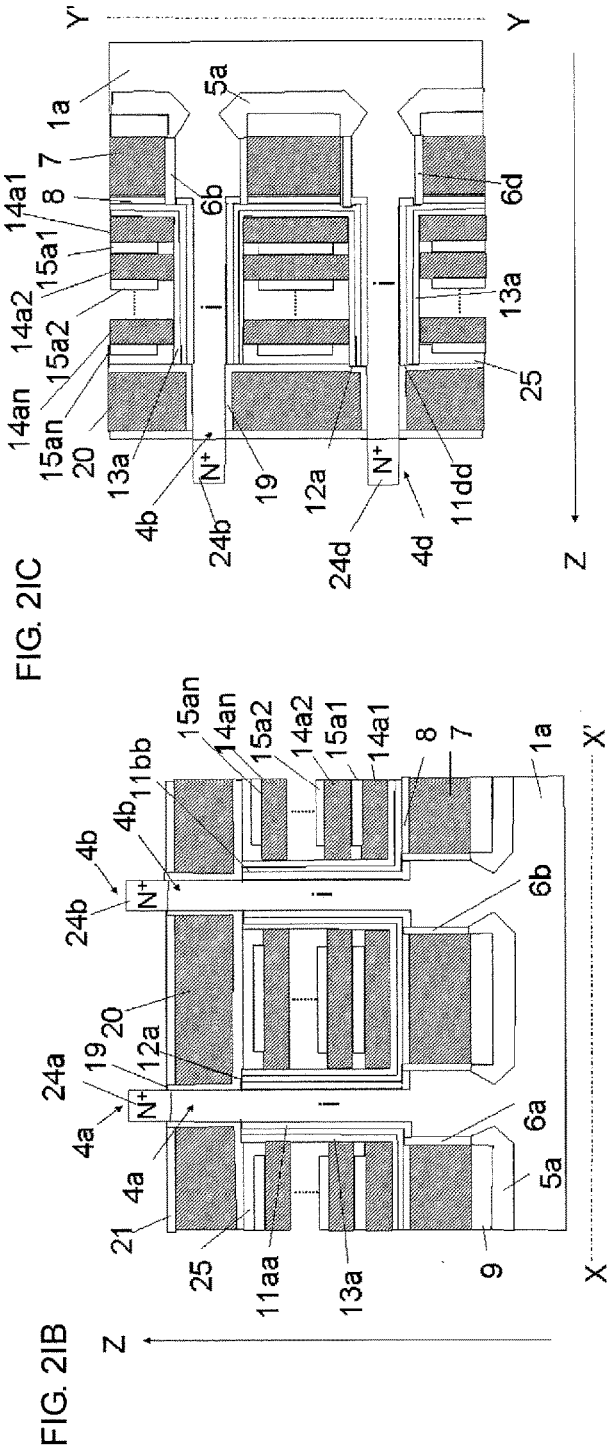

Next, as illustrated in FIGS. 2GA to 2GD, heat treatment is performed at, for example, 550° C. Consequently, the Ni layer 17a1 is diffused in the doped Si layers 16a11 and 16a12 to form a word-line conductor layer 14a1 which is a nickel silicide layer. In this silicidation step, the volume of the conductor layer 14A1 increases, and the side surface of the conductor layer 14A1 extends in the space 18a. As a result, a word-line conductor layer 14a1 that is in contact with the side surface of the $SiO_2$ layer 13 is formed. Similarly, word-line conductor layers 14a2 and 14an that is in contact with the side surface of the $SiO_2$ layer 13 are formed. As illustrated in FIG. 2GD, a space 18a1 is formed in an outer peripheral portion of the side surface of the $SiO_2$ layer 13 between the word-line conductor layer 14a1 and the word-line conductor layer 14a2. Similarly, a space 18a2 is formed in an outer peripheral portion of the side surface of the $SiO_2$ layer 13 on the word-line conductor layer 14a2. At this time, the conductor layers 14b1, 14b2, l4bn, 14c1, 14c2, 14cn, 14d1, 14d2, 14dn, 14e1, 14e2, and 14en are formed on the Si pillars 4a, 4b, 4c, and 4d so as to extend beyond the outer circumferences of the $SiO_2$ layers 15b1 15b2, 15bn, 15c1, 15c2, 15cn, 15d1, 15d2, 15dn, 15e1, 15e2, and 15en.

Next, as illustrated in FIGS. 2I-IA to 2HC, a $HfO_2$ layer 25 is formed on the outer peripheries of the Si pillars 4a, 4b, 4c, and 4d. Subsequently, the conductor layers 14b1, 14b2, 14bn, 14c1, 14c2, 14cn, 14d1, 14d2, 14dn, 14e1, 14e2, and 14en and the $SiO_2$ layers 15b1, 15b2, 15bn, 15c1, 15c2, 15cn, 15d1, 15d2, 15dn, 15e1, 15e2, and 15en on the Si pillars 4a, 4b, 4c, and 4d are removed by plasma etching using the $HfO_2$ layer 25 as a mask. The $SiO_2$ layers 1 1a, 11b, 11c, and 11d, the $Si_3N_4$ layer 12, and the $SiO_2$ layer 13 that are located above the upper surface of the $HfO_2$ layer 25 and that cover the Si pillars 4a, 4b, 4c, and 4d are removed. The $Si_3N_4$ layers 2a, 2b, 2c, and 2d are then removed. As a result, the upper ends of $SiO_2$ layers 11aa, 11lbb, 11cc, and 11dd, a $Si_3N_4$ layer 12a, and a $SiO_2$ layer 13a that surround the Si pillars 4a, 4b, 4c, and 4d are substantially flush with the upper surfaces of the $HfO_2$ layer 25 located on the outer peripheries of the Si pillars 4a, 4b, 4c, and 4d (the $SiO_2$ layer llcc is not illustrated in the figures).

Next, as illustrated in FIGS. 2IA to 2IC, a $HfO_2$ layer 19 is formed so as to cover the upper surface of the $HfO_2$ layer 25 and top portions of the Si pillars 4a, 4b, 4c, and 4d. Subsequently, a doped Si layer 20 and a $SiO_2$ layer 21 are formed by, for example, a bias sputtering method. The doped Si layer and the $SiO_2$ layer that are formed on the Si pillars 4a, 4b, 4c, and 4d in this step are then removed (not illustrated). The $HfO_2$ layer 19 disposed on top portions of the Si pillars 4a, 4b, 4c, and 4d is then removed. Subsequently, N⁺ layers 24a, 24b, 24c, and 24d (the N⁺ layer 24c is not illustrated in the figures) are formed in the top portions of the Si pillars 4a, 4b, 4c, and 4d by, for example, arsenic (As) ion implantation.

Figure 2J:
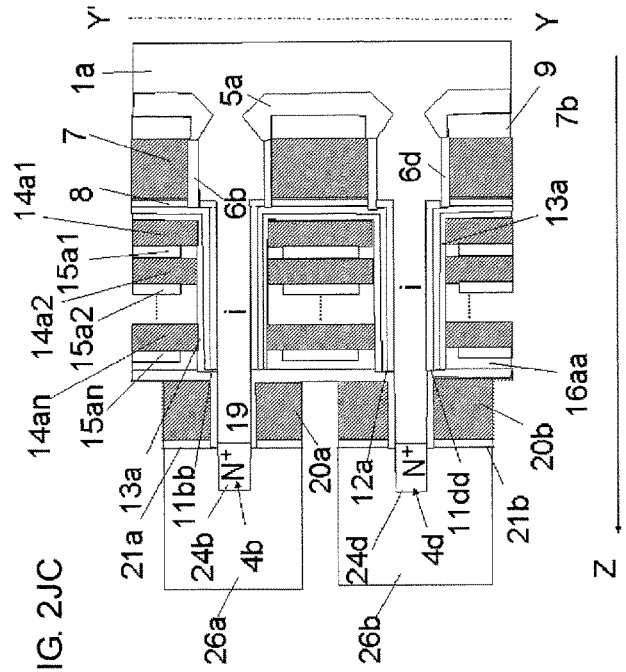
FIG. 2JA and FIGS. 2JB and 2JC are respectively a plan view and sectional structural views illustrating a vertical NAND-type flash memory device according to the first embodiment and a method for producing the device.
Figure 2J:
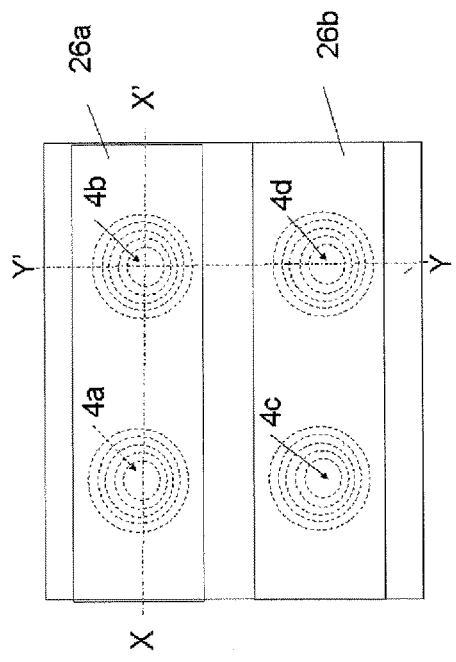
Figure 2J:
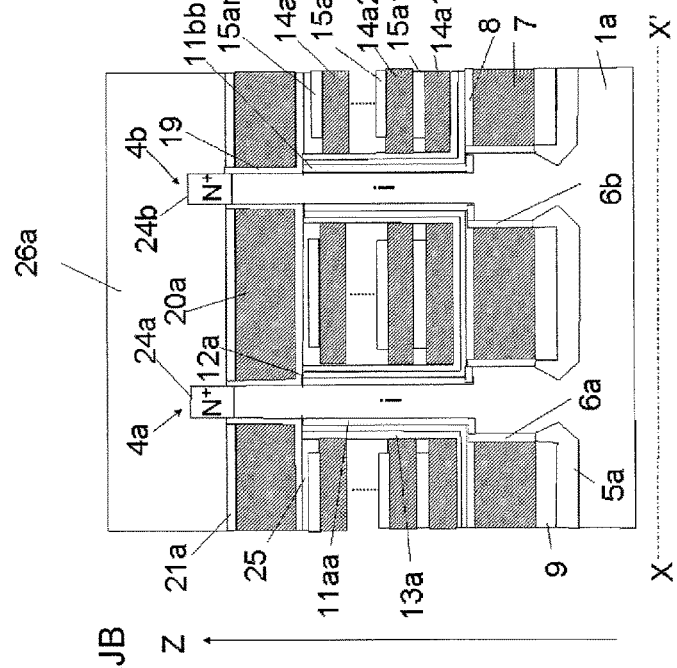

Next, as illustrated in FIGS. 2JA to 2JC, resist layers 26a and 26b extending in the lateral direction in FIG. 2JA so as to cover the Si pillars 4a, 4b, 4c, and 4d are formed by lithography. The resist layer 26a covers the Si pillars 4a and 4b and extends in the lateral direction as illustrated in FIG. 2JA. The resist layer 26b covers the Si pillars 4c and 4d and extends in the lateral direction as illustrated in FIG. 2JA. Subsequently, the $SiO_2$ layer 21 and the doped Si layer 20 are etched from the upper surface by RIE using the resist layers 26a and 26b as a mask. As a result, a $SiO_2$ layer 21a and a doped Si layer 20a are formed under the resist layer 26a. At the same time, a $SiO_2$ layer 21b and a doped Si layer 20b are formed under the resist layer 26b. The resist layers 26a and 26b are then removed.

Next, as illustrated in FIGS. 2KA to 2KC, a $SiO_2$ layer 28 is deposited by chemical vapor deposition (CVD) over the entire surface, and contact holes 29a, 29b, 29c, and 29d are formed on the Si pillars 4a, 4b, 4c, and 4d, respectively. Subsequently, metal wiring layers 30a and 30b that are connected to the N⁺ layers 24a, 24b, 24c, and 24d through the contact holes 29a, 29b, 29c, and 29d are formed so as to extend in a longitudinal direction, as illustrated in FIG. 2KA. The metal wiring layer 30a is connected to the N⁺ layers 24a and 24c (the N⁺ layer 24c is not illustrated in the figures) that are respectively formed on the Si pillars 4a and 4c. The metal wiring layer 30b is connected to the N⁺ layers 24b and 24d that are respectively formed on the Si pillars 4b and 4d. A vertical NAND-type flash memory device is formed as described above.

In FIGS. 2KA to 2KC, the N⁺ layer 5a functions as a common source, the doped Si layer 7 functions as a source-side selection line, the word-line conductor layers 14a1, 14a2, and 14an function as word lines, the doped Si layers 20a and 20b function as drain-side selection lines, the N⁺ layers 24a, 24b, 24c, and 24d function as drains, and the metal wiring layers 30a and 30b function as bit lines. The $SiO_2$ layers 11aa, 11bb, 11cc, and 11dd function as tunnel insulating layers. The $Si_3N_4$ layer 12a functions as a data charge storage insulating layer. The $SiO_2$ layer 13a functions as an interlayer insulating layer. In this embodiment, the word-line conductor layers 14a1, 14a2, and 14an that are in contact with the side surface of the $SiO_2$ layer 13a, which functions as an interlayer insulating layer, are separated from each other by the $SiO_2$ layers 15a1, 15a2, and 15an and the spaces 18a1 and 18a2. As illustrated in FIGS. 2KA to 2KC, the $SiO_2$ layers 15a1, 15a2, and 15an are separated from the side surface of the $SiO_2$ layer 13a in such a manner that a distance from the side surface of the $SiO_2$ layer 13a (first interlayer insulating layer) to the side surfaces of the $SiO_2$ layers 15a1, 15a2, and 15an facing the side surface of the $SiO_2$ layer 13a is larger than a distance from the side surface of the $SiO_2$ layer 13a to the side surfaces of the word-line conductor layers 14a1, 14a2, and 14an facing the side surface of the $SiO_2$ layer 13a. In this embodiment, protruding portions of the word-line conductor layers 14a1, 14a2, and 14an protruding to the side surface of the $SiO_2$ layer 13a are in contact with the $SiO_2$ layer 13a. The length of each of the protruding portions of the word-line conductor layers 14a1, 14a2, and 14an in the vertical direction is less than the thickness of each of the word-line conductor layers 14a1, 14a2, and 14an. The protruding portions of the word-line conductor layers 14a1, 14a2, and 14an protruding from the $SiO_2$ layers 15a1, 15a2, and 15an to the side surface of the $SiO_2$ layer 13a may be separated from the $SiO_2$ layer 13a with a distance therebetween without being in contact with the $SiO_2$ layer 13a as long as the distance from the side surface of the $SiO_2$ layer 13a (first interlayer insulating layer) to the side surfaces of the $SiO_2$ layers 15a1, 15a2, and 15an facing the side surface of the $SiO_2$ layer 13a is larger than the distance from the side surface of the $SiO_2$ layer 13a to the side surfaces of the word-line conductor layers 14a1, 14a2, and 14an facing the side surface of the $SiO_2$ layer 13a.

According to the first embodiment, the following advantages are achieved.

1. As illustrated in FIGS. 2KA to 2KC, protruding portions of the word-line conductor layers 14a1, 14a2, and 14an, the protruding portions respectively protruding from the $SiO_2$ layers 15a1, 15a2, and 15an to the side surface of the $SiO_2$ layer 13a, are in contact with the $SiO_2$ layer 13a. In this embodiment, the length of each of the protruding portions of the word-line conductor layers 14a1, 14a2, and 14an in the vertical direction is less than the thickness of each of the word-line conductor layers 14a1, 14a2, and 14an. Therefore, data charges injected in the $Si_3N_4$ layer 12a concentrate on a surface layer portion of the $Si_3N_4$ layer 12a, the surface layer portion facing the side surfaces of the word-line conductor layers 14a1, 14a2, and 14an that are in contact with the $SiO_2$ layer 13a. Accordingly, it is possible to suppress the data charges injected in the $Si_3N_4$ layer 12a from leaking to portions of the $Si_3N_4$ layer 12a, the portions being in contact with the word-line conductor layers 14a1, 14a2, and 14an adjacent to each other in the vertical direction. In addition, the resistance of the word-line conductor layers 14a1, 14a2, and 14an can be reduced by the silicidation of the doped Si layers 16a11, 16a12, 16a21, and 16a22.

2. As illustrated in FIGS. 2GA to 2GF and FIGS. 2KA to 2KC, the spaces 18a1 and 18a2 are formed on the outer peripheries of the side surface of the $SiO_2$ layer 13a between the word-line conductor layers 14a1, 14a2, and 14an. The spaces 18a1 and 18a2 are gas layers formed of air or the like, and are insulating layers that do not have a trap level, which may cause a leak current. This structure reduces leakage of data charges injected in the $Si_3N_4$ layer 12a into the adjacent word-line conductor layers 14a1, 14a2, and 14an.

3. As illustrated in FIGS. 2FA to 2FD, after the $SiO_2$ layers 11a, 11b, 11c, and 11d functioning as tunnel insulating layers, the $Si_3N_4$ layer 12 functioning as a data charge storage insulating layer, and the $SiO_2$ layer 13 functioning as an interlayer insulating layer are formed so as to surround the Si pillars 4a, 4b, 4c, and 4d, conductor materials (Ni atoms and Si atoms) and a $SiO_2$ material are incident in a direction perpendicular to the surface of the i-layer substrate 1a by a bias sputtering method. Thus, the word-line conductor layers 14a1, 14a2, and 14an and the $SiO_2$ layers 15a1, 15a2, and 15an are formed on outer peripheries of the Si pillars 4a, 4b, 4c, and 4d. In this case, since the $Si_3N_4$ layers 2a, 2b, 2c, and 2d function as a mask, Ni atoms, which are conductor material atoms, and $SiO_2$ material atoms, the atoms being incident in a direction perpendicular to the surface of the i-layer substrate 1a, are not incident on the surface of the $SiO_2$ layer 13 disposed on the side surfaces of the Si pillars 4a, 4b, 4c, and 4d. Therefore, the $SiO_2$ layers 11a, 11b, 11c, and 11d functioning as tunnel insulating layers, the $Si_3N_4$ layer 12 functioning as a data charge storage insulating layer, and the $SiO_2$ layer 13 functioning as an interlayer insulating layer are not damaged by the incidence of conductor material atoms (Ni atoms and Si atoms)

and SiO$_2$ material atoms. As a result, defects generated in the SiO$_2$ layers 11a, 11b, 11c, and 11d, the Si$_3$N$_4$ layer 12, and the SiO$_2$ layer 13 can be reduced to improve the reliability of memory characteristics.

4. The spaces 18a, 18b, 18c, and 18d are sealed by the word-line conductor layers 14a1, 14a2, and 14an, and the Si pillars 4a, 4b, 4c, and 4d are supported by the word-line conductor layers 14a1, 14a2, and 14an. With this structure, it is possible to prevent the occurrence of contamination defects due to a phenomenon in which, in a subsequent cleaning treatment step, a lithography step, and other steps, a treatment liquid enters the spaces 18a, 18b, 18c, and 18d and remains in the spaces without being removed. Furthermore, this structure prevents the Si pillars 4a, 4b, 4c, and 4d from tilting or bending.

In the first embodiment, the word-line conductor layers 14a1, 14a2, and 14an are formed as follows. As illustrated in FIG. 2FD, the conductor layer 14A1 including the Ni layer 17a1 and the doped Si layers 16a12 and 16a11 disposed on and under the Ni layer 17a1, and the conductor layer 14A2 including the Ni layer 17a2 and the doped Si layers 16a22 and 16a21 disposed on and under the Ni layer 17a2 are formed. Subsequently, heat treatment is performed to form the word-line conductor layers 14a1 and 14a2 that are in contact with the SiO$_2$ layer 13, as illustrated in FIG. 2GD. Alternatively, the word-line conductor layers 14a1, 14a2, and 14an that are in contact with the SiO$_2$ layer 13 may be formed by forming Ni layers on upper and lower surfaces of a doped Si layer, forming a Ni layer on one of upper and lower surfaces of a doped Si layer, or forming a plurality of Ni layers.

In the first embodiment, the word-line conductor layers 14a1, 14a2, and 14an are formed of a silicide. Alternatively, the word-line conductor layers 14a1, 14a2, and 14an that contact the SiO$_2$ layer 13 may be formed by forming metal layers such as Ti layers or TiN layers as the conductor layers 14A1, 14A2, and 14An, and plastically deforming the metal layers by heat treatment.

Second Embodiment

A method for producing a vertical NAND-type flash memory device according to a second embodiment of the present invention will be described with reference to FIGS. 3A and 3B. The method according to the second embodiment is the same as that according to the first embodiment except for steps described with reference to FIGS. 3A and 3B.

Figure 3A:
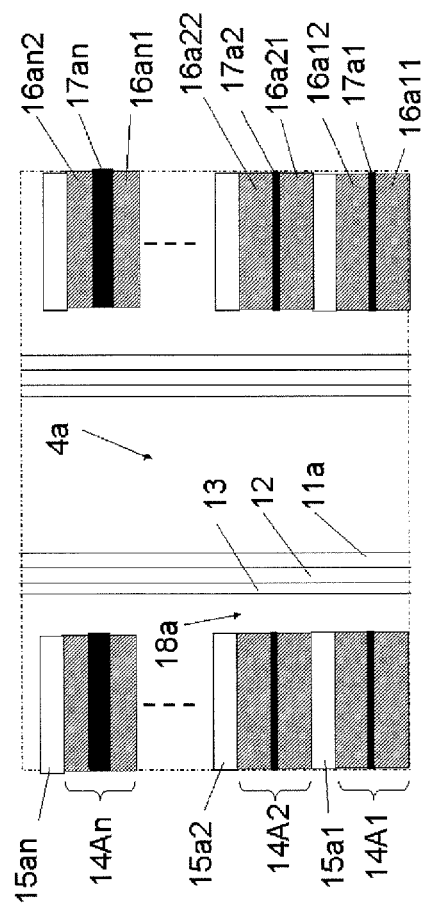
FIGS. 3A and 3B are sectional structural views illustrating a method for producing a vertical NAND-type flash memory device according to a second embodiment of the present invention.

As illustrated in FIG. 3A, in the step illustrated in FIGS. 2FA to 2FD, a SiO$_2$ layer 11a functioning as a tunnel insulating layer, a Si$_3$N$_4$ layer 12, and a SiO$_2$ layer 13 are formed so as to surround a Si pillar 4a. Subsequently, conductor layers 14A1, 14A2, and 14An and SiO$_2$ layers 15a1, 15a2, and 15an that are stacked in the vertical direction are formed at a position separated from the SiO$_2$ layer 13 with a space 18a therebetween. The conductor layer 14A1 has a structure in which a Ni layer 17a1 is sandwiched between doped Si layers 16a11 and 16a12. The conductor layer 14A2 has a structure in which a Ni layer 17a2 is sandwiched between doped Si layers 16a21 and 16a22. The conductor layer 14An disposed on the upper end has a structure in which a Ni layer 17an is sandwiched between doped Si layers 16an1 and 16an2. In this embodiment, the Ni layer 17an disposed on the upper end is formed so as to have a thickness larger than that of each of the Ni layers 17a1 and 17a2 disposed below the Ni layer 17an.

Figure 3B:
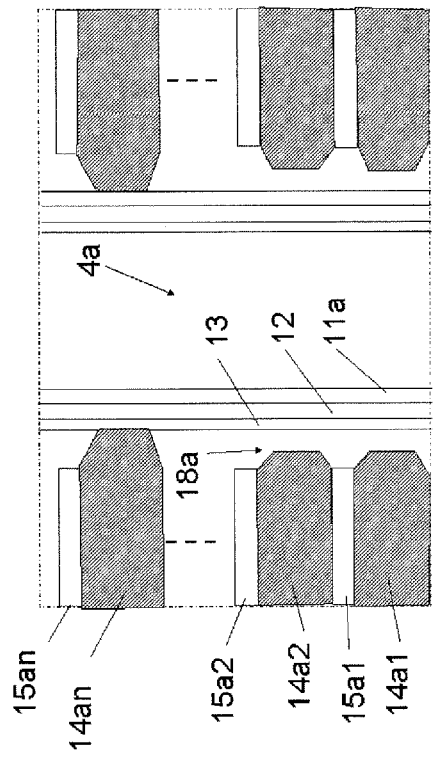

Next, as illustrated in FIG. 3B, heat treatment is performed at, for example, 550° C., so that Ni atoms of the Ni layers 17a1, 17a2, and 17an are diffused in the doped Si layers 16a11, 16a12, 16a21, 16a22, 16an1, and 16an2 to form a silicide. Thus, word-line conductor layers 14a1, 14a2, and 14an are formed. In this embodiment, by forming the Ni layer 17an so as to have a thickness larger than that of each of the Ni layers 17a1 and 17a2, the word-line conductor layer 14an subjected to silicidation is brought into contact with the side surface of the SiO$_2$ layer 13 whereas the word-line conductor layers 14a1 and 14a2 subjected to silicidation are formed to be separated from the side surface of the SiO$_2$ layer 13 with a space therebetween. Consequently, the space 18a is sealed by the word-line conductor layer 14an. This sealing of the space is similarly caused in spaces surrounding the Si pillars 4b, 4c, and 4d.

According to the second embodiment, the word-line conductor layers 14a1 and 14a2 and the interlayer insulating SiO$_2$ layers 15a1 and 15a2 are not in contact with the side surface of the SiO$_2$ layer 13 surrounding the Si pillar 4a. This structure prevents a stress from transmitting from the word-line conductor layers 14a1 and 14a2 and the SiO$_2$ layers 15a1 and 15a2 to the SiO$_2$ layers 11a functioning as a tunnel insulating layer, the Si$_3$N$_4$ layer 12 functioning as a data charge storage insulating layer, and the SiO$_2$ layer 13 functioning as an interlayer insulating layer. As a result, defects generated in the SiO$_2$ layer 11a, the Si$_3$N$_4$ layer 12, and the SiO$_2$ layer 13 can be reduced to improve the reliability of memory characteristics. This advantage is also obtained in the spaces 18b, 18c, and 18d surrounding the Si pillars 4b, 4c, and 4d, respectively. In addition, the resistance of the word-line conductor layers 14a1 and 14a2 can be reduced by the silicidation.

In the second embodiment, as illustrated in FIG. 3A, the Ni layer 17an disposed on the upper end of the Si pillar 4a is formed so as to have a thickness larger than that of each of the Ni layers 17a1 and 17a2 disposed below the Ni layer 17an. With this structure, the word-line conductor layer 14an subjected to silicidation is formed to be in contact with the side surface of the SiO$_2$ layer 13, whereas the word-line conductor layers 14a1 and 14a2 subjected to silicidation are formed to be separated from the side surface of the SiO$_2$ layer 13 with a space therebetween. Alternatively, the doped Si layers 16an1 and 16an2 disposed on the upper end of the Si pillar 4a may be formed so as to have thicknesses larger than those of the doped Si layers 16a11, 16a12, 16a21, and 16a22 disposed below the doped Si layers 16an1 and 16an2. With this structure, the word-line conductor layer 14an subjected to silicidation may be formed to be in contact with the side surface of the SiO$_2$ layer 13, whereas the word-line conductor layers 14a1 and 14a2 subjected to silicidation may be formed to be separated from the side surface of the SiO$_2$ layer 13 with a space therebetween.

In the second embodiment, the memory cell-transistor WT1n including the word-line conductor layer 14an that is in contact with the side surface of the SiO$_2$ layer 13 is preferably used as a dummy cell-transistor.

Third Embodiment

A method for producing a vertical NAND-type flash memory device according to a third embodiment of the present invention will be described with reference to FIGS. 4A and 4B. The method according to the third embodiment is the same as that according to the first embodiment except for steps described with reference to FIGS. 4A and 4B.

Figure 4A:
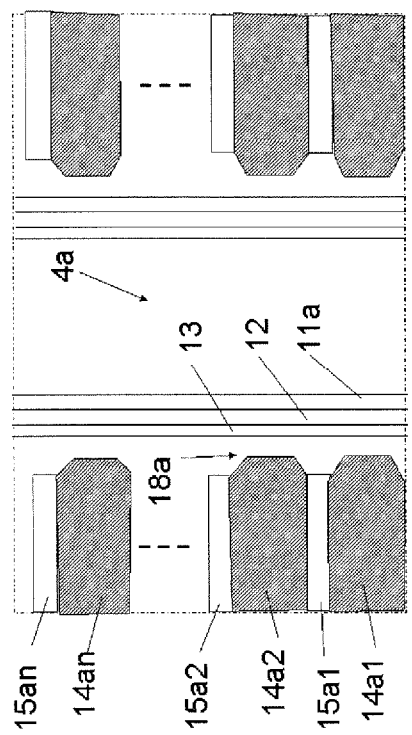
FIGS. 4A and 4B are sectional structural views illustrating a vertical NAND-type flash memory device according to a third embodiment of the present invention and a method for producing the device.

After the conductor layers 14A1, 14A2, and 14An and the SiO$_2$ layers 15a1, 15a2, and 15an are formed in the step illustrated in FIGS. 2FA to 2FD, as illustrated in FIG. 4A, heat treatment is performed at, for example, 550° C., so that Ni atoms of the Ni layers 17a1, 17a2, and 17an are diffused in the doped Si layers 16a11, 16a12, 16a21, 16a22, 16an1, and 16an2. Thus, word-line conductor layers 14a1, 14a2, and 14an subjected to silicidation are formed. The word-line conductor layers 14a1, 14a2, and 14an obtained as a result of the silicidation are formed so that the side surfaces thereof are separated from the side surface of the SiO$_2$ layer 13 with a space therebetween.

Figure 4B:
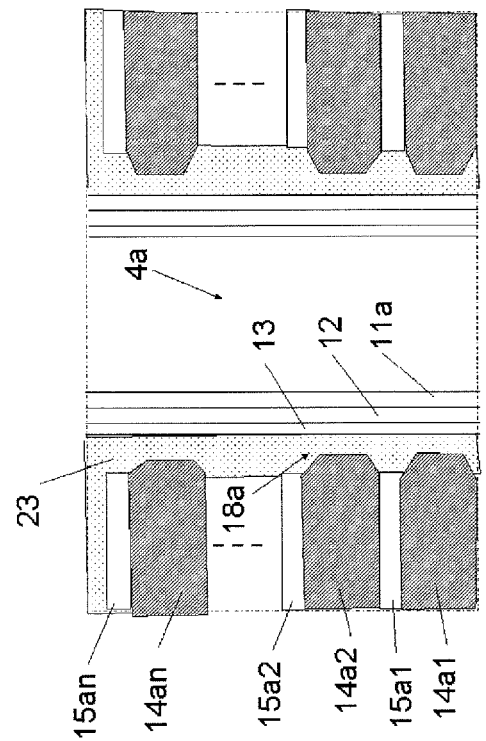

Next, as illustrated in FIG. 4B, a HfO$_2$ layer 23 is formed in the space 18a and on the upper surface of the SiO$_2$ layer 15an by, for example, ALD.

According to the third embodiment, the following advantages are achieved.

1. The space 18a is sealed by the HfO$_2$ layer 23, and the Si pillar 4a is supported by the HfO$_2$ layer 23. With this structure, it is possible to prevent the occurrence of contamination defects due to a phenomenon in which, in a subsequent cleaning treatment step, a lithography step, and other steps, a treatment liquid enters the space 18a and remains in the space without being removed. Furthermore, this structure prevents the Si pillar 4a from tilting or bending. These advantages are also similarly obtained in the Si pillars 4b, 4c, and 4d.

2. The degree of expansion of the word-line conductor layers 14a1, 14a2, and 14an toward the side surface of the SiO$_2$ layer 13, the expansion being due to silicidation, is high in central portions of the word-line conductor layers 14a1, 14a2, and 14an in the height direction. Accordingly, data charges injected in the Si$_3$N$_4$ layer 12a concentrate in surface layer portions of the Si$_3$N$_4$ layer 12a, the surface layer portions facing the central portions of the side surfaces of the word-line conductor layers 14a1, 14a2, and 14an in the height direction. Thus, it is possible to suppress the data charges injected in the Si$_3$N$_4$ layer 12a from diffusing in the Si$_3$N$_4$ layer 12a and leaking to portions of the Si$_3$N$_4$ layer 12a, the portions facing the word-line conductor layers 14a1, 14a2, and 14an adjacent to each other in the vertical direction.

Fourth Embodiment

A method for producing a vertical NAND-type flash memory device according to a fourth embodiment of the present invention will be described with reference to FIGS. 5A to 5C. The method according to the fourth embodiment is the same as that according to the first embodiment except for a step described with reference to FIGS. 5A to 5C.

As illustrated in FIGS. 5A to 5C, as in the step illustrated in FIGS. 2FA to 2FD, conductor material atoms and SiO$_2$ material atoms are allowed to be incident in a direction perpendicular to an upper surface of an i-layer substrate 1a by, for example, a bias sputtering method to form word-line conductor layers 14a1, 14a2, and 14an and SiO$_2$ layers 15a1, 15a2, and 15an on outer peripheries of Si pillars 4a, 4b, 4c, and 4d. Subsequently, heat treatment is performed, for example, at 400° C. in an atmosphere of a gas containing hydrogen (H$_2$). This heat treatment is performed in a state in which hydrogen gas fills upper portions to bottom portions of the spaces 18a, 18b, 18c, and 18d. Subsequently, the steps illustrated in FIGS. 2GA to 2KC are performed.

According to the fourth embodiment, heat treatment is performed in a state in which hydrogen gas fills the upper portions to the bottom portions of the spaces 18a, 18b, 18c, and 18d. Therefore, hydrogen ions easily diffuse in a SiO$_2$ layer 13 functioning as an interlayer insulating layer, and uncombined hands (dangling bonds) in the SiO$_2$ layer 13 are inactivated. Consequently, insulating properties of the SiO$_2$ layer 13 improve, and the reliability of memory characteristics improves.

Fifth Embodiment

A method for producing a vertical NAND-type flash memory device according to a fifth embodiment of the present invention will be described with reference to FIGS. 6AA to 6CC. In the fifth embodiment, the shape of a material layer deposited by a bias sputtering method will also be described.

Figure 6A:
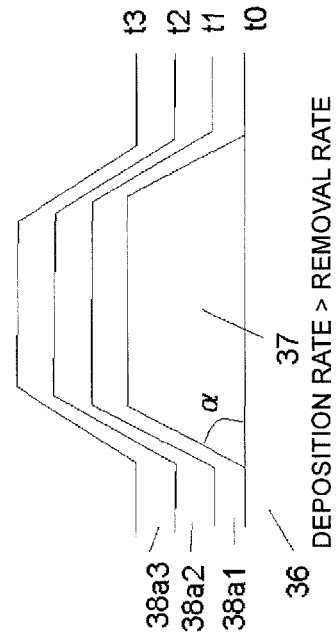
FIGS. 6AA to 6AD are views for illustrating a deposited shape when material atoms are deposited on a pillar having a trapezoidal cross section and formed on a substrate by a bias sputtering method, according to a fifth embodiment of the present invention.
Figure 6A:
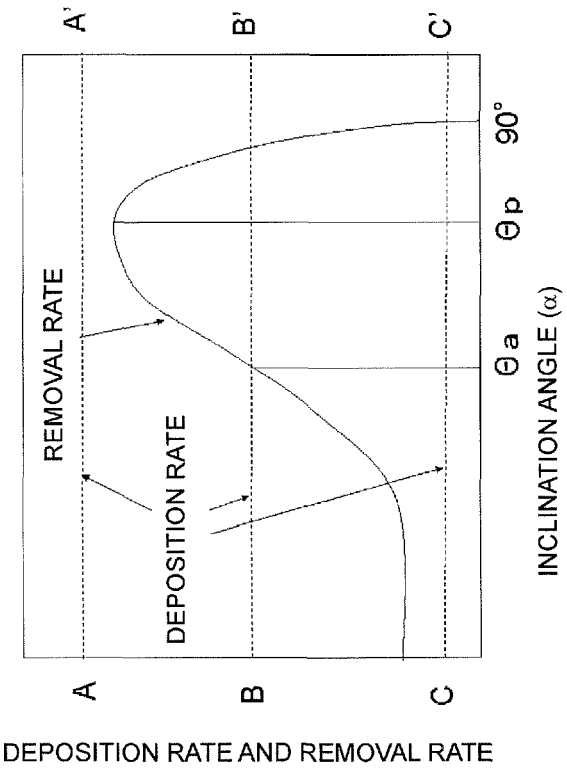
Figure 6A:
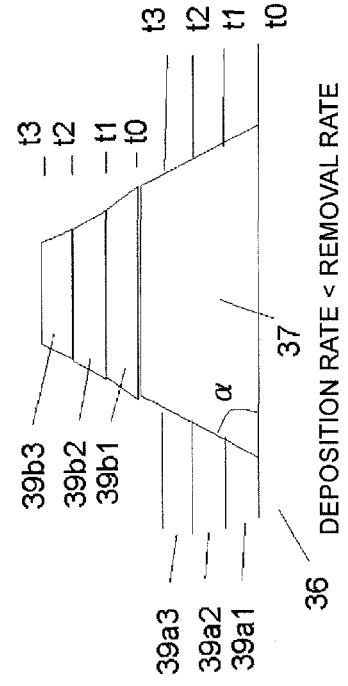
Figure 6A:
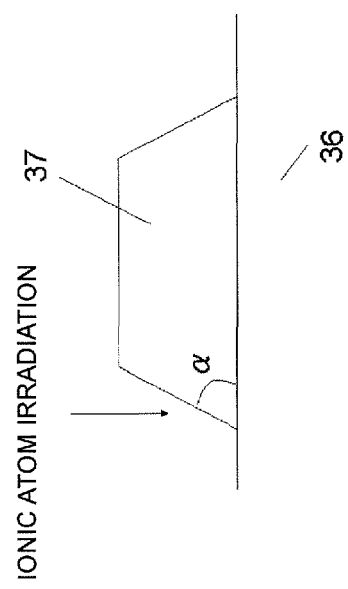

FIGS. 6AA to 6AD illustrate a change with time in a material layer deposited on a truncated cone-shaped pillar 37 formed on a substrate 36, and on the substrate 36 in the outer periphery of the truncated cone-shaped pillar 37, when SiO$_2$ ionic atoms are incident in a direction perpendicular to an upper surface of the substrate 36 using a bias sputtering method (refer to, for example, C. Y. Ting, V. J. Vivalda, and H. G. Schaefer: "Study of planarized sputter-deposited SiO$_2$", J. Vac. Sci. Technol. 15(3), p.p. 1105-1112, May/June (1978), and A. D. G. Stewart, and M. W. Thomson: "Microtopography of Surface Eroded by Ion-Bombardment", Journal of Material Science 4, p.p. 56-69 (1969)).

It is assumed that ionic atoms are incident, from a direction perpendicular to a surface of a substrate 36, on a truncated cone-shaped pillar 37 which is illustrated in FIG. 6AB and whose inclination angle formed by the substrate 36 and a side surface thereof is α (°). In this case, the relationship between the inclination angle α of the side surface of the truncated cone-shaped pillar 37 and a deposition rate of an incident ionic atom material layer on the side surface of the truncated cone-shaped pillar 37, and the relationship between the inclination angle α and a removal rate of the incident ionic atom material layer will be described with reference to FIGS. 6AA to 6AD. The deposition rate depends on the voltage applied between an anode and a cathode in a bias sputtering apparatus and does not depend on the inclination angle α. With an increase in the voltage applied, the deposition rate increases. On the other hand, as illustrated in FIG. 6AA, with an increase in the inclination angle α, the removal rate increases, becomes maximum at an inclination angle α=θp, and then decreases. Here, the inclination angle θp is 70° or more and 80° or less. The reason why the removal rate increases with an increase in the inclination angle α in this manner is as follows. With an increase in the inclination angle α, the length of a path through which an ionic atom enters a material layer that has been deposited increases. In this increased entry path, the opportunity of collision between incident ionic atoms and atoms of the deposited material layer increases, and thus a larger number of atoms of the deposited material layer are released. In contrast, when the inclination angle α exceeds θp, it becomes difficult for ionic atoms to enter a material layer that has been deposited, and a larger number of ionic atoms are reflected at a surface of the deposited material layer. Thus, the opportunity of collision between incident ionic atoms and atoms of the deposited material layer decreases, and the removal rate decreases. As illustrated in FIG. 6AA, in the case of a deposition rate of A-A', the deposition rate is higher than the removal rate without depending on the inclination angle α. In the case of a deposition rate of B-B', at an inclination angle α (α<θa) which is smaller than an inclination angle θa at which the deposition rate is equal to the removal rate, the deposition rate is higher than the removal rate, and at an inclination angle α (α>θa) which is larger than the inclination angle θa, the removal rate is higher than the deposition rate. In the case of a deposition rate of C-C', at almost all inclination angles a, the removal rate is higher than the deposition rate. As illustrated in FIG. 6AC, under a condition in which the deposition rate is higher than the removal rate, deposited material layers 38a1, 38a2, and 38a3 deposited on the truncated cone-shaped pillar 37 and on the substrate 36 located in the outer periphery of the truncated cone-shaped pillar 37 are formed on the substrate 36 and on side surfaces and a top surface of the truncated cone-shaped pillar 37 in a continuous manner with the lapse of time t0 (before the start of deposition), t1, t2, and t3. In contrast, as illustrated in FIG. 6AD, under a condition in which the deposition rate is lower than the removal rate, since the removal rate on the side surfaces of the truncated cone-shaped pillar 37 is high, deposited material layers 39a1, 39a2, and 39a3 deposited on the substrate 36 and deposited material layers 39b1, 39b2, and 39b3 deposited on the truncated cone-shaped pillar 37 are formed to be isolated from each other. Accordingly, the shape of a material layer deposited on the top surface of the truncated cone-shaped pillar 37 and on side surfaces thereof can be changed by variously changing the inclination angle α of the side surfaces of the truncated cone-shaped pillar 37 and changing the setting of the deposition rate.

A method for producing a vertical NAND-type flash memory device according to the fifth embodiment of the present invention will be described with reference to FIGS. 6BA to 6CC. The method according to the fifth embodiment is the same as that according to the first embodiment except for steps described with reference to FIGS. 6BA to 6CC. As illustrated in FIGS. 6BA to 6BC, truncated cone-shaped Si$_3$N$_4$ layers 2A, 2B, 2C, and 2D having side surfaces with an inclination angle of β are formed instead of the Si$_3$N$_4$ layers 2a, 2b, 2c, and 2d that are formed on the Si pillars 4a, 4b, 4c, and 4d, respectively, and illustrated in FIGS. 2EA to 2EC. Subsequently, SiO$_2$ layers 11a, 11b, 11c, and 11d (the SiO$_2$ layer 11c is not illustrated in the figures) which are to become tunnel insulating layers are formed in surface layers of side surfaces of Si pillars 4a, 4b, 4c, and 4d. A Si$_3$N$_4$ layer 12 functioning as a data charge storage insulating layer and a SiO$_2$ layer 13 functioning as an interlayer insulating layer are further formed so as to cover the whole surface.

Next, as illustrated in FIGS. 6CA to 6CC, conductor material atoms (Ni atoms and Si atoms) and SiO$_2$ material atoms are allowed to be incident in a direction perpendicular to a surface of an i-layer substrate 1a by, for example, a bias sputtering method under a condition in which the deposition rate is lower than the removal rate with respect to the inclination angle β of the truncated cone-shaped Si$_3$N$_4$ layers 2A, 2B, 2C, and 2D, as illustrated in FIG. 6AD. Consequently, conductor layers 14A1, 14A2, and 14An and SiO$_2$ layers 15a1, 15a2, and 15an are formed on outer peripheries of the Si pillars 4a, 4b, 4c, and 4d. At the same time, cone-shaped stacked material layers 41a, 41b, 41c, and 41d each having a truncated cone shape and including conductor layers and SiO$_2$ layers that form a multilayer structure are formed on the Si pillars 4a, 4b, 4c, and 4d, respectively. After the shape of each of the cone-shaped stacked material layers 41a, 41b, 41c, and 41d becomes a cone shape, the incident Ni atoms, Si atoms, and SiO$_2$ material atoms are no longer deposited on the cone-shaped stacked material layers 41a, 41b, 41c, and 41d. Accordingly, a height Lb of each of the cone-shaped stacked material layers 41a, 41b, 41c, and 41d is smaller than a thickness La that is the total of the thicknesses of the conductor layers 14A1, 14A2, and 14An and the SiO$_2$ layers 15a1, 15a2, and 15an, all of which are formed around the outer peripheries of the Si pillars 4a, 4b, 4c, and 4d. Subsequently, the steps illustrated in FIGS. 2GA to 2KC are performed.

In the first embodiment, the total of the thicknesses of the conductor layers 14B1, 14B2, 14Bn, 14C1, 14C2, 14Cn, 14D1, 14D2, 14Dn, 14E1, 14E2, and 14En and the SiO$_2$ layers 15b1, 15b2, 15bn, 15c1, 15c2, 15cn, 15d1, 15d2, 15dn, 15e1, 15e2, and 15en, which are formed on the Si pillars 4a, 4b, 4c, and 4d, is substantially equal to the thickness La that is the total of the thicknesses of the conductor layers 14A1, 14A2, and 14An and the SiO$_2$ layers 15a1, 15a2, and 15an. In the case of a large thickness La, defects such as falling and bending of the conductor layers 14B1, 14B2, 14Bn, 14C1, 14C2, 14Cn, 14D1, 14D2, 14Dn, 14E1, 14E2, and 14En, and the SiO$_2$ layers 15b1, 15b2, 15bn, 15c1, 15c2, 15cn, 15d1, 15d2, 15dn, 15e1, 15e2, and 15en are easily generated in a subsequent step such as a cleaning step. In contrast, according to the fifth embodiment, the height Lb of each of the cone-shaped stacked material layers 41a, 41b, 41c, and 41d is smaller than the thickness La of the total of the conductor layers 14A1, 14A2, and 14An and the SiO$_2$ layers 15a1, 15a2, and 15an, all of which are formed around the outer peripheries of the Si pillars 4a, 4b, 4c, and 4d. Accordingly, it is possible to prevent defects such as falling and bending of the cone-shaped stacked material layers 41a, 41b, 41c, and 41d from occurring in a subsequent step such as a cleaning step.

Sixth Embodiment

A method for producing a vertical NAND-type flash memory device according to a sixth embodiment of the present invention will be described with reference to FIGS. 7AA to 7BB. The method according to the sixth embodiment is the same as that according to the first embodiment except for steps described with reference to FIGS. 7AA to 7BB.

As illustrated in FIGS. 7AA to 7AC, truncated cone-shaped Si pillars 4aa, 4bb, 4cc, and 4dd each having a truncated cone shape are respectively formed instead of the Si pillars 4a, 4b, 4c, and 4d, whose inclination angle is perpendicular to an upper surface of the i-layer substrate 1 a. In each of the truncated cone-shaped Si pillars 4aa, 4bb, 4cc, and 4dd, the diameter of a bottom portion is larger than the diameter of a top portion. Next, SiO$_2$ layers 11a, 11b, 11c, and 11d (the SiO$_2$ layer 11c is not illustrated in the figures) functioning as tunnel insulating layers are formed by, for example, a thermal oxidation method in surface layers of the side surfaces of the truncated cone-shaped Si pillars 4aa, 4bb, 4cc, and 4dd. A Si$_3$N$_4$ layer 12 functioning as a data charge storage insulating layer and a SiO$_2$ layer 13 functioning as an interlayer insulating layer are further formed so as to cover the whole surface. In this embodiment, the device is formed such that a diameter Lc of a bottom outer peripheral circle of the SiO$_2$ layer 13 formed around the bottom of each of the truncated cone-shaped Si pillars 4aa, 4bb, 4cc, and 4dd is smaller than a diameter Ld of an outer peripheral circle of the SiO$_2$ layer 13 formed around each of the side surfaces of Si$_3$N$_4$ layers 2a, 2b, 2c, and 2d. As in the structure illustrated in FIGS. 2FA to 2FD, spaces 18a, 18b, 18c, and 18d are formed between side surfaces of the SiO$_2$ layer 13 formed on the side surfaces of the Si pillars 4aa, 4bb, 4cc, and 4dd and surfaces of conductor layers 14A1, 14A2, and 14An and SiO$_2$ layers 15a1, 15a2, and 15an deposited by a bias sputtering method.

Figure 7B:
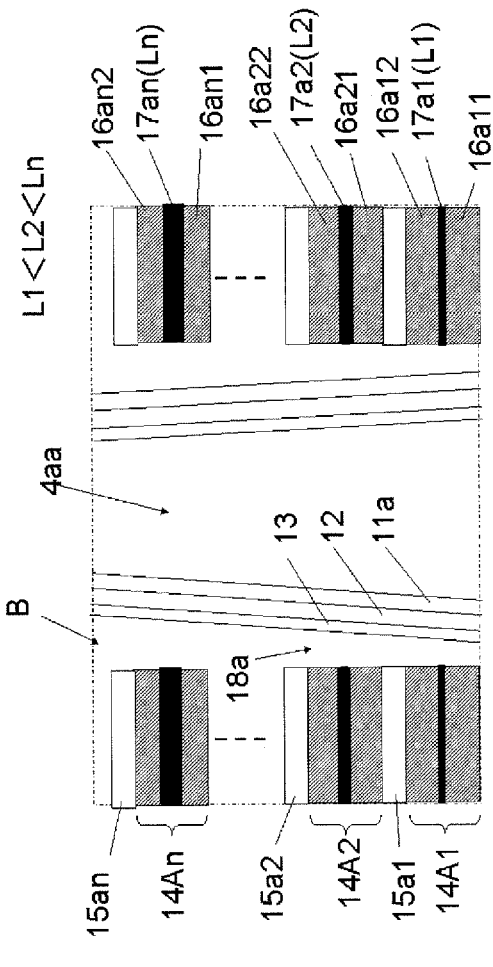
FIGS. 7BA and 7BB are sectional structural views illustrating a vertical NAND-type flash memory device according to the sixth embodiment.
Figure 7B:
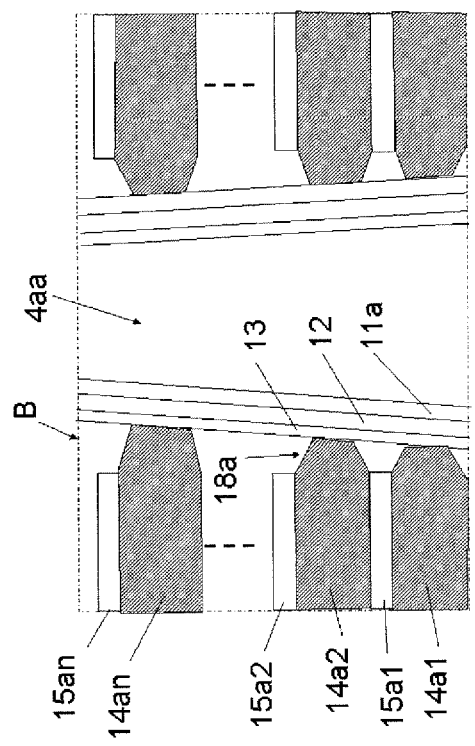

FIG. 7BA is an enlarged view of the area B surrounded by the dashed dotted line in FIG. 7AB. The conductor layer 14A1 has a structure including a nickel (Ni) metal layer 17a1 and doped Si layers 16a12 and 16a11 disposed on and under the Ni layer 17a1. The conductor layer 14A2 has a structure including a Ni layer 17a2 and doped Si layers 16a22 and 16a21 disposed on and under the Ni layer 17a2. The conductor layer 14An has a structure including a Ni layer 17an and doped Si layers 16an2 and 16an1 disposed on and under the Ni layer 17an. This device satisfies a relationship L1<L2<Ln where L1 represents the thickness of the Ni layer 17a1, L2 represents the thickness of the Ni layer 17a2, and Ln represents the thickness of the Ni layer 17an. A Ni layer adjacent to a part of the space 18a, the part having a small width, has a small thickness. A Ni layer adjacent to a part of the space 18a, the part having a large width, has a large thickness.

Next, as illustrated in FIG. 7BB, heat treatment is performed at, for example, 550° C. to perform silicidation of the conductor layers 14A1, 14A2, and 14An as in the step illustrated in FIGS. 2GA to 2GD. Thus, word-line conductor layers 14a1, 14a2, and 14an that are in contact with the side surface of the $SiO_2$ layer 13 are formed. The Ni layer 17a1 having a thickness of L1 has a smaller number of Ni atoms that diffuse in the doped Si layers 16a11 and 16a12 than that of the Ni layer 17a2 having a thickness of L2. Accordingly, the length of a protruding portion of the side surface of the word-line conductor layer 14a1 protruding from the $SiO_2$ layers 15a1, 15a2, and 15an to the side surface of the $SiO_2$ layer 13 is shorter than the length of a protruding portion of the side surface of the word-line conductor layer 14a2 protruding from the $SiO_2$ layers 15a1, 15a2, and 15an to the side surface of the $SiO_2$ layer 13. The Ni layer 17a2 having a thickness of L2 has a smaller number of Ni atoms that diffuse in the doped Si layers 16a21 and 16a22 than that of the Ni layer 17an having a thickness of Ln. Accordingly, the length of the protruding portion of the side surface of the word-line conductor layer 14a2 protruding from the $SiO_2$ layers 15a1, 15a2, and 15an to the side surface of the $SiO_2$ layer 13 is shorter than the length of a protruding portion of the side surface of the word-line conductor layer 14an protruding from the $SiO_2$ layers 15a1, 15a2, and 15an to the side surface of the $SiO_2$ layer 13.

In the sixth embodiment, conductor material atoms and $SiO_2$ material atoms are incident in a direction perpendicular to an upper surface of the i-layer substrate 1a by a bias sputtering method to deposit the conductor layers 14A1, 14A2, and 14An and the $SiO_2$ layers 15a1, 15a2, and 15an on outer peripheries of the truncated cone-shaped Si pillars 4aa, 4bb, 4cc, and 4dd. In this case, as in the spaces 18a, 18b, 18c, and 18d of the first embodiment, spaces are formed between the side surfaces of the truncated cone-shaped Si pillars 4aa, 4bb, 4cc, and 4dd and the side surfaces of the conductor layers 14A1, 14A2, and 14An and the $SiO_2$ layers 15a1, 15a2, and 15an. With this structure, according to the sixth embodiment, the advantages the same as those in the first embodiment are obtained. Furthermore, the following advantages are obtained by changing the length of each of the protruding portions of the side surfaces of the word-line conductor layers 14a1, 14a2, and 14an protruding from the $SiO_2$ layers 15a1, 15a2, and 15an to the side surface of the $SiO_2$ layer 13 in accordance with the width of the space.

1. When the side surfaces of the word-line conductor layers 14a1, 14a2, and 14an are brought into contact with the side surface of the $SiO_2$ layer 13, the stress applied from the side surfaces of the word-line conductor layers 14a1, 14a2, and 14an to the side surface of the $SiO_2$ layer 13 can be made uniform.

2. When the side surfaces of the word-line conductor layers 14a1, 14a2, and 14an are not brought into contact with the side surface of the $SiO_2$ layer 13, a data-writing voltage and a data-erasing voltage applied to the word-line conductor layers 14a1, 14a2, and 14an can be made equal to each other by making the distances between the side surface of the $SiO_2$ layer 13 and the side surfaces of the word-line conductor layers 14a1, 14a2, and 14an equal to each other.

According to the sixth embodiment, the positions of the Ni layers 17a1, 17a2, and 17an in the vertical direction of the conductor layers 14A1, 14A2, and 14An may be higher than the middle positions of the conductor layers 14A1, 14A2, and 14An in accordance with the inclination angle of the truncated cone-shaped Si pillars 4aa, 4bb, 4cc, and 4dd. Consequently, the inclination of the side surfaces of the word-line conductor layers 14a1, 14a2, and 14an can be made equal to the inclination of the side surface of the $SiO_2$ layer 13. Accordingly, when the side surfaces of the word-line conductor layers 14a1, 14a2, and 14an are brought into contact with the side surface of the $SiO_2$ layer 13, the stress applied from the side surfaces of the word-line conductor layers 14a1, 14a2, and 14an to the side surface of the $SiO_2$ layer 13 can be made uniform. On the other hand, when the side surfaces of the word-line conductor layers 14a1, 14a2, and 14an are not brought into contact with the side surface of the $SiO_2$ layer 13, the electric field formed between the side surface of the $SiO_2$ layer 13 and the side surfaces of the word-line conductor layers 14a1, 14a2, and 14an can be made uniform. The shape of each of the Si pillars 4a, 4b, 4c, and 4d is not necessarily a truncated cone shape as described above. The Si pillars may be barrel-shaped Si pillars in which the maximum diameter among the outer peripheral circles of the $SiO_2$ layer 13 in a cross section in the horizontal direction, the $SiO_2$ layer 13 being formed on the outer peripheries of the Si pillars 4a, 4b, 4c, and 4d, is smaller than the diameter of the outer peripheral circle of the $SiO_2$ layer 13 formed on the outer peripheries of the $Si_3N_4$ layers 2a, 2b, 2c, and 2d. Also in such a case, the advantages the same as those in the first embodiment are obtained. When the Si pillars 4a, 4b, 4c, and 4d each have a shape such as a truncated cone shape or a barrel shape, the word-line conductor layers 14a1, 14a2, and 14an are preferably brought into contact with the $SiO_2$ layer 13 with a uniform stress by controlling the thicknesses of the Ni layers 17a1, 17a2, and 17an of the conductor layers 14A1, 14A2, and 14An in accordance with, for example, the width of the spaces 18a, 18b, 18c, and 18d in the horizontal direction to change the lengths of the protruding portions of the side surfaces of the word-line conductor layers 14a1, 14a2, and 14an due to silicidation.

Seventh Embodiment

Figure 8A:
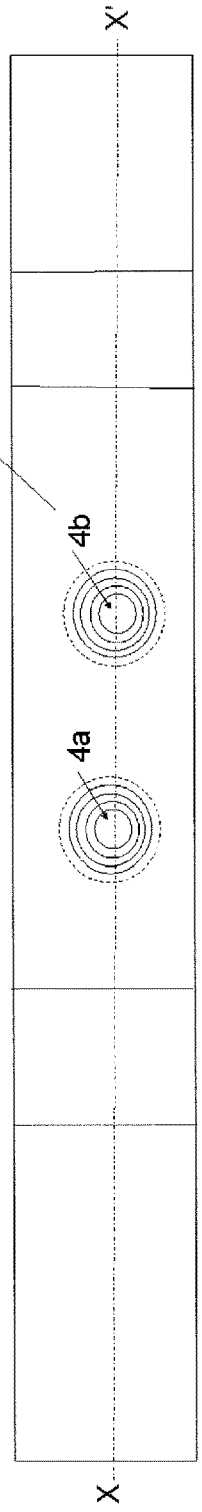
FIGS. 8AA and 8AB are respectively a plan view and a sectional structural view illustrating a vertical NAND-type flash memory device according to a seventh embodiment of the present invention and a method for producing the device.
Figure 8A:
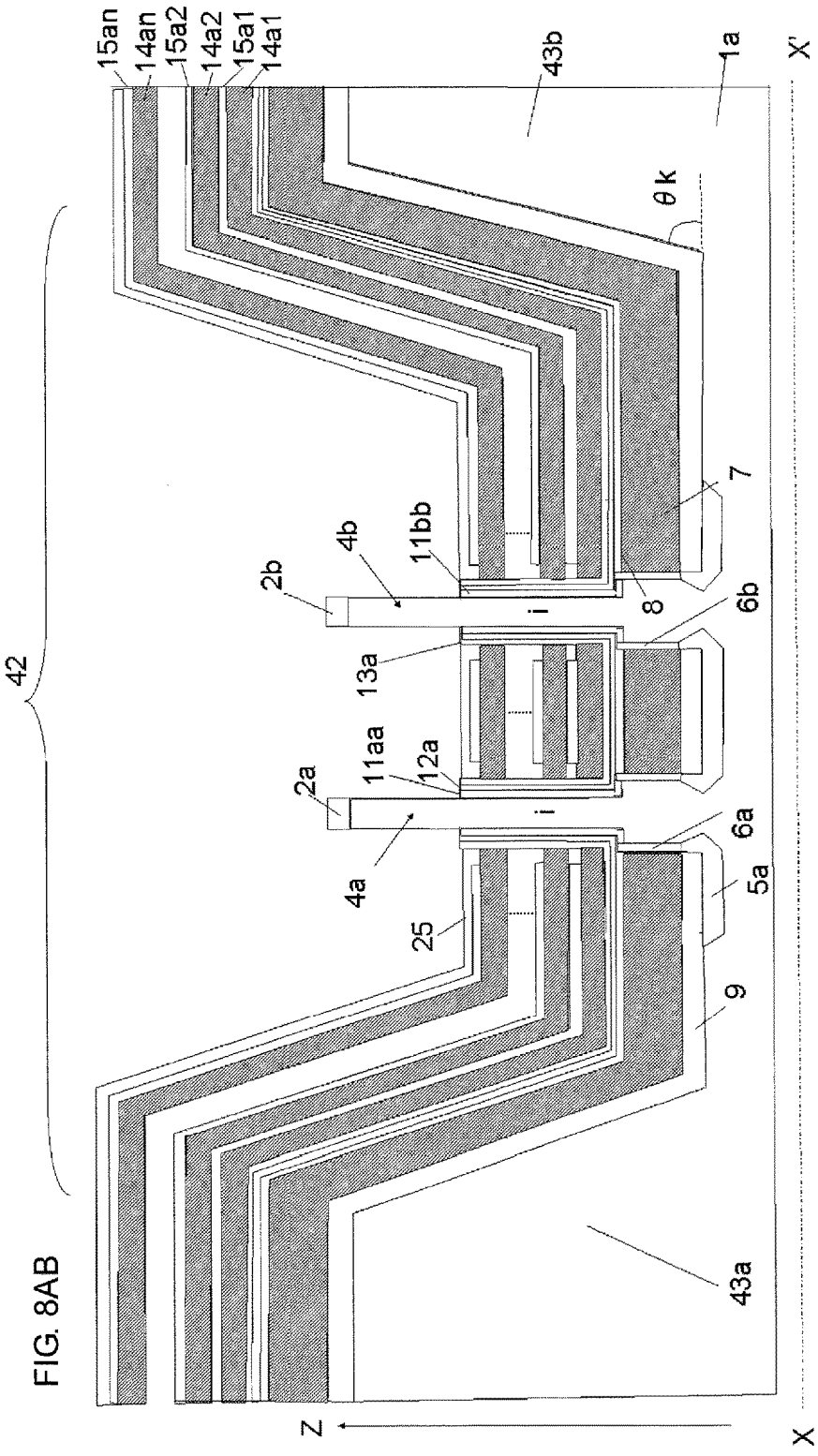

A method for producing a vertical NAND-type flash memory device according to a seventh embodiment of the present invention will be described with reference to FIGS. 8AA to 8GB. In FIGS. 8AA to 8GB, the drawings whose last reference character is A are plan views, and the drawings whose last reference character is B are sectional structural views taken along line X-X' in the drawings whose last reference character is A. Silicon (Si) pillars 4a and 4b correspond to the Si pillars 4a and 4b in FIGS. 2BA to 2KC.

As illustrated in FIGS. 8AA and 8AB, on an outer periphery of a memory element region 42 in which Si pillars 4a and 4b are formed, outer peripheral i-layers 43a and 43b (the outer peripheral i-layers 43a and 43b are connected to each other in the outer periphery of the memory element region 42) that are inclined at an inclination angle θk with respect to an i-layer substrate 1a are formed. Subsequently, the steps illustrated in FIGS. 2CA to 2HC are performed to form an N$^+$ layer 5a, a SiO$_2$ layer 9, SiO$_2$ layers 6a and 6b, a doped Si layer 7, SiO$_2$ layers 11aa and 11bb, a Si$_3$N$_4$ layer 12a, a SiO$_2$ layer 13a, word-line conductor layers 14a1, 14a2, and 14an that are in contact with the side surface of the SiO$_2$ layer 13a, and SiO$_2$ layers 15a1, 15a2, and 15an that are separated from the side surface of the SiO$_2$ layer 13a. Subsequently, a HfO$_2$ layer 25 is formed so as to cover outer peripheries of the Si pillars 4a and 4b. Silicon nitride (Si$_3$N$_4$) layers 2a and 2b are then left on the Si pillars 4a and 4b, respectively. The SiO$_2$ layer 9, the doped Si layer 7, the word-line conductor layers 14a1, 14a2, and 14an, the SiO$_2$ layers 15a1, 15a2, and 15an are formed by, for example, a bias sputtering method by allowing material atoms to be incident in a direction perpendicular to an upper surface of the i-layer substrate 1a. These layers are each deposited by a bias sputtering method under the condition of an inclination angle θk at which the deposition rate is higher than the removal rate, as described with reference to FIG. 6AC. The SiO$_2$ layers 11aa and 11bb, the Si$_3$N$_4$ layer 12a, and the SiO$_2$ layer 13a are formed by ALD. Consequently, the SiO$_2$ layer 9, the doped Si layer 7, the Si$_3$N$_4$ layer 12a, the SiO$_2$ layer 13a, the word-line conductor layers 14a1, 14a2, and 14an, the SiO$_2$ layers 15a1, 15a2, and 15an, and the HfO$_2$ layer 25 are formed in a continuous manner on the outer peripheral i-layers 43a and 43b in the outer peripheries of the Si pillars 4a and 4b.

Figure 8B:
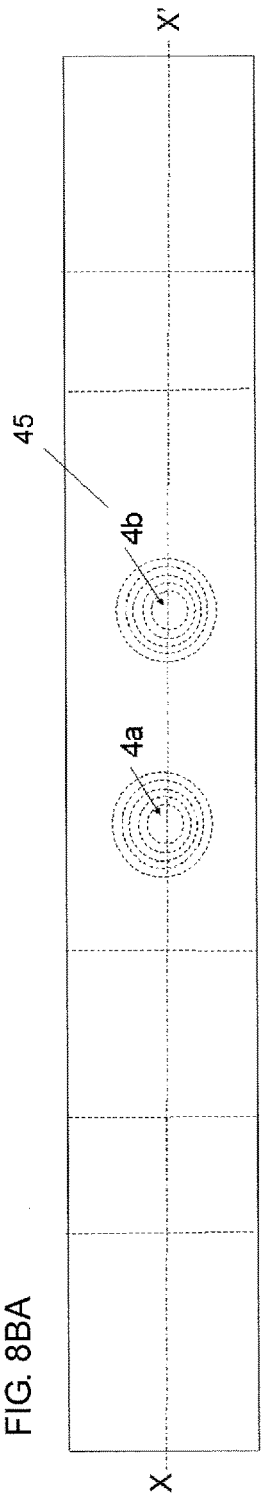
FIGS. 8BA and 8BB are respectively a plan view and a sectional structural view illustrating a vertical NAND-type flash memory device according to the seventh embodiment and a method for producing the device.
Figure 8B:
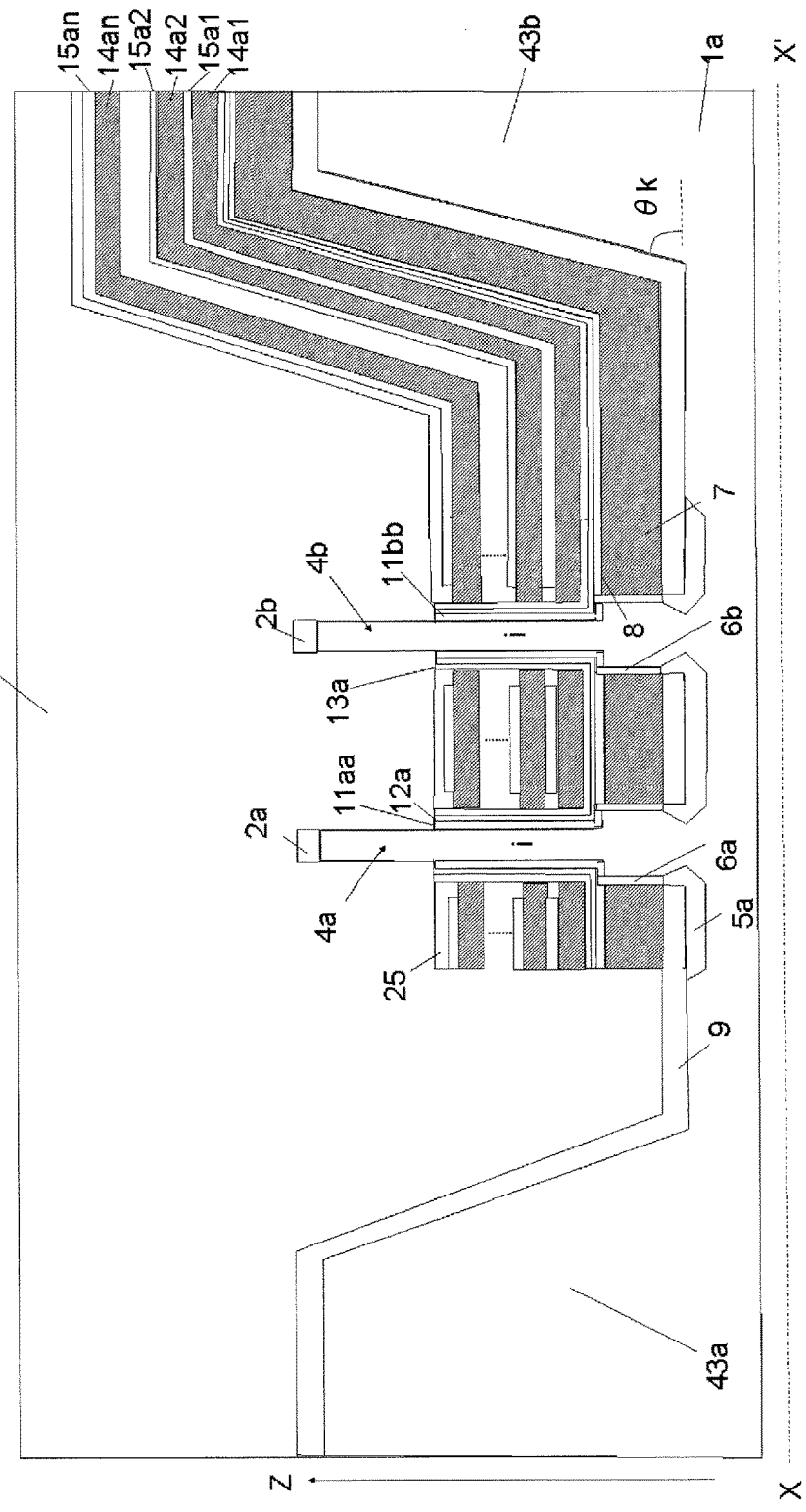

Next, as illustrated in FIGS. 8BA and 8BB, 13a, the word-line conductor layers 14a1, 14a2, and 14an, the SiO$_2$ layers 15a1, 15a2, and 15an, and the HfO$_2$ layer 25 are formed by lithography and RIE in an area including the Si pillars 4a and 4b so as to extend between the Si pillars 4a and 4b and over the doped Si layer 7, the Si$_3$N$_4$ layer 12a, the SiO$_2$ layer outer peripheral i-layer 43b in a continuous manner. A SiO$_2$ layer 45 is deposited by CVD and then planarized by chemical mechanical polishing (CMP). Thus, the SiO$_2$ layer 45 whose upper surface is located higher than an upper surface of the HfO$_2$ layer 25 on the outer peripheral i-layer 43b is formed.

Figure 8C:
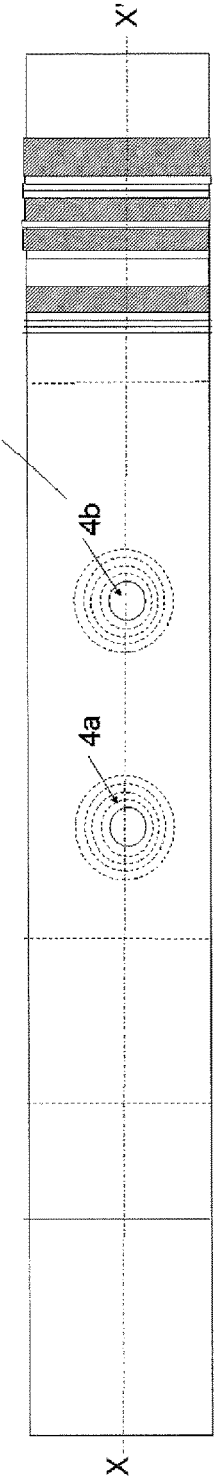
FIGS. 8CA and 8CB are respectively a plan view and a sectional structural view illustrating a vertical NAND-type flash memory device according to the seventh embodiment and a method for producing the device.
Figure 8C:
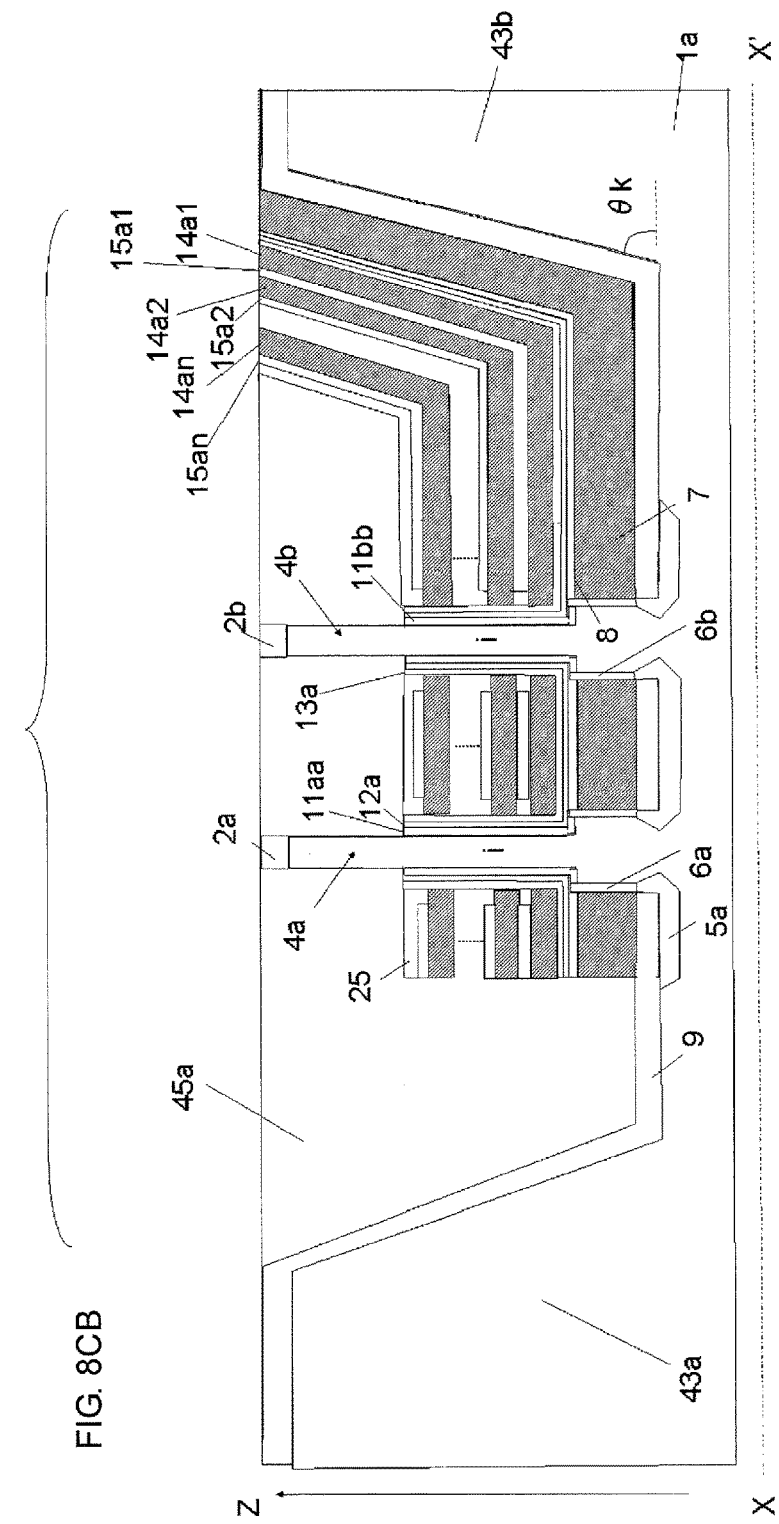

Next, as illustrated in FIGS. 8CA and 8CB, the SiO$_2$ layer 45, the doped Si layer 7, the Si$_3$N$_4$ layer 12a, the SiO$_2$ layer 13a, the word-line conductor layers 14a1, 14a2, and 14an, the SiO$_2$ layers 15a1, 15a2, and 15an, and the HfO$_2$ layer 25 are polished by CMP such that an upper surface thereof has a height substantially equal to that of an upper surface of the SiO$_2$ layer 9 on the outer peripheral i-layers 43a and 43b to planarize the surface. As a result, a SiO$_2$ layer 45a is embedded in the memory element region 42 in a state in which the SiO$_2$ layer 45a surrounds the Si pillars 4a and 4b.

Figure 8D:
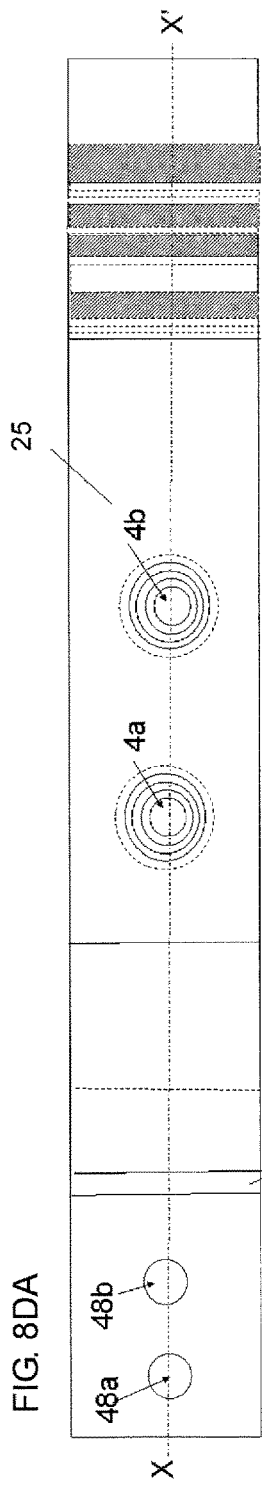
FIGS. 8DA and 8DB are respectively a plan view and a sectional structural view illustrating a vertical NAND-type flash memory device according to the seventh embodiment and a method for producing the device.
Figure 8D:
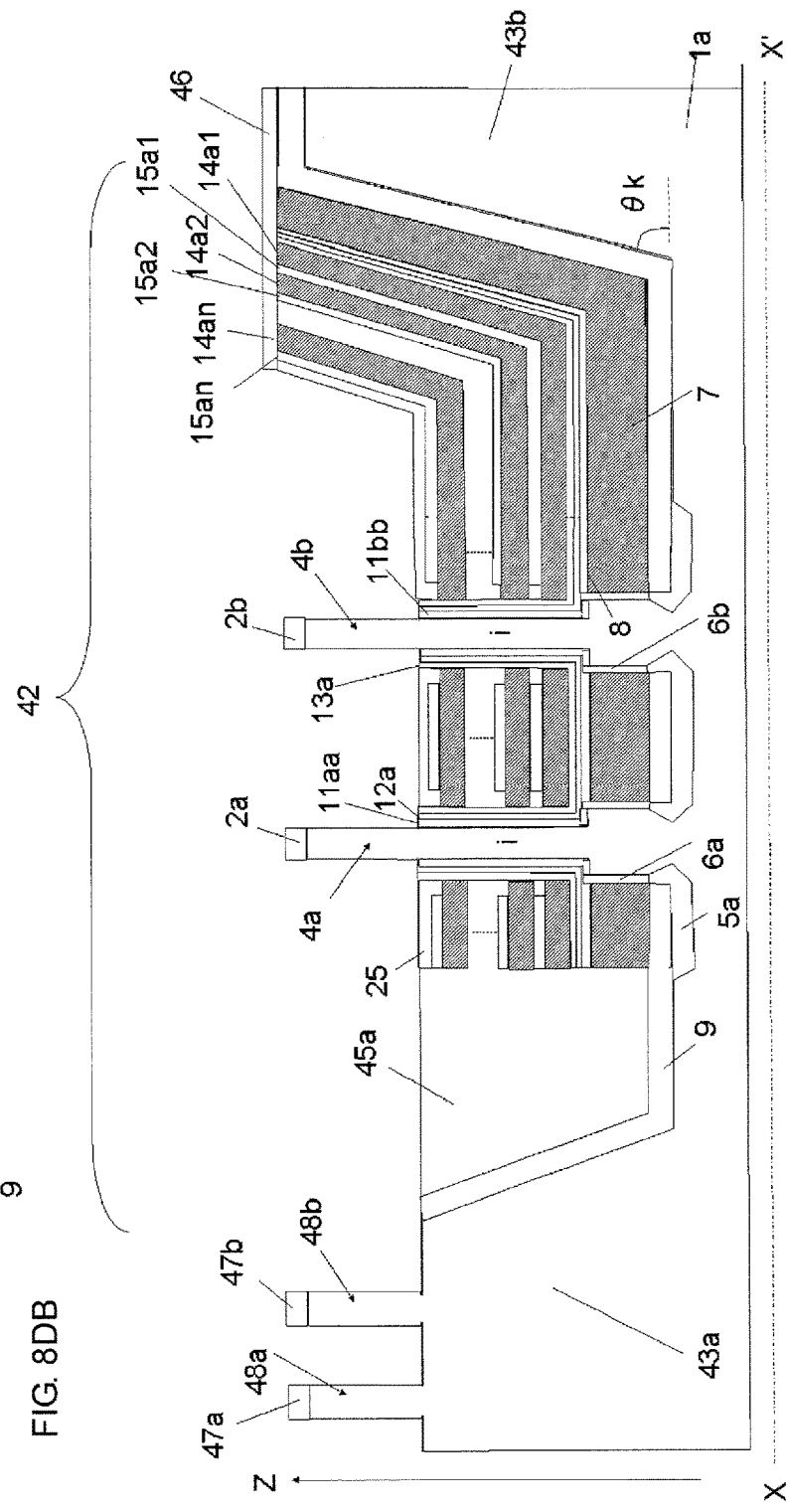

Next, as illustrated in FIGS. 8DA and 8DB, a Si$_3$N$_4$ layer 46 which is an insulating layer is formed on the doped Si layer 7, the Si$_3$N$_4$ layer 12a, the SiO$_2$ layer 13a, the word-line conductor layers 14a1, 14a2, and 14an, the SiO$_2$ layers 15a1, 15a2, and 15an, and the HfO$_2$ layer 25 whose upper surfaces are exposed on the outer peripheral i-layer 43b. Subsequently, the SiO$_2$ layer 9 is etched by lithography and RIE to form SiO$_2$ layers 47a and 47b. Subsequently, the outer peripheral i-layer 43a is etched by, for example, RIE using the SiO$_2$ layers 47a and 47b as a mask to form Si pillars 48a and 48b, respectively, such that bottom surfaces of the Si pillars 48a and 48b have a height substantially equal to that of the upper surface of the HfO$_2$ layer 25 disposed on an outer peripheral portion of the Si pillars 4a and 4b. Subsequently, the SiO$_2$ layer 45a and SiO$_2$ layer 9 on the memory element region 42 are etched by, for example, an etch-back method such that the upper surfaces thereof have a height substantially equal to that of the upper surface of the HfO$_2$ layer 25.

Figure 8E:
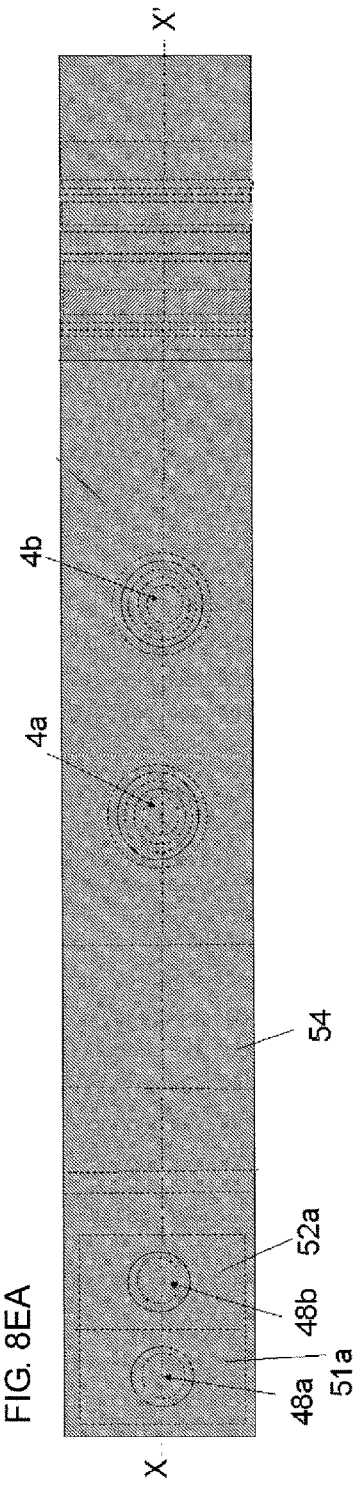
FIGS. 8EA and 8EB are respectively a plan view and a sectional structural view illustrating a vertical NAND-type flash memory device according to the seventh embodiment and a method for producing the device.
Figure 8E:
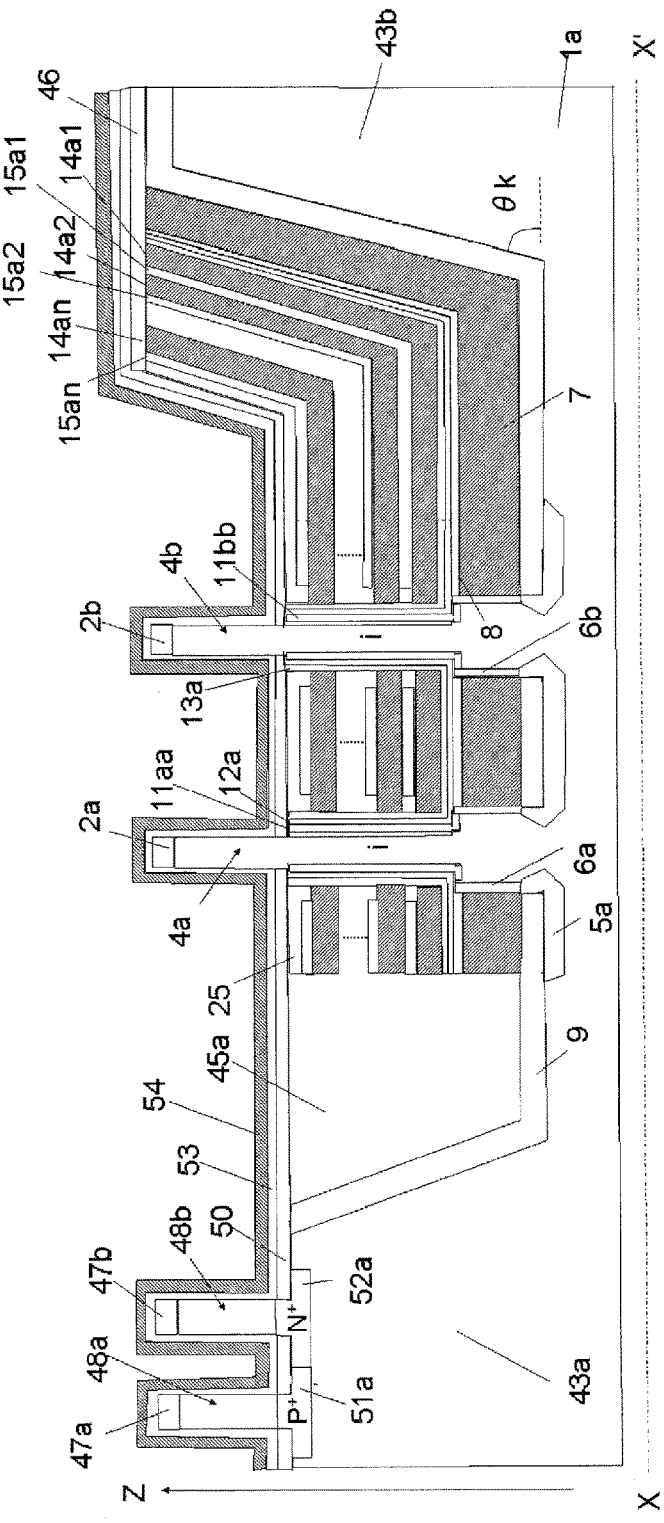

Next, as illustrated in FIGS. 8EA and 8EB, a P$^+$ layer 51 a is formed in a bottom portion of the Si pillar 48a by lithography, an acceptor impurity ion implantation method, and a thermal diffusion method. Similarly, an N$^+$ layer 52a is formed in a bottom portion of the Si pillar 48b by lithography, a donor impurity ion implantation method, and a thermal diffusion method. Subsequently, a SiO$_2$ layer 50 is formed over the outer peripheries of the Si pillars 4a, 4b, 48a, and 48b. Subsequently, a HfO$_2$ layer 53 and a single-layered TiN layer 54 are deposited by ALD over the entire surface so as to cover the Si pillars 4a, 4b, 48a, and 48b.

Figure 8F:
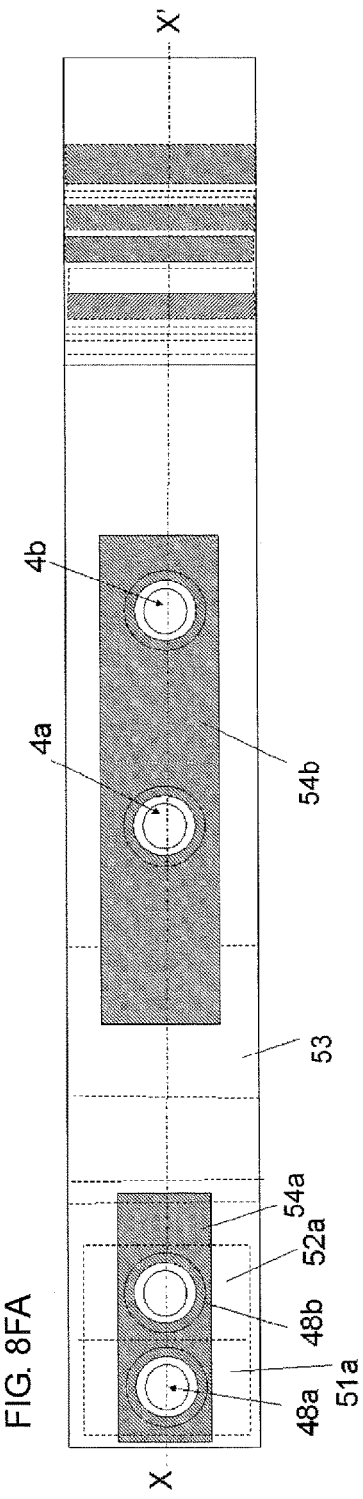
FIGS. 8FA and 8FB are respectively a plan view and a sectional structural view illustrating a vertical NAND-type flash memory device according to the seventh embodiment and a method for producing the device.
Figure 8F:
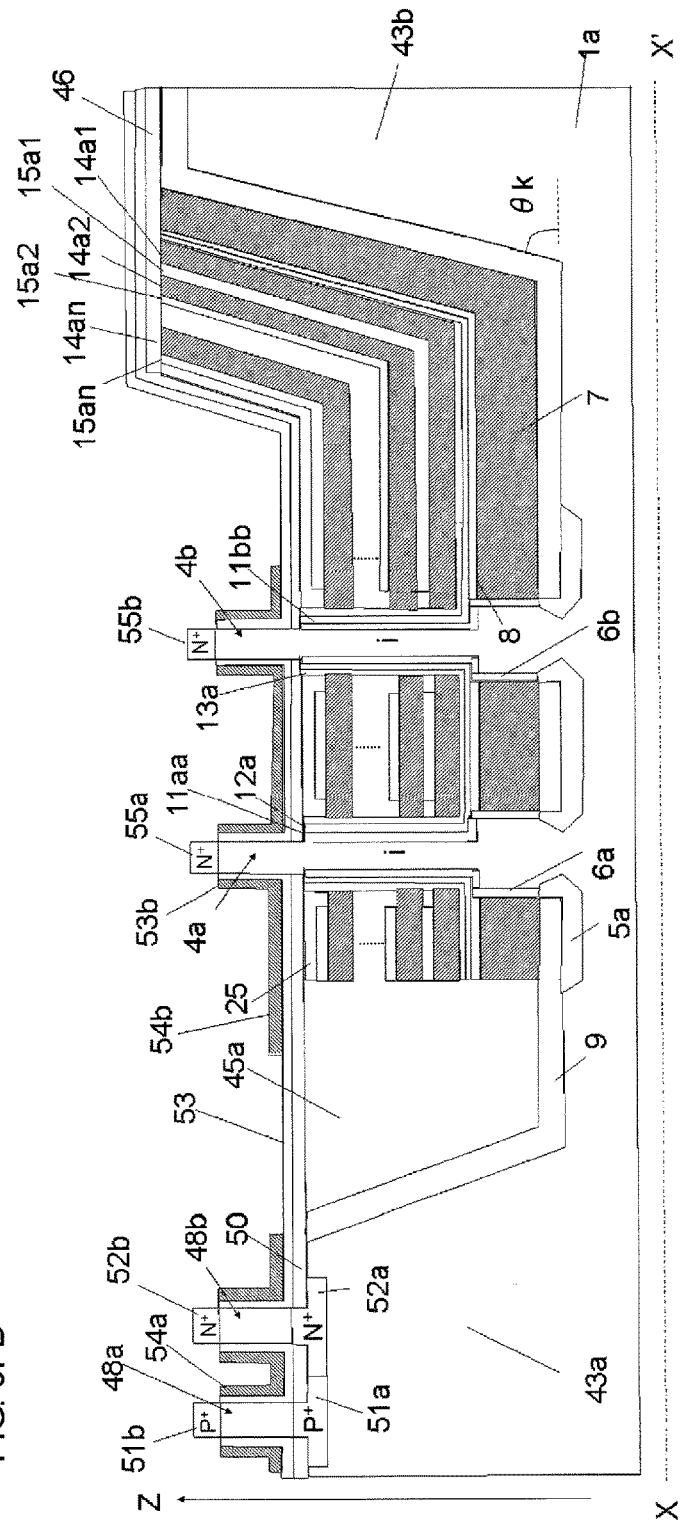
Figure 9:
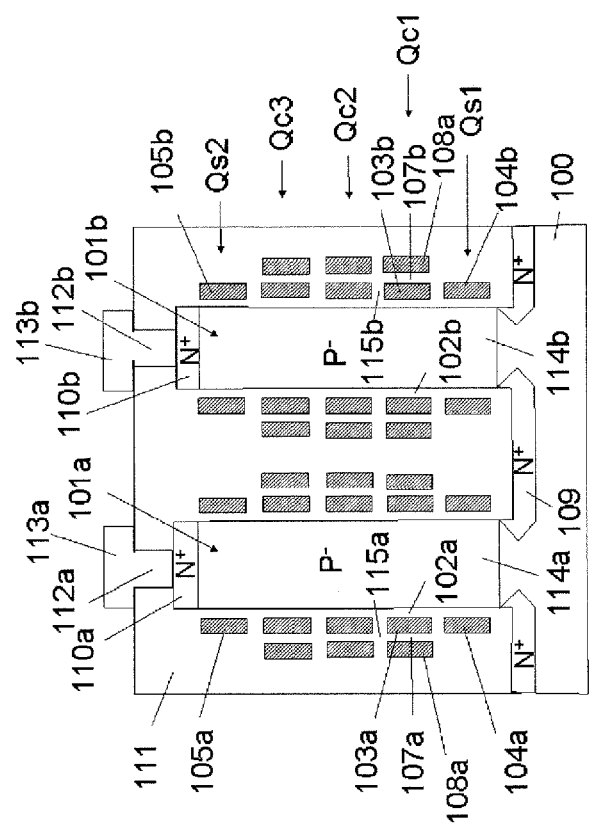
FIG. 9 is a sectional structural view of an example of a vertical NAND-type flash memory device in the related art.

Next, as illustrated in FIGS. 8FA and 8FB, the TiN layer 54 is etched by lithography and ME to form a TiN layer 54a that surrounds the Si pillars 48a and 48b and that is connected to the Si pillars 48a and 48b. At the same time, a TiN layer 54b that surrounds the Si pillars 4a and 4b and that is connected to the Si pillars 4a and 4b is formed. Subsequently, parts of the HfO$_2$ layer 53 and the TiN layers 54a and 54b disposed on top portions of the Si pillars 4a, 4b, 48a, and 48b are removed. Subsequently, a P$^+$ layer 51b is formed in a top portion of the Si pillar 48a, and N$^+$ layers 52b, 55a, and 55b are respectively formed in top portions of the Si pillars 48b, 4a, and 4b by lithography and ion implantation.

Next, as illustrated in FIGS. 8GA and 8GB, SiO$_2$ is deposited by CVD, and a SiO$_2$ layer 56 whose surface is smoothly polished is formed by CMP such that the surface of the SiO$_2$ layer 56 is located higher than the upper surface of the outer peripheral i-layer 43b. Subsequently, a contact hole 57a is formed on the Si pillar 48a. A contact hole 57b is formed on the Si pillar 48b. A contact hole 57c is formed on the TiN layer 54a. A contact hole 57d is formed on a boundary line between the P$^+$ layer 51a and the N$^+$ layer 52a that are formed in a surface layer of the outer peripheral i-layer 43a. Subsequently, a power supply wiring metal layer Vdd connected to the P$^+$ layer 51b through the contact hole 57a, a ground wiring metal layer Vss connected to the N$^+$ layer 52b through the contact hole 57b, an input wiring metal layer Vin connected to the TiN layer 54a through the contact hole 57c, and an output wiring metal layer Vout connected to the P$^+$ layer 51a and the N$^+$ layer 52a through the contact hole 57d are formed. Subsequently, a SiO$_2$ layer 58 having a smooth surface is formed by CVD and CMP so as to cover the entire surface. Subsequently, a contact hole 59a is formed on the TiN layer 54b. A contact hole 59b is formed on the Si pillar 4a. A contact hole 59c is formed on the Si pillar 4b. A contact hole 59d is formed on the word-line conductor layer 14a1 extending to the top of the outer peripheral i-layer 43b. A contact hole 59e is formed on the word-line conductor layer 14a2 extending to the top of the outer peripheral i-layer 43b. A contact hole 59f is formed on the word-line conductor layer 14an extending to the top of the outer peripheral i-layer 43b. Subsequently, a drain-side selection gate wiring metal layer SGD connected to the TiN layer 54b through the contact hole 59a, a bit-line wiring metal layer BLa connected to the N$^+$ layer 55a through the contact hole 59b, a bit-line wiring metal layer BLb connected to the N$^+$ layer 55b through the contact hole 59c, a word-line wiring metal layer WL1 connected to the word-line conductor layer 14a1 through the contact hole 59d, a word-line wiring metal layer WL2 connected to the word-line conductor layer 14a2 through the contact hole 59e, and word-line wiring metal layer WLn connected to the word-line conductor layer 14an through the contact hole 59f are formed. Similarly, the N+ layer 5a is connected to a common source wiring layer, and the doped Si layer 7 is connected to a source-side selection gate wiring layer (the common source wiring layer and the source-side selection gate wiring layer are not illustrated in the figures).

As illustrated in FIGS. 8GA and 8GB, a P-channel surrounding gate MOS transistor (SGT) and an N-channel SGT are formed on the outer peripheral i-layer 43a (regarding an SGT, refer to, for example, Japanese Unexamined Patent Application Publication No. 2-188966). In the P-channel SGT, the P+ layer 51b functions as a source, the $P^{30}$ layer 51a functions as a drain, the Si pillar 48a disposed between the P+ layers 51a and 51b functions as a channel, and the TiN layer 54a functions as a gate. In the N-channel SGT, the N+ layer 52b functions as a source, the N+ layer 52a functions as a drain, the Si pillar 48b disposed between the N+ layers 52a and 52b functions as a channel, and the TiN layer 54a functions as a gate. The P-channel SGT and the N-channel SGT that are respectively formed in the Si pillars 48a and 48b form a CMOS inverter circuit. A vertical NAND-type flash memory device, as illustrated in FIG. 1, in which memory cell-transistors are connected in series in n stages is formed around the Si pillars 4a and 4b in the memory element region 42.

According to the seventh embodiment, the following advantages are achieved.

1. The P-channel SGT formed in the Si pillar 48a, the N-channel SGT formed in the Si pillar 48b, and drain-side selection transistors of the vertical NAND-type flash memory device, the drain-side selection transistors being formed in top portions of the Si pillars 4a and 4b, are formed so as to have heights that are equal to each other. Accordingly, the HfO$_2$ layer 53 functioning as gate insulating layers of the P-channel SGT, the N-channel SGT, and the drain-side selection transistors can be formed at the same time. Similarly, the TiN layer 54a functioning as a gate conductor layer of the P-channel SGT and the N-channel SGT, and the TiN layer 54b functioning as a gate conductor layer of the drain-side selection transistors can be formed at the same time. Similarly, the N+ layer 52b of the N-channel SGT, and the N+ layers 55a and 55b of the vertical NAND-type flash memory device can be formed at the same time. Thus, many steps necessary for forming a peripheral circuit including the P-channel SGT and the N-channel SGT that are formed on the outer peripheral i-layer 43a and many steps necessary for forming the drain-side selection transistors of the vertical NAND-type flash memory device can be performed in common. Accordingly, the cost of the NAND-type flash memory device produced can be reduced.

2. In the vertical NAND-type flash memory device, the word-line conductor layers 14a1, 14a2, and 14an functioning as word-line conductor layers and the SiO$_2$ layers 15a1, 15a2, and 15an for insulating the word-line conductor layers 14a1, 14a2, and 14an from each other are formed by allowing material atoms to be incident in a direction perpendicular to a surface of the i-layer substrate 1a by a bias sputtering method. In the Si pillars 4a and 4b, the material atoms are deposited by using the Si$_3$N$_4$ layers 2a and 2b as a mask under the condition in which the deposition rate of the bias sputtering is higher than the removal rate with respect to the inclination angle θk of the outer peripheral i-layers 43a and 43b. Accordingly, spaces 18a and 18b can be formed on the outer peripheries of the Si pillars 4a and 4b, respectively. In addition, the word-line conductor layers 14a1, 14a2, and 14an and the SiO$_2$ layers 15a1, 15a2, and 15an are formed so as to conform to a side surface of the outer peripheral i-layer 43b. As a result, the word-line wiring metal layers WL1, WL2, and WLn can be respectively formed through the contact holes 59d, 59e, and 59f, whose bottom surfaces have heights equal to each other. Therefore, the steps of forming the word-line wiring metal layers WL1, WL2, and WLn are simplified to realize a reduction in the production cost of the NAND-type flash memory device.

In the first embodiment, when it is assumed that a word-line conductor layer 14a1 and a SiO$_2$ layer 15a1 form one set, at least three sets of the word-line conductor layers 14a1, 14a2, and 14an and the SiO$_2$ layers 15a1, 15a2, and 15an are used in a vertical NAND-type flash memory device. However, such a structure is applicable to other electrically erasable programmable read only memory (EEPROM) devices, such as NOR-type memory devices, including one set of the word-line conductor layer 14a1 and the SiO$_2$ layer 15a1. This is also similarly applicable to other embodiments of the present invention.

In the first embodiment, conductor material atoms and SiO$_2$ material atoms are allowed to be incident in a direction perpendicular to the upper surface of the i-layer substrate 1a by a bias sputtering method to form the conductor layers 14A1, 14A2, and 14An and the SiO$_2$ layers 15a1, 15a2, and 15an on outer peripheries of the Si pillars 4a, 4b, 4c, and 4d. Alternatively, other methods may be used as long as the conductor layers 14A1, 14A2, and 14An and the SiO$_2$ layers 15a1, 15a2, and 15an can be formed by allowing a conductor material and a SiO$_2$ material to be incident in a direction perpendicular to the upper surface of the i-layer substrate 1a. This is also similarly applicable to other embodiments of the present invention.

The doped Si layers 16a11, 16a12, 16a21, 16a22, 16an1, and 16an2 in the first embodiment may be formed of amorphous silicon or polysilicon. The doped Si layers 16a11, 16a12, 16a21, 16a22, 16an1, and 16an2 may be Si layers that contain no donor or acceptor impurity because the resistances of the word-line conductor layers 14a1, 14a2, and 14an are reduced by silicidation with Ni atoms. This is also similarly applicable to other embodiments of the present invention.

The word-line conductor layers 14a1, 14a2, and 14an in the first embodiment may be layers formed of a material having electrical conductivity. This is also similarly applicable to other embodiments of the present invention.

The SiO$_2$ layers IIa, 11b, 11c, and 11d functioning as tunnel insulating layers, the Si$_3$N$_4$ layer 12a functioning as a data charge storage insulating layer, and the SiO$_2$ layer 13a functioning as an interlayer insulating layer in the first embodiment may be layers formed of other materials as long as the layers can achieve the functions of the respective layers. This is also similarly applicable to other embodiments of the present invention.

In the first embodiment, the Si$_3$N$_4$ layer 12a functioning as a data charge storage insulating layer and the SiO$_2$ layer 13a functioning as an interlayer insulating layer are formed as independent material layers. The layers are not limited thereto. For example, a Si$_3$N$_4$ layer 12a is formed, and a SiNO layer containing oxygen may subsequently be formed as an interlayer insulating layer by successively introducing oxygen gas. This is also similarly applicable to other embodiments of the present invention.

In the first embodiment, the doped Si layer 7 is used as an example of a source-side selection gate conductor layer, and the doped Si layer 20a is used as an example of a drain-side selection gate conductor layer. The layers are not limited thereto and may be formed of other materials as long as the layers are conductor layers. This is also similarly applicable to other embodiments of the present invention.

In the first embodiment, a NAND-type flash memory device is formed around the Si pillars 4a, 4b, 4c, and 4d. The pillars are not limited thereto, and other semiconductor pillars may be used. This is also similarly applicable to other embodiments of the present invention.

In the first embodiment, after the resist layers 3a, 3b, 3c, and 3d each having a perfect circular shape are formed, a $Si_3N_4$ layer is etched by, for example, reactive ion etching (RIE) using the resist layers 3a, 3b, 3c, and 3d as a mask to form the $Si_3N_4$ layers 2a, 2b, 2c, and 2d, respectively. The shapes of the resist layers 3a, 3b, 3c, and 3d and the $Si_3N_4$ layers 2a, 2b, 2c, and 2d in plan view are not limited to perfect circular shapes and may be, for example, an elliptical shape or a rectangular shape. This is also similarly applicable to other embodiments of the present invention.

In the first embodiment, the i-layer substrate 1 is etched by, for example, RIE using both the resist layers 3a, 3b, 3c, and 3d and the $Si_3N_4$ layers 2a, 2b, 2c, and 2d as a mask to form the Si pillars 4a, 4b, 4c, and 4d, respectively. The method is not limited thereto. The i-layer substrate 1 may be etched by using only the resist layers 3a, 3b, 3c, and 3d or the $Si_3N_4$ layers 2a, 2b, 2c, and 2d without using both the resist layers 3a, 3b, 3c, and 3d and the $Si_3N_4$ layers 2a, 2b, 2c, and 2d. Alternatively, a layer formed of another material may be used as long as the layer can achieve the function of the resist layers 3a, 3b, 3c, and 3d and the $Si_3N_4$ layers 2a, 2b, 2c, and 2d. The layer formed of the other material may have a multilayer structure. This is also similarly applicable to other embodiments of the present invention.

In the first embodiment, the word-line conductor layers 14a1, 14a2, and 14an functioning as word lines, and the doped Si layer 7 functioning as a source-side selection line have a structure in which these layers are formed to be connected to outer peripheries of the Si pillars 4a, 4b, 4c, and 4d. The structure is not limited thereto. In accordance with the specification of the device operation, as in the structure of the doped Si layers 20a and 20b functioning as drain-side selection lines, and the word-line conductor layers 14a1, 14a2, and 14an, and the doped Si layer 7 may have a separated structure including a doped Si layer that is connected to outer peripheries of the Si pillars 4a and 4b and a doped Si layer that is connected to outer peripheries of the Si pillars 4c and 4d. This is also similarly applicable to other embodiments of the present invention.

In the structure described in the first embodiment, the Si pillars 4a, 4b, 4c, and 4d have the $N^+$ layer 5a functioning as a common source in a bottom portion thereof and the $N^+$ layers 24a, 24b, 24c, and 24d functioning as drains in top portions thereof. The structure is not limited thereto. The technical idea of the present invention is also applicable to a vertical NAND-type flash memory device (refer to, for example, the specification of U.S. Pat. No. 8,189,371) in which two Si pillars form a NAND-type flash memory device. In this case, the common source $N^+$ layer 5a and the drain N layers 24a, 24b, 24c, and 24d are formed in top portions of the Si pillars 4a, 4b, 4c, and 4d. The channel of the NAND-type flash memory device is formed so as to be connected to a channel of one Si pillar connected to the common source $P^+$ layer and a channel of the other Si pillar, the channel being adjacent to the above channel, disposed in the top portion of the Si pillar, and connected to the drain $N^+$ layer. This is also similarly applicable to other embodiments of the present invention.

In the structure described in the first embodiment, the word-line conductor layers 14a1, 14a2, and 14an functioning as word lines continuously surround outer peripheries of the Si pillars 4a, 4b, 4c, and 4d. The technical idea of the present invention is applicable not only to such a structure but also to a semiconductor device (refer to, for example, Japanese Unexamined Patent Application Publication No. 2011-165815) in which the word-line conductor layers 14a1, 14a2, and 14an are separated into two portions on outer peripheries of the Si pillars 4a, 4b, 4c, and 4d, and the separated word-line conductor layers 14a1, 14a2, and 14an are driven electrically independently. This is also similarly applicable to other embodiments of the present invention.

In the third embodiment, the spaces 18a, 18b, 18c, and 18d are filled with the $HfO_2$ layer 23. Alternatively, any insulating layer formed of a material other than $HfO_2$ may be used instead of the $HfO_2$ layer 23 as long as the layer fills the spaces 18a, 18b, 18c, and 18d. This is also similarly applicable to other embodiments of the present invention. In the first embodiment, the conductor layers 14A1, 14A2, and 14An are subjected to silicidation by performing heat treatment at, for example, 550° C. to increase the volume of the conductor layers 14A1, 14A2, and 14An. Thus, the word-line conductor layers 14a1, 14a2, and 14an whose side surfaces are in contact with the side surface of the $SiO_2$ layer 13 are formed. The number of times of such heat treatment at, for example, 550° C. is not limited to one. Alternatively, such heat treatment may be performed a plurality of times. Such heat treatment may be performed at any time up to the final step or in any one of steps corresponding to FIGS. 2GA to 2KC as long as the conductor layers 14A1, 14A2, and 14An have been formed.

The hydrogen heat treatment in the fourth embodiment has been described using the first embodiment as an example. The hydrogen heat treatment is also similarly applicable to other embodiments of the present invention.

The hydrogen heat treatment in the fourth embodiment may be performed at any time from the formation of the spaces 18a and 18b to the closing of the spaces 18a and 18b. This is also similarly applicable to other embodiments of the present invention.

In the fifth embodiment, the truncated cone-shaped $Si_3N_4$ layers 2A, 2B, 2C, and 2D are formed instead of the $Si_3N_4$ layers 2a, 2b, 2c, and 2d, and the cone-shaped stacked material layers 41a, 41b, 41c, and 41d are formed on the truncated cone-shaped $Si_3N_4$ layers 2A, 2B, 2C, and 2D, respectively. The shape of each of the cone-shaped stacked material layers 41a, 41b, 41c, and 41d is not limited to such a cone shape and may be any tapered shape. This is also similarly applicable to other embodiments of the present invention.

In the seventh embodiment, the Si pillars 48a and 48b are formed such that the bottom surfaces of the Si pillars 48a and 48b have a height substantially equal to that of the upper surface of the $HfO_2$ layer 25. The structure is not limited thereto. The height of the bottom surfaces of the Si pillars 48a and 48b may be located in the vicinity of the height of the surface of the $HfO_2$ layer 25 as long as SGTs are formed in the Si pillars 48a and 48b.

In the seventh embodiment, a single-layered TiN layer 54 is used. However, the layer is not limited thereto. Instead of the single-layered TiN layer 54, for example, a layer having a two-layer structure including a poly-Si layer, or a layer including a plurality of layers formed of other materials may be used.

In the seventh embodiment, the contact holes 59d, 59e, and 59f are formed in the vicinity of the center line X-X' of the Si pillars 4a and 4b in which a NAND-type flash memory device is formed. However, the structure is not limited thereto. Since the word-line conductor layers 14a1, 14a2, and 14an are formed over the entire memory element region 42 in a continuous manner, the contact holes 59d, 59e, and 59f need not be necessarily formed so as to gather in the vicinity of the line X-X' as illustrated in FIG. 8GA and 8GB.

In the seventh embodiment, a description has been made of an example of a CMOS inverter circuit including the P-channel SGT and the N-channel SGT formed in the Si pillars 48a and 48b on the outer peripheral i-layer 43a. The structure is not limited thereto. It is to be understood that the technical idea of the present invention is applicable also in the case where a circuit using other SGTs is formed.

According to the present invention, a pillar-shaped semiconductor memory device having a high density and a low cost, and a high-performance, new-function electronic device using the semiconductor memory device are provided.

What is claimed is:

1. A pillar-shaped semiconductor memory device comprising:
    a substrate;
    a first semiconductor pillar disposed on the substrate and extending in a direction perpendicular to a surface of the substrate;
    a tunnel insulating layer surrounding an outer periphery of the first semiconductor pillar;
    a data charge storage insulating layer surrounding an outer periphery of the tunnel insulating layer;
    a first interlayer insulating layer surrounding an outer periphery of the data charge storage insulating layer;
    a first conductor layer surrounding an outer periphery of the first interlayer insulating layer; and
    a second interlayer insulating layer that is in contact with an upper surface or a lower surface of the first conductor layer, in which a side surface of the second interlayer insulating layer facing a side surface of the first interlayer insulating layer is separated from the side surface of the first interlayer insulating layer with a distance therebetween, the distance being larger than a distance from the side surface of the first interlayer insulating layer to a side surface of the first conductor layer facing the side surface of the first interlayer insulating layer,
    wherein the side surface of the first conductor layer is in contact with or separated from the side surface of the first interlayer insulating layer,
    at least one stacked material layer including the first conductor layer and the second interlayer insulating layer as one set is formed in a direction perpendicular to an upper surface of the substrate,
    data writing and erasing due to a data charge transfer between the first semiconductor pillar and the data charge storage insulating layer through the tunnel insulating layer or a data charge retention by the data charge storage insulating layer is performed by application of a voltage to the first conductor layer, and
    a space is formed between the side surface of the first interlayer insulating layer and the side surface of the second interlayer insulating layer.

2. The pillar-shaped semiconductor memory device according to claim 1, further comprising:
    a third interlayer insulating layer formed between the side surface of the first interlayer insulating layer and the side surface of the second interlayer insulating layer,
    wherein the third interlayer insulating layer is further disposed between the side surface of the first interlayer insulating layer and the side surface of the first conductor layer.

3. The pillar-shaped semiconductor memory device according to claim 1,
    wherein the at least one stacked material layer comprises a plurality of stacked material layers,
    the side surface of a first conductor layer disposed in an uppermost portion of the stacked material layers is in contact with the side surface of the first interlayer insulating layer, and
    the side surface of a first conductor layer disposed lower than the first conductor layer disposed in the uppermost portion of the stacked material layers is separated from the side surface of the first interlayer insulating layer.

4. The pillar-shaped semiconductor memory device according to claim 1,
    wherein a side surface of the first semiconductor pillar includes an inclined surface or an inclined curved surface,
    the at least one stacked material layer comprises a plurality of stacked material layers,
    the first conductor layer of each of the stacked material layers has a protruding portion protruding from the side surface of the second interlayer insulating layer to the side surface of the first interlayer insulating layer, and
    a length of the protruding portion of a first conductor layer located at a position at which a width of the space between the side surface of the first interlayer insulating layer and the side surface of the second interlayer insulating layer is small is smaller than a length of the protruding portion of a first conductor layer located at a position at which a width of the space between the side surface of the first interlayer insulating layer and the side surface of the second interlayer insulating layer is large.

5. The pillar-shaped semiconductor memory device according to claim 1,
    wherein the at least one stacked material layer comprises a plurality of stacked material layers,
    the pillar-shaped semiconductor memory device includes a first gate insulating layer formed above the stacked material layers and surrounding an outer periphery of the first semiconductor pillar,
    a second conductor layer surrounding an outer periphery of the first gate insulating layer, and
    a first impurity region formed in a top portion of the first semiconductor pillar and containing a donor or acceptor impurity,
    the first conductor layer of each of the stacked material layers is connected to a word-line wiring metal layer,
    the second conductor layer is connected to a source-side selection gate wiring metal layer or a drain-side selection gate wiring metal layer,
    the first impurity region is connected to a common source line metal layer or a bit-line wiring metal layer, and
    a NAND-type flash memory device is formed in the first semiconductor pillar.

6. The pillar-shaped semiconductor memory device according to claim 5,
    wherein the at least one stacked material layer comprises a plurality of stacked material layers,
    the pillar-shaped semiconductor memory device includes a second gate insulating layer formed below the stacked material layers and surrounding an outer periphery of the first semiconductor pillar, a third conductor layer surrounding an outer periphery of the second gate insulating layer, and a second impurity region formed below the stacked material layers and in a bottom portion of the first semiconductor pillar and having the same conductivity type as the first impurity region, and the NAND-type flash memory device is formed in the first semiconductor pillar in which the first conductor layer of each of the stacked material layers is connected to the word-line wiring metal layer, the third conductor layer is connected to the source-side selection gate wiring metal layer, the second impurity region is connected to the common source line metal layer, the second conductor layer is connected to the drain-side selection gate wiring metal layer, and the first impurity region is connected to the bit-line wiring metal layer.

7. The pillar-shaped semiconductor memory device according to claim 5, further comprising:

a first outer peripheral semiconductor region formed in an outer periphery of a memory element region in which the first semiconductor pillar is formed so that a height of an upper surface of the first outer peripheral semiconductor region is substantially equal to a height of a top portion of the first semiconductor pillar;

a second semiconductor pillar which is formed in a second outer peripheral semiconductor region included in the first outer peripheral semiconductor region, whose top portion has a height substantially equal to that of the top portion of the first semiconductor pillar, and whose bottom surface has a height substantially equal to that of a bottom surface of the second conductor layer;

a third gate insulating layer surrounding an outer peripheral portion of the second semiconductor pillar;

a fourth conductor layer which is formed so as to surround an outer periphery of the third gate insulating layer, and whose upper and lower ends have heights substantially equal to those of upper and lower ends of the second conductor layer;

a third impurity region formed above the fourth conductor layer and in a top portion of the second semiconductor pillar and containing a donor or acceptor impurity; and a fourth impurity region formed below the fourth conductor layer and in a bottom portion of the second semiconductor pillar and having the same conductivity type as the third impurity region, wherein a surrounding gate MOS transistor (SGT) is formed in which when one of the third impurity region and the fourth impurity region functions as a source, the other functions as a drain, the second semiconductor pillar disposed between the third impurity region and the fourth impurity region functions as a channel, and the fourth conductor layer functions as a gate.

8. The pillar-shaped semiconductor memory device according to claim 7, further comprising:

a fourth interlayer insulating layer that is formed on the substrate so as to surround the outer periphery of the first semiconductor pillar, and that extends to a side surface and an upper surface of the first outer peripheral semiconductor region; and a contact hole connected to an upper surface of the first conductor layer of one of the stacked material layers that have an upper surface on an upper end of a side surface of the first outer peripheral semiconductor region, wherein the stacked material layers are formed on the fourth interlayer insulating layer, the upper surface of the stacked material layers has a height substantially equal to that of an upper surface of the fourth interlayer insulating layer located on the first outer peripheral semiconductor region, and the first conductor layer and the word-line wiring metal layer are connected to each other through the contact hole.

9. A method for producing a pillar-shaped semiconductor memory device, the method comprising:

a mask insulating layer-forming step of forming, on a substrate, a mask insulating layer having a circular shape in plan view;

a first semiconductor pillar-forming step of etching the substrate using the mask insulating layer as a mask to form a semiconductor pillar on the substrate, and retracting a side surface of the semiconductor pillar inward in a radial direction of the semiconductor pillar to form a first semiconductor pillar;

a tunnel insulating layer-forming step of forming a tunnel insulating layer so as to surround an outer periphery of the first semiconductor pillar;

a data charge storage insulating layer-forming step of forming a data charge storage insulating layer so as to surround an outer periphery of the tunnel insulating layer;

a first interlayer insulating layer-forming step of forming a first interlayer insulating layer so as to surround an outer periphery of the data charge storage insulating layer;

a first conductor layer-forming step of forming a first conductor layer on an outer periphery of the first semiconductor pillar and above the substrate by allowing a material atom to be incident in a direction perpendicular to an upper surface of the mask insulating layer;

a second interlayer insulating layer-forming step of forming a second interlayer insulating layer on the outer periphery of the first semiconductor pillar and above the substrate by allowing a material atom to be incident on the first conductor layer in a direction perpendicular to the upper surface of the mask insulating layer;

a stacked material layer-forming step of forming at least one stacked material layer in a direction perpendicular to an upper surface of the substrate, the stacked material layer including the first conductor layer and the second interlayer insulating layer as one set;

a space-forming step of, at the same time as the stacked material layer-forming step, forming a space between a side surface of the first interlayer insulating layer and side surfaces of the first conductor layer and the second interlayer insulating layer; and a first conductor layer-protruding step of protruding the side surface of the first conductor layer toward the side surface of the first interlayer insulating layer by performing heat treatment, wherein data writing and erasing due to a data charge transfer between the first semiconductor pillar and the data charge storage insulating layer through the tunnel insulating layer or data charge retention by the data charge storage insulating layer is performed by application of a voltage to the first conductor layer.

10. The method according to claim 9, wherein, before the heat treatment is performed, the first conductor layer is formed from a metal layer and a silicon layer, and the first conductor layer is subjected to silicidation by the heat treatment to carry out the first conductor layer-protruding step.

11. The method according to claim 9,
wherein, before the heat treatment is performed, the first conductor layer is formed from a metal layer, and
the first conductor layer is plastically deformed by the heat treatment to carry out the first conductor layer-protruding step.

12. The method according to claim 9, wherein, after the stacked material layer-forming step, the heat treatment is performed in an atmosphere containing hydrogen.

13. The method according to claim 9,
wherein the at least one stacked material layer comprises a plurality of stacked material layers,
in the first conductor layer-protruding step, the side surface of a first conductor layer disposed in an uppermost portion of the stacked material layers is brought into contact with the side surface of the first interlayer insulating layer, and
the side surface of a first conductor layer disposed lower than the first conductor layer disposed in the uppermost portion of the stacked material layers is formed to be separated from the side surface of the first interlayer insulating layer.

14. The method according to claim 9, comprising:
a truncated cone-shaped mask insulating layer-forming step of forming, instead of the mask insulating layer, a truncated cone-shaped mask insulating layer on the first semiconductor pillar; and
a cone-shaped stacked material layer-forming step of depositing a material atom by allowing the material atom to be incident in a direction perpendicular to the upper surface of the substrate under a condition in which a deposition rate of the material atom on a side surface of the truncated cone-shaped mask insulating layer is lower than a removal rate of the material atom to form the at least one stacked material layer above the substrate and to form, on the truncated cone-shaped mask insulating layer, a cone-shaped stacked material layer formed of the same material as the at least one stacked material layer.

15. The method according to claim 9, further comprising:
a first gate insulating layer-forming step of forming a first gate insulating layer above the at least one stacked material layer so as to surround the outer periphery of the first semiconductor pillar;
a second conductor layer-forming step of forming a second conductor layer so as to surround an outer periphery of the first gate insulating layer;
a first impurity region-forming step of forming a first impurity region in a top portion of the first semiconductor pillar, the first impurity region containing a donor or acceptor impurity;
a step of connecting the first conductor layer of the at least one stacked material layer to a word-line wiring metal layer;
a step of connecting the second conductor layer to a source-side selection gate wiring metal layer or a drain-side selection gate wiring metal layer; and
a step of connecting the first impurity region to a common source line metal layer or a bit-line wiring metal layer.

16. The method according to claim 15, further comprising:
a second gate insulating layer-forming step of forming a second gate insulating layer below the at least one stacked material layer so as to surround the outer periphery of the first semiconductor pillar;
a third conductor layer-forming step of forming a third conductor layer so as to surround an outer periphery of the second gate insulating layer; and
a second impurity region-forming step of forming a second impurity region below the third conductor layer and in a bottom portion of the first semiconductor pillar, the second impurity region having the same conductivity type as the first impurity region,
wherein the first conductor layer of the at least one stacked material layer is connected to the word-line wiring metal layer,
the third conductor layer is connected to the source-side selection gate wiring metal layer,
the second impurity region is connected to the common source line metal layer,
the second conductor layer is connected to the drain-side selection gate wiring metal layer, and
the first impurity region is connected to the bit-line wiring metal layer to form a NAND-type flash memory device in the first semiconductor pillar.

17. The method according to claim 15, further comprising:
a first outer peripheral semiconductor region-forming step of forming, in an outer periphery of a memory element region in which the first semiconductor pillar is formed, a first outer peripheral semiconductor region whose upper surface has a height substantially equal to a height of a top portion of the first semiconductor pillar;
a second semiconductor pillar-forming step of forming, in a second outer peripheral semiconductor region included in the first outer peripheral semiconductor region, a second semiconductor pillar whose top portion has a height substantially equal to that of the top portion of the first semiconductor pillar, and whose bottom surface has a height substantially equal to that of a bottom surface of the second conductor layer;
a third gate insulating layer-forming step of forming a third gate insulating layer so as to surround an outer periphery of the second semiconductor pillar;
a fourth conductor layer-forming step of forming a fourth conductor layer whose upper and lower ends have heights substantially equal to those of upper and lower ends of the second conductor layer in a direction perpendicular to the substrate so as to surround an outer periphery of the third gate insulating layer;
a third impurity region-forming step of forming a third impurity region above the fourth conductor layer and in a top portion of the second semiconductor pillar, the third impurity region containing a donor or acceptor impurity; and
a fourth impurity region-forming step of forming a fourth impurity region below the fourth conductor layer and in a bottom portion of the second semiconductor pillar, the fourth impurity region having the same conductivity type as the third impurity region,
wherein a surrounding gate MOS transistor (SGT) is formed in which when one of the third impurity region and the fourth impurity region functions as a source, the other functions as a drain, the second semiconductor pillar disposed between the third impurity region and the fourth impurity region functions as a channel, and the fourth conductor layer function as a gate.

18. The method according to claim 17, further comprising:

a fourth interlayer insulating layer-forming step of forming a fourth interlayer insulating layer on the first outer peripheral semiconductor region, on a side surface of the first outer peripheral semiconductor region, and on the substrate in the outer periphery of the first semiconductor pillar disposed in the memory element region; and a contact hole-forming step of forming a contact hole connected to an upper surface of the first conductor layer, wherein the at least one stacked material layer is formed on the fourth interlayer insulating layer so as to surround the outer periphery of the first semiconductor pillar and to extend to the side surface of the first outer peripheral semiconductor region, the at least one stacked material layer is formed such that the upper surface of the at least one stacked material layer has a height substantially equal to that of an upper surface of the fourth interlayer insulating layer located on the first outer peripheral semiconductor region, and the first conductor layer and the word-line wiring metal layer are connected to each other through the contact hole.

* * * * *